(12) United States Patent
Kim et al.

(10) Patent No.: US 12,581,653 B2
(45) Date of Patent: Mar. 17, 2026

(54) SEMICONDUCTOR DEVICES AND METHOD OF MANUFACTURING THE SAME

(71) Applicant: Samsung Electronics Co., Ltd., Suwon-si (KR)

(72) Inventors: Junhyoung Kim, Suwon-si (KR); Joonyoung Kwon, Suwon-si (KR); Jiyoung Kim, Suwon-si (KR); Jinhyuk Kim, Suwon-si (KR); Sukkang Sung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 385 days.

(21) Appl. No.: 18/463,620

(22) Filed: Sep. 8, 2023

(65) Prior Publication Data

US 2024/0107767 A1     Mar. 28, 2024

(30) Foreign Application Priority Data

Sep. 22, 2022     (KR) ........................ 10-2022-0119870

(51) Int. Cl.
*H10B 43/27*          (2023.01)
(52) U.S. Cl.
CPC .................................. *H10B 43/27* (2023.02)
(58) Field of Classification Search
CPC ........ H10B 41/10; H10B 43/10; H10B 41/27; H10B 43/27
See application file for complete search history.

(56) References Cited

U.S. PATENT DOCUMENTS

| | | | |
|---|---|---|---|
| 9,455,267 B2 | 9/2016 | Zhang et al. | |
| 9,627,401 B2 | 4/2017 | Tsuda et al. | |
| 9,812,461 B2 | 11/2017 | Doda et al. | |
| 10,192,880 B2 * | 1/2019 | Lee ........................ | H10B 43/35 |
| 10,304,849 B2 | 5/2019 | Sawabe et al. | |
| 10,553,602 B2 | 2/2020 | Lee | |
| 10,600,805 B2 * | 3/2020 | Park ........................ | H10B 43/10 |

(Continued)

FOREIGN PATENT DOCUMENTS

KR     20180051183 A     5/2018

OTHER PUBLICATIONS

Extended European Search Report corresponding to EP 23199178.7; dated Feb. 21, 2024, (10 pages).

*Primary Examiner* — Evren Seven
(74) *Attorney, Agent, or Firm* — Wolf, Greenfield & Sacks, P.C.

(57)     ABSTRACT

A semiconductor device includes a gate electrode structure, a first division pattern, and a memory channel structure. The gate electrode structure includes gate electrodes stacked in a first direction and extending in a second direction. The first division pattern extends in the second direction through the gate electrode structure, and divides the gate electrode structure in a third direction. The memory channel structure extends through the gate electrode structure, and includes a channel and a charge storage structure. The first division pattern includes first and second sidewalls opposite to each other in the third direction. First recesses are spaced apart from each other in the second direction on the first sidewall, and second recesses are spaced apart from each other in the second direction on the second sidewall. The first and second recesses do not overlap in the third direction.

20 Claims, 48 Drawing Sheets

(56)                    References Cited

U.S. PATENT DOCUMENTS

| | | | | |
|---|---|---|---|---|
| 11,257,831 | B2 * | 2/2022 | Xu | H10B 43/30 |
| 2016/0126252 | A1 | 5/2016 | Tsuda et al. | |
| 2017/0077119 | A1 * | 3/2017 | Sawabe | H10B 43/35 |
| 2021/0036009 | A1 * | 2/2021 | Jung | H10B 43/27 |
| 2021/0358946 | A1 * | 11/2021 | Pulugurtha | H10D 84/013 |
| 2022/0068317 | A1 * | 3/2022 | Fukuzumi | H10B 41/27 |
| 2022/0173118 | A1 | 6/2022 | Kang et al. | |
| 2023/0320097 | A1 * | 10/2023 | Lee | H10B 43/35 |
| | | | | 257/314 |

* cited by examiner

Figure 17:
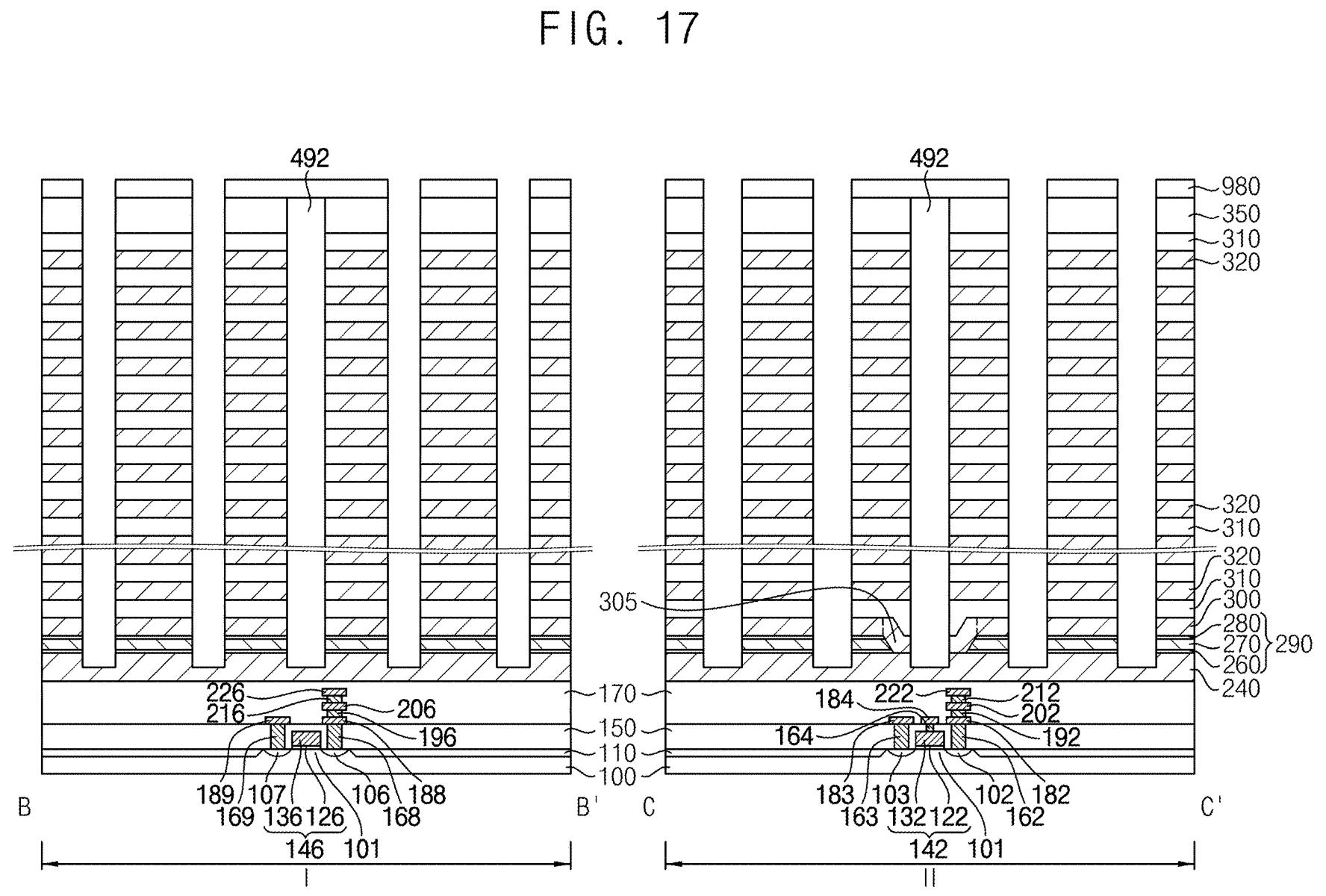

SEMICONDUCTOR DEVICES AND METHOD OF MANUFACTURING THE SAME

CROSS-REFERENCE TO RELATED APPLICATION

This application claims priority under 35 USC § 119 to Korean Patent Application No. 10-2022-0119870, filed on Sep. 22, 2022, in the Korean Intellectual Property Office (KIPO), the contents of which are herein incorporated by reference in their entirety.

TECHNICAL FIELD

The inventive concepts relate to a semiconductor device and a method of manufacturing the same.

BACKGROUND

In an electronic system requiring data storage needs, a high capacity semiconductor device may be used that may store large amounts of data. Thus, a method of increasing the data storage capacity of semiconductor devices has been studied. For example, a semiconductor device including memory cells that may be 3-dimensionally stacked has been suggested.

If a division pattern for electrically insulating memory blocks from each other in the semiconductor device has a large area, the integration degree of the semiconductor may be diminished, and if the division pattern has a small area, the electrical interference between the memory blocks may increase.

SUMMARY

Example embodiments provide a semiconductor device having improved characteristics.

Example embodiments provide a method of manufacturing a semiconductor device having improved characteristics.

According to an aspect of the inventive concept, there is provided a semiconductor device. The semiconductor device may include a gate electrode structure, a first division pattern, and a memory channel structure. The gate electrode structure may include gate electrodes spaced apart from each other on a substrate in a first direction substantially perpendicular to an upper surface of the substrate, and each of the gate electrodes may extend in a second direction substantially parallel to the upper surface of the substrate. The first division pattern may extend on the substrate in the second direction through the gate electrode structure, and the first division pattern may divide the gate electrode structure in a third direction substantially parallel to the upper surface of the substrate and crossing the second direction. The memory channel structure may extend through the gate electrode structure on the substrate, and may include a channel extending in the first direction and a charge storage structure on an outer sidewall of the channel. The first division pattern may include first and second sidewalls opposite to each other in the third direction. First recesses may be spaced apart from each other in the second direction on the first sidewall of the first division pattern, and second recesses may be spaced apart from each other in the second direction on the second sidewall of the first division pattern. The first recesses may not overlap the second recesses in the third direction.

According to an aspect of the inventive concept, there is provided a semiconductor device. The semiconductor device may include a gate electrode structure, a first division pattern, and a memory channel structure. The gate electrode structure may include gate electrodes spaced apart from each other on a substrate in a first direction substantially perpendicular to an upper surface of the substrate, and each of the gate electrodes may extend in a second direction substantially parallel to the upper surface of the substrate. The first division pattern may extend on the substrate in the second direction through the gate electrode structure, and may divide the gate electrode structure in a third direction substantially parallel to the upper surface of the substrate and crossing the second direction. The memory channel structure may extend through the gate electrode structure on the substrate, and may include a channel extending in the first direction and a charge storage structure on an outer sidewall of the channel. The first division pattern may include first and second sidewalls opposite to each other in the third direction. First recesses may be spaced apart from each other in the second direction on the first sidewall of the first division pattern, and second recesses may be spaced apart from each other in the second direction on the second sidewall of the first division pattern. Distances in the second direction between the first recesses may periodically change. Distances in the second direction between the second recesses may periodically change.

According to an aspect of the inventive concept, there is provided a semiconductor device. The semiconductor device may include a lower circuit pattern, a common source plate (CSP), a gate electrode structure, first division patterns, and a memory channel structure. The lower circuit pattern may be formed on a substrate. The CSP may be formed on the lower circuit pattern. The gate electrode structure may include gate electrodes spaced apart from each other on the CSP in a first direction substantially perpendicular to an upper surface of the substrate, and each of the gate electrodes may extend in a second direction substantially parallel to the upper surface of the substrate. Each of the first division patterns may extend on the CSP in the second direction through the gate electrode structure, and may divide the gate electrode structure in a third direction substantially parallel to the upper surface of the substrate and crossing the second direction. The memory channel structure may extend through the gate electrode structure on the substrate, and may include a channel extending in the first direction and a charge storage structure on an outer sidewall of the channel. The first division pattern may include first and second sidewalls opposite to each other in the third direction. The first recesses may be spaced apart from each other in the second direction on the first sidewall of the first division pattern, and second recesses may be spaced apart from each other in the second direction on the second sidewall of the first division pattern. The first recesses may not overlap the second recesses in the third direction.

According to an aspect of the inventive concept, there is provided a method of manufacturing a semiconductor device. In the method, a mold layer may be formed on a substrate. First holes and second holes may be formed through the mold layer. A memory channel structure may be formed in each of the first holes. The second holes may be connected with each other by enlarging widths of the second holes to form a first opening. A portion of the mold layer may be removed through the first opening to form a gap. A gate electrode may be formed in the gap. A first division pattern may be formed in the first opening. Each of the second holes may have a shape of a triangle or a triangle with chamfered or rounded vertices in a plan view.

According to an aspect of the inventive concept, there is provided a method of manufacturing a semiconductor device. In the method, a mold layer may be formed on a substrate. First holes and second holes may be formed through the mold layer. A memory channel structure may be formed in each of the first holes. The second holes may be connected with each other by enlarging widths of the second holes to form an opening. A portion of the mold layer may be removed through the opening to form a gap. A gate electrode may be formed in the gap. A division pattern may be formed in the opening. Each of the second holes may have a "T" shape in a plan view.

According to an aspect of the inventive concept, there is provided a method of manufacturing a semiconductor device. In the method, a mold layer may be formed on a substrate. First holes and second holes may be formed through the mold layer. A memory channel structure may be formed in each of the first holes. The second holes may be connected with each other by enlarging widths of the second holes to form an opening. A portion of the mold layer may be removed through the opening to form a gap. A gate electrode may be formed in the gap. A first division pattern may be formed in the opening. The opening may include first and second sidewalls opposite to each other in a third direction substantially parallel to the upper surface of the substrate and crossing the second direction. First protrusion portions may be formed to be spaced apart from each other in the second direction on the first sidewall of the opening, and second protrusion portions may be formed to be spaced apart from each other in the second direction on the second sidewall of the opening. Each of the first and second protrusion portions may protrude toward a center of the opening. The first protrusion portions may not overlap the second protrusion portions in the third direction.

According to an aspect of the inventive concept, there is provided a method of manufacturing a semiconductor device. In the method, a mold layer may be formed on a substrate. First holes and second holes may be formed through the mold layer. A memory channel structure may be formed in each of the first holes. The second holes may be connected with each other by enlarging widths of the second holes to form an opening. A portion of the mold layer may be removed through the opening to form a gap. A gate electrode may be formed in the gap. A first division pattern may be formed in the opening. The opening may include first and second sidewalls opposite to each other in a third direction substantially parallel to the upper surface of the substrate and crossing the second direction. First protrusion portions may be formed to be spaced apart from each other in the second direction on the first sidewall of the opening, and second protrusion portions may be formed to be spaced apart from each other in the second direction on the second sidewall of the opening. Each of the first and second protrusion portions may protrude toward a center of the opening. Distances in the second direction between the first protrusion portions may periodically change, and distances in the second direction between the second protrusion portions may periodically change.

In the semiconductor device in accordance with example embodiments, the division pattern for separating the gate electrodes from each other may have a relatively small area, and thus the integration degree of the semiconductor device including the division pattern may be enhanced. Additionally, the recesses on the opposite sidewalls of the division pattern may be formed in a zigzag pattern in an extension direction of the division pattern, so that the electrical interference between portions of the gate electrodes in the recesses may be reduced.

BRIEF DESCRIPTION OF THE DRAWINGS

FIGS. 8 to 38 are plan views and cross-sectional views illustrating a method of manufacturing a semiconductor device, for example, a vertical channel NAND flash memory device in accordance with example embodiments.

DETAILED DESCRIPTION

Figure 1:
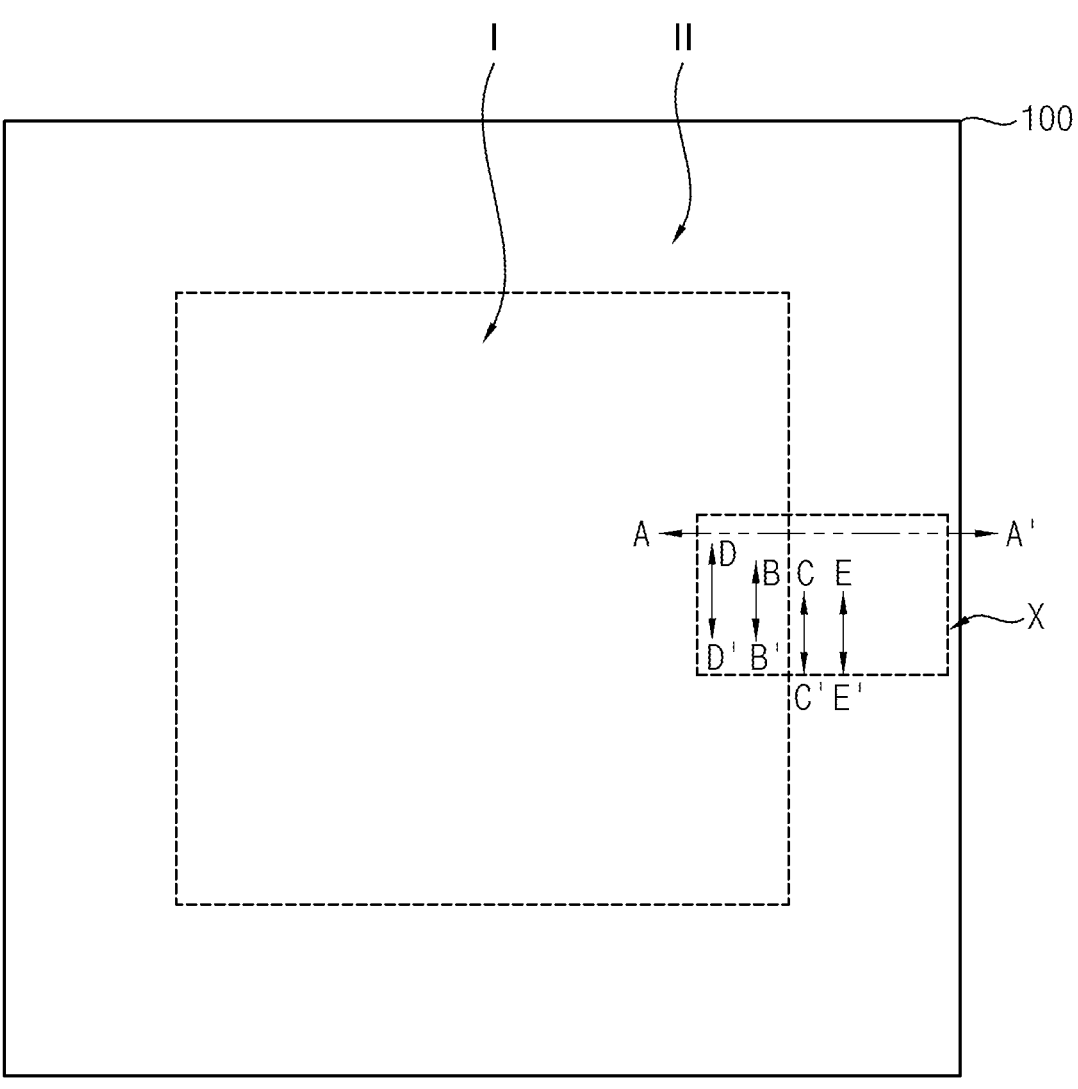
FIGS. 1 to 7 are plan views and cross-sectional views illustrating a semiconductor device, for example, a vertical channel NAND flash memory device in accordance with example embodiments.
Figure 1:
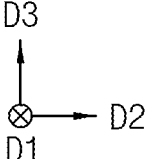

Hereinafter, a semiconductor device, a method for manufacturing the same, and a mass data storage system including the semiconductor device in accordance with example embodiments will be described in detail with reference to the accompanying drawings. The same reference numerals are used for the same components in the drawings, and duplicate descriptions thereof are omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination. It will be understood that, although the terms "first," "second," and/or "third" may be used herein to describe various elements, these elements should not be limited by these terms. These terms are only used to distinguish one element from another element.

In the specification (and not necessarily in the claims), a vertical direction substantially perpendicular to an upper surface of a substrate may be referred to as a first direction D1, and two directions crossing each other among horizontal directions substantially parallel to the upper surface of the substrate may be referred to as second and third directions D2 and D3, respectively. In example embodiments, the second and third directions D2 and D3 may be substantially perpendicular to each other.

FIGS. 1 to 7 are plan views and cross-sectional views illustrating a semiconductor device, for example, a vertical channel NAND flash memory device in accordance with example embodiments.

Figure 2:
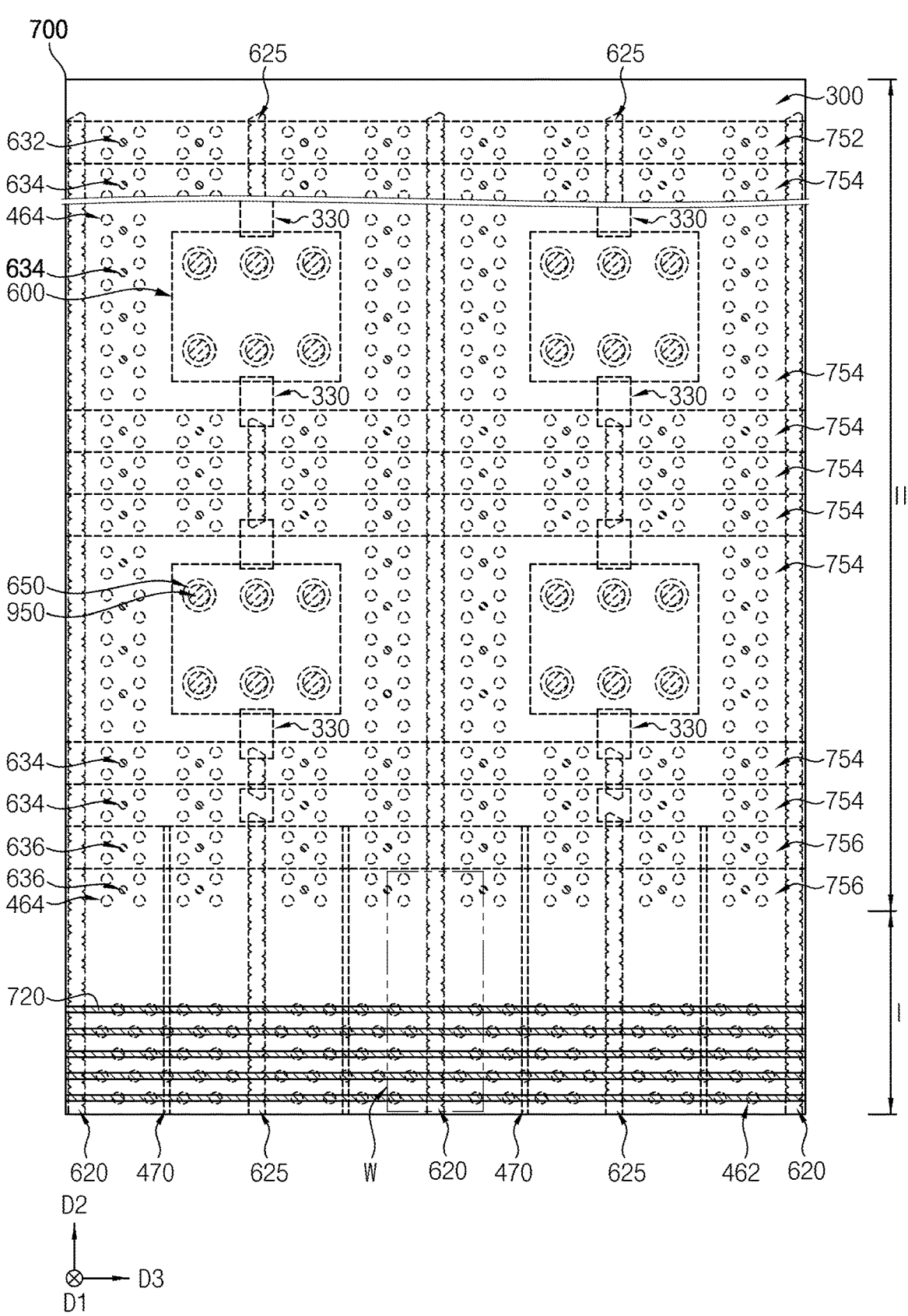
Figure 3A:
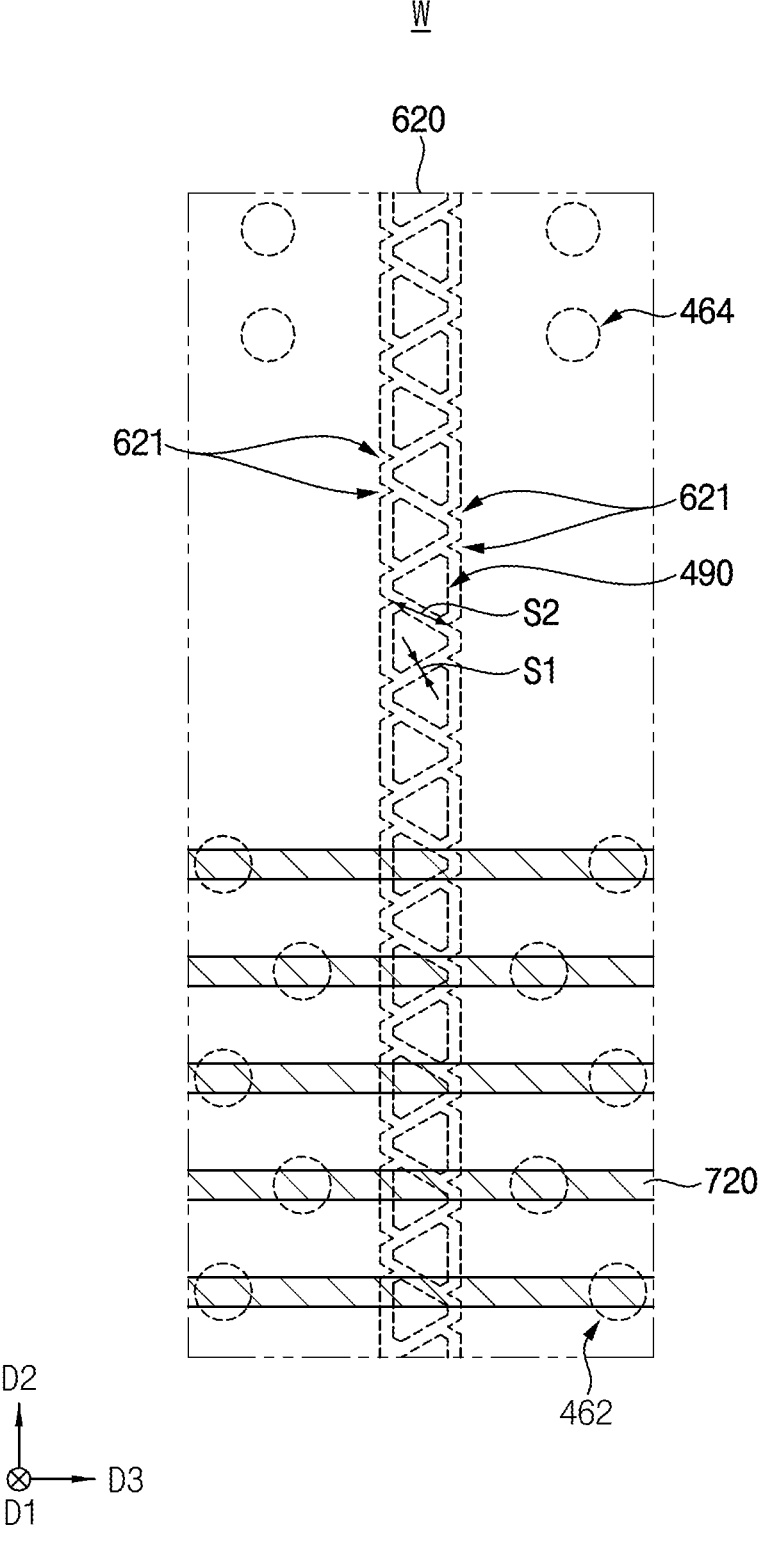
Figure 3B:
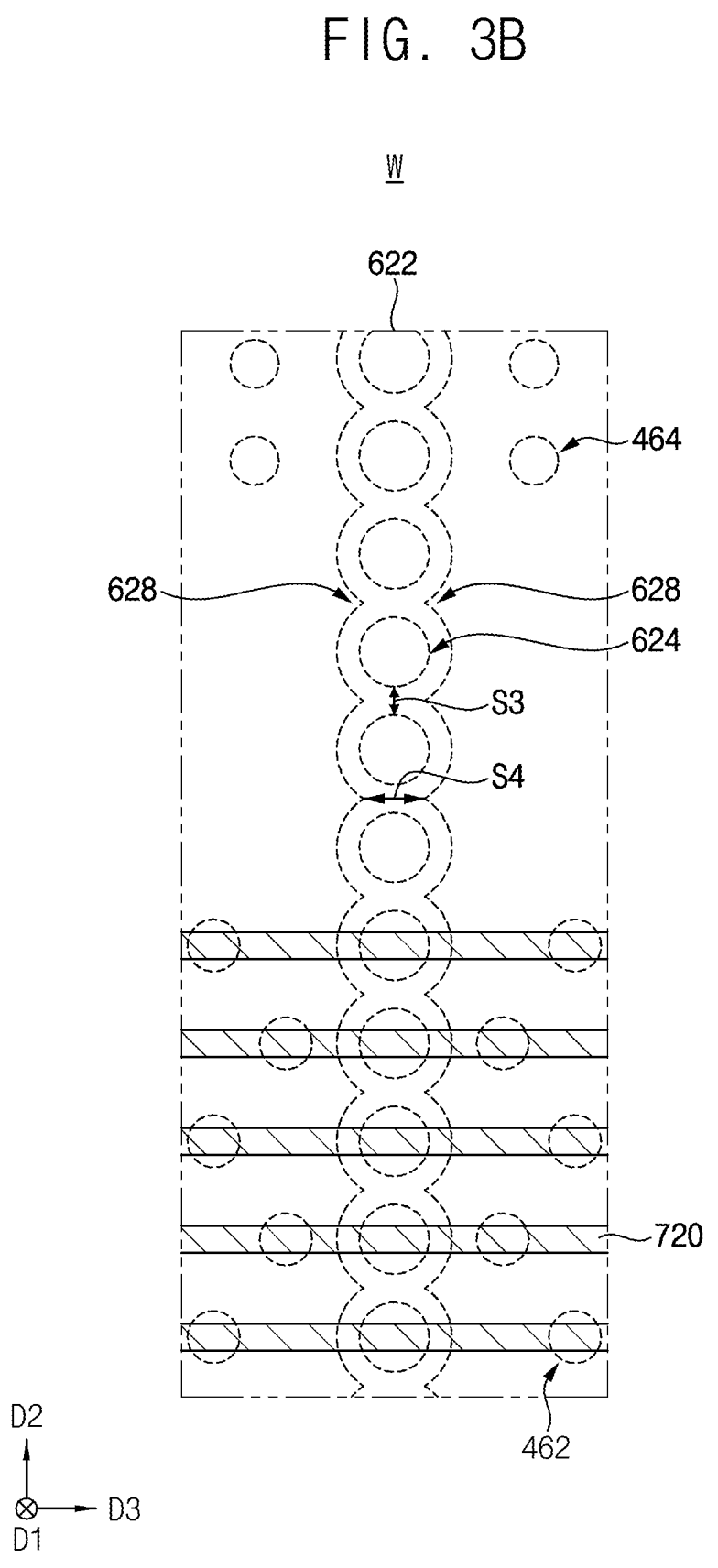
Figure 4:
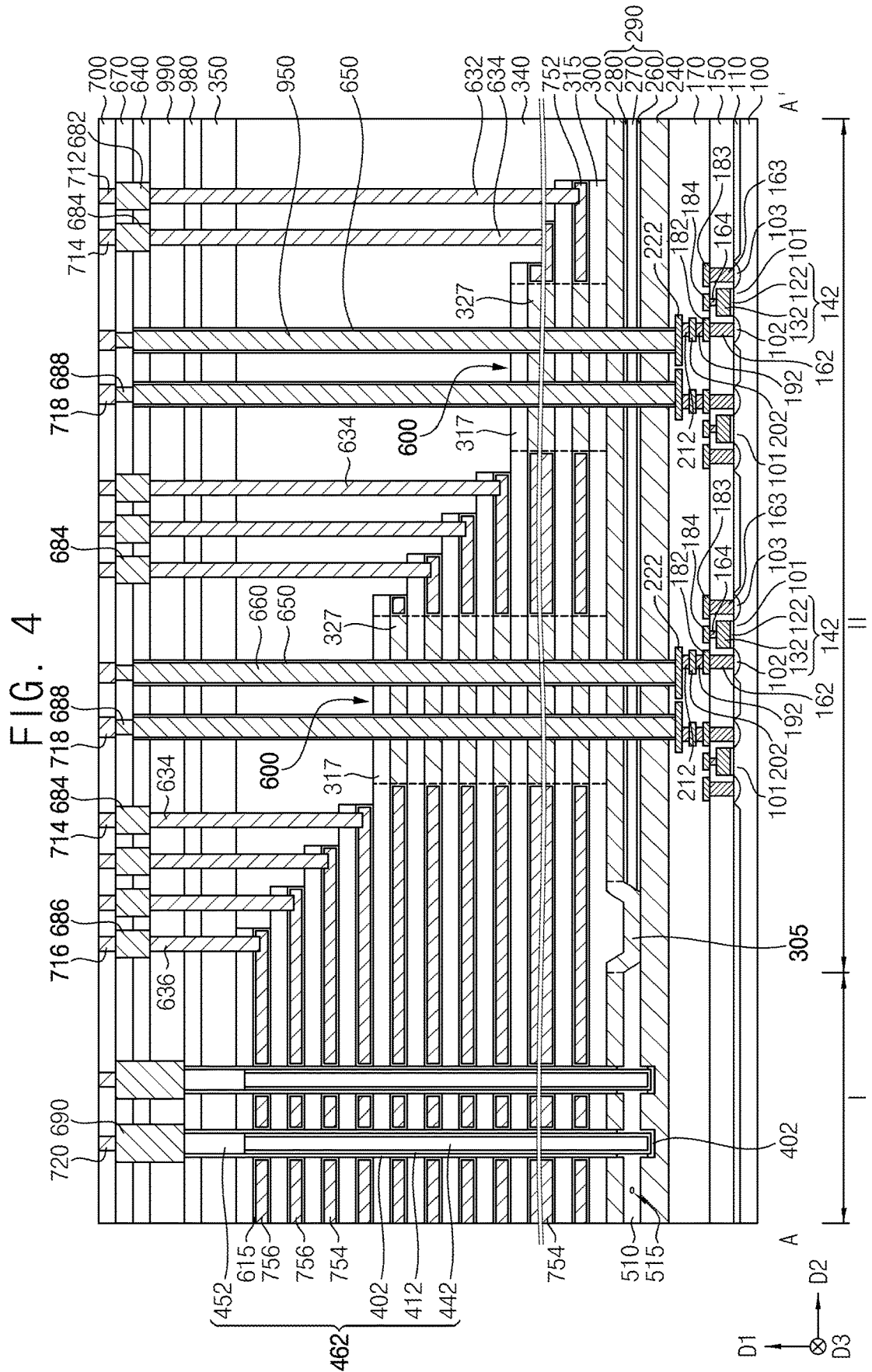
Figure 5:
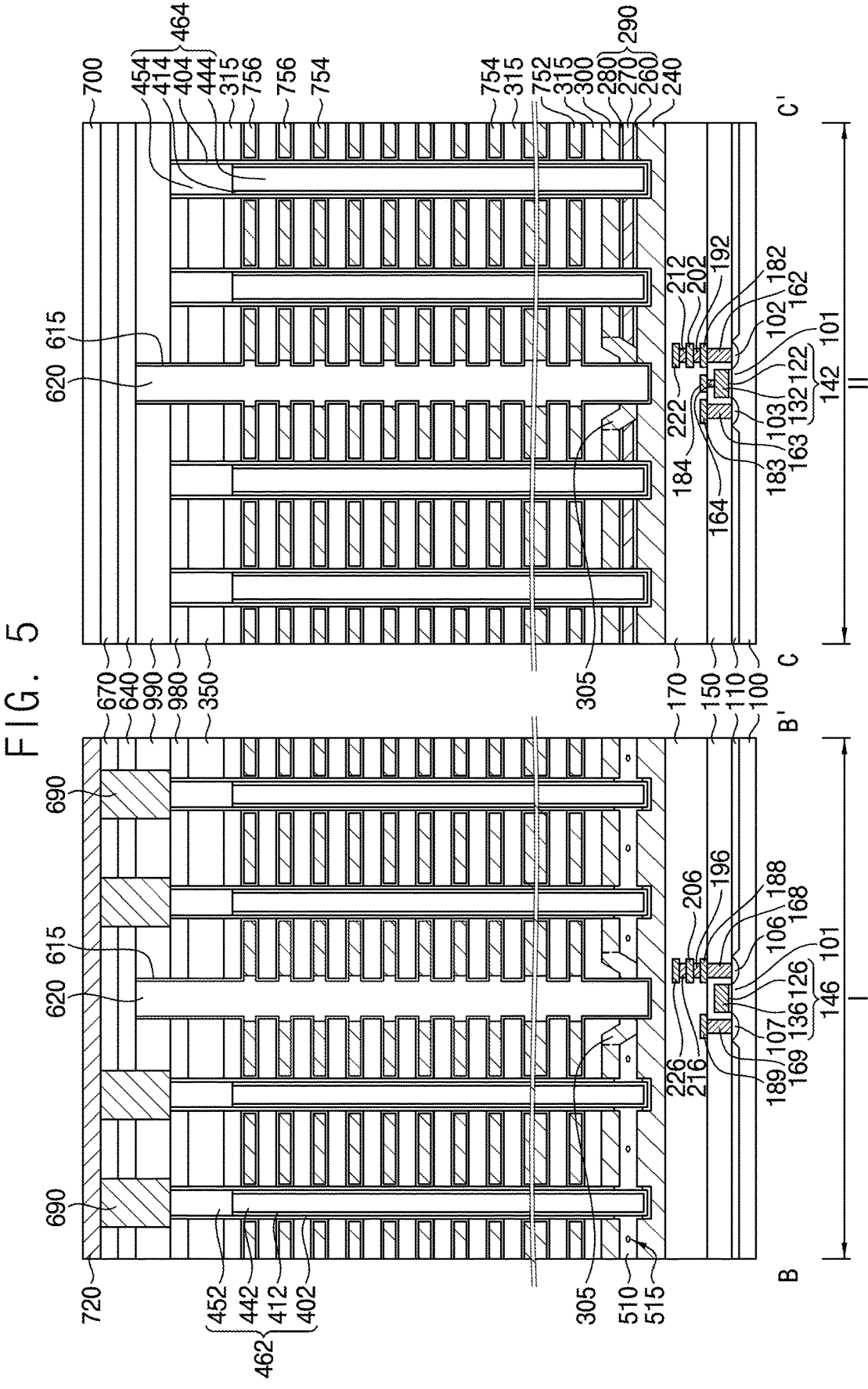
Figure 6:
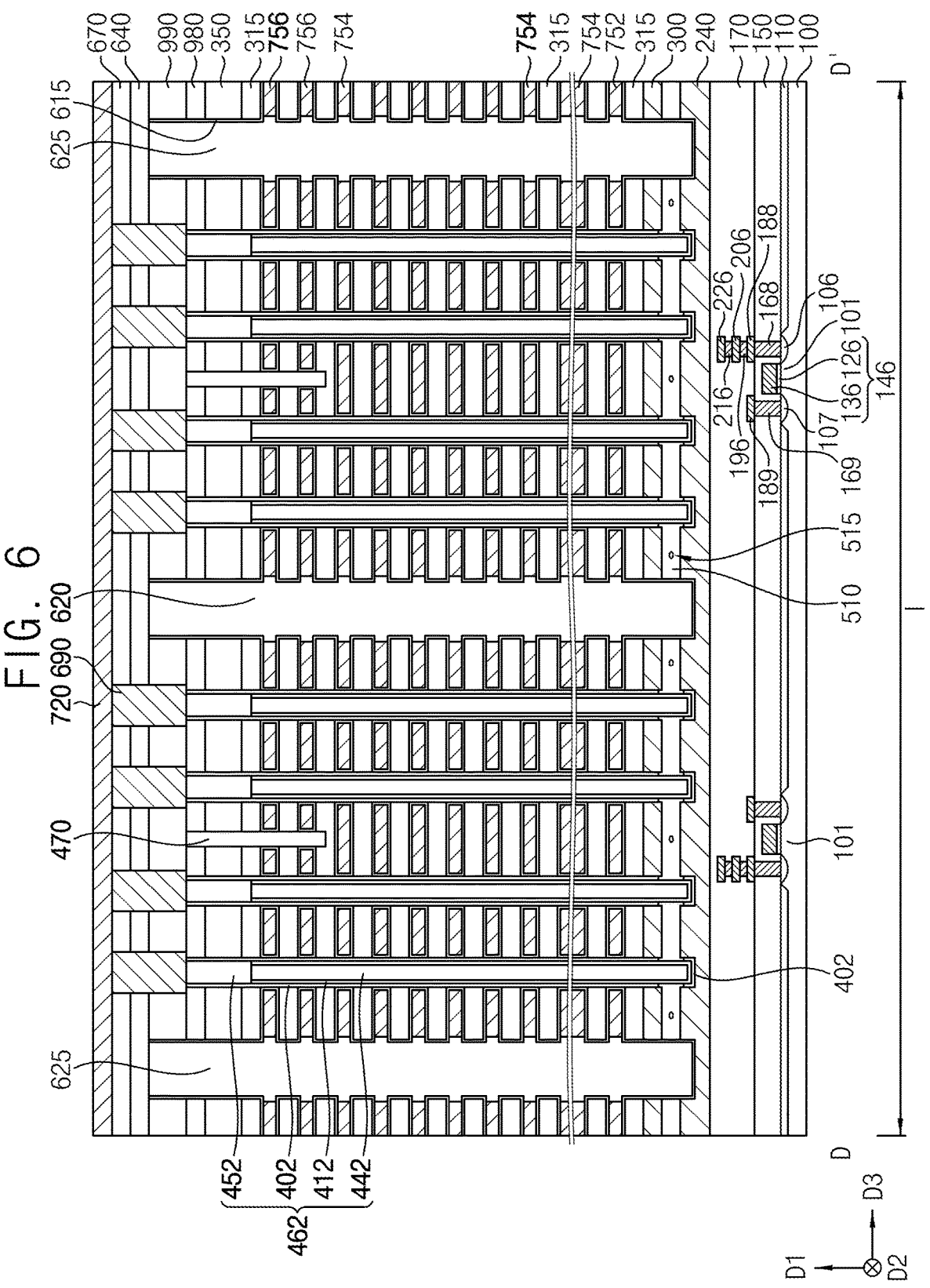
Figure 7:
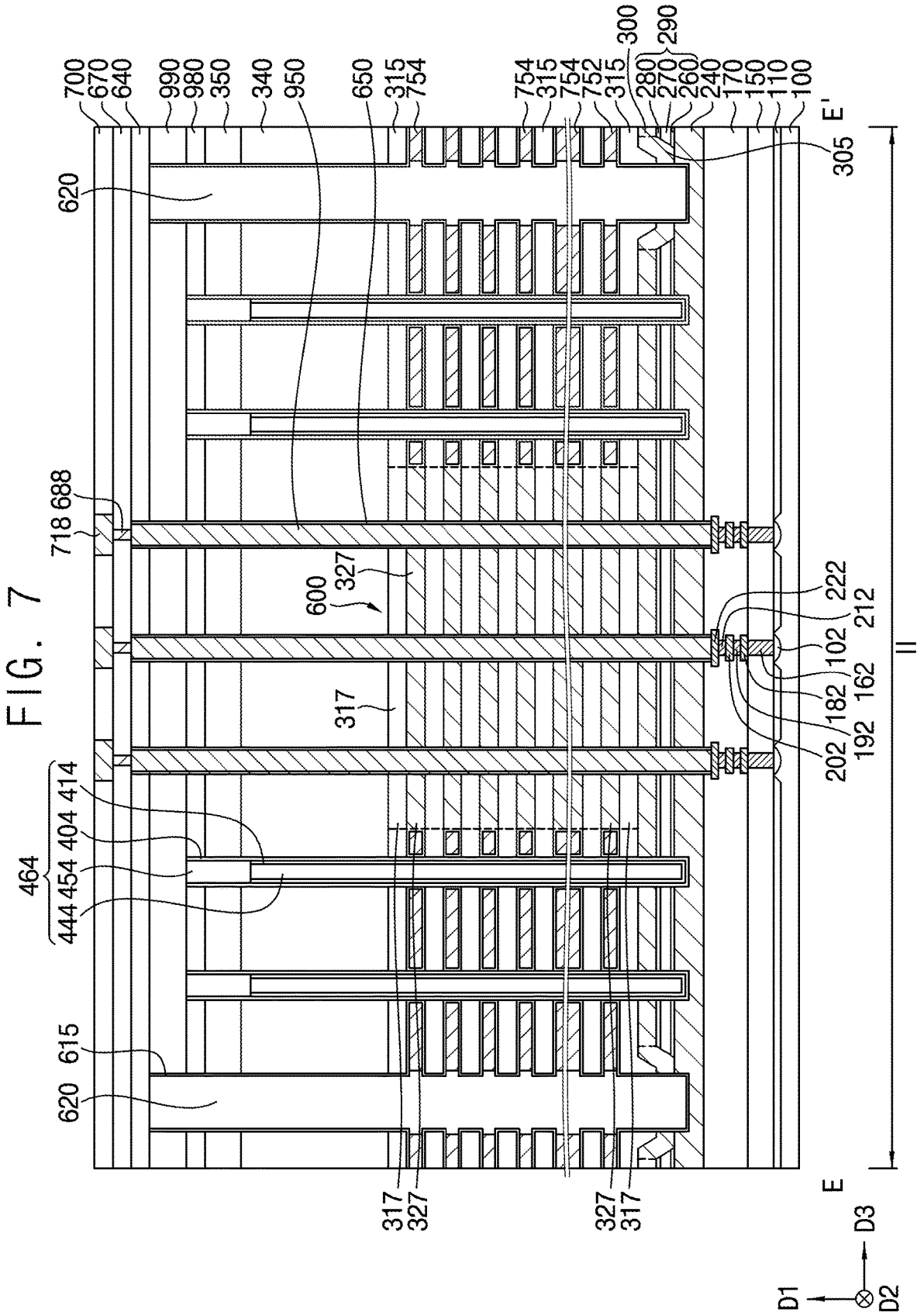

Particularly, FIGS. 1 to 3 are the plan views, FIG. 4 is a cross-sectional view taken along line A-A' of FIG. 2, FIG. 5 includes cross-sectional views taken along lines B-B' and C-C' of FIG. 2, FIG. 6 is a cross-sectional view taken along line D-D' of FIG. 2, and FIG. 7 is a cross-sectional view taken along line E-E' of FIG. 2. FIGS. 2 to 7 are drawings about region X in FIG. 1, and FIGS. 3A and 3B are enlarged plan views of region W of FIG. 2. FIG. 3A illustrates a third division pattern in accordance with example embodiments, and FIG. 3B illustrates a third division pattern in accordance with a comparative embodiment.

FIG. 2 does not show some elements to avoid the complexity of the drawing.

Referring to FIGS. 1 to 7, the semiconductor device may include a lower circuit pattern, a common source plate (CSP), a gate electrode structure, first to fourth division patterns 330, 470, 620 and 625, an insulation pattern structure 600, a memory channel structure 462, a dummy memory channel structure 464, first to eighth upper contact plugs 632, 634, 636, 682, 684, 686, 688 and 690, a through via 950, and first to fifth upper wirings 632, 634, 636, 682, 684, 686, 688 and 690 on a substrate 100.

Additionally, the semiconductor device may include a support layer 300, a support pattern 305, a sacrificial layer structure 290, a channel connection pattern 510, a second blocking pattern 615, first and fourth insulation patterns 315 and 650, and first to ninth insulating interlayers 150, 170, 340, 350, 980, 990, 640, 670 and 700.

The substrate 100 may include a semiconductor material, e.g., silicon, germanium, silicon-germanium, etc., or a III-V group compound semiconductor, e.g., GaP, GaAs, GaSb, etc. In example embodiments, the substrate 100 may be a silicon-on-insulator (SOI) substrate or a germanium-on-insulator (GOI) substrate.

In example embodiments, the substrate 100 may include a first region I and a second region II bordering or surrounding the first region I.

The first region I may be a cell array region, and the second region II may be a pad region or an extension region. The first and second regions I and II of the substrate 100 may form a cell region. Particularly, memory cells each of which includes a gate electrode, a channel and a charge storage structure may be formed on the first region I of the substrate 100, and upper contact plugs for applying electrical signals to the memory cells and pads of the gate electrodes contacting the upper contact plugs may be formed on the second region II of the substrate 100. FIG. 1 shows that the second region II of the substrate 100 entirely surrounds the first region I of the substrate 100 in a plan view thereof, however, embodiments of the inventive concept may not be limited thereto, and for example, the second region II of the substrate 100 may be formed only at opposite sides of the first region I of the substrate 100 in the second direction D2.

In some embodiments, the substrate 100 may further include a third region surrounding the second region II in a plan view thereof, and upper circuit patterns for applying electrical signals to the memory cells through the upper contact plugs may be formed on the third region of the substrate 100.

The substrate 100 may include a field region on which an isolation pattern 110 is formed, and an active region 101 on which no isolation pattern is formed. The isolation pattern 110 may include an oxide, e.g., silicon oxide.

In example embodiments, the semiconductor device may have a cell over periphery (COP) structure. That is, the lower circuit pattern may be formed on the substrate 100, and the memory cells, the upper contact plugs and the upper circuit pattern may be formed over the lower circuit pattern. The lower circuit pattern may include, e.g., transistors, lower contact plugs, lower wirings, lower vias, etc.

For example, first and second transistors may be formed on the second and first regions II and I, respectively, of the substrate 100. The first transistor may include a first lower gate structure 142 on the substrate 100, and first and second impurity regions 102 and 103 at upper portions, respectively, of the substrate 100 adjacent to the first lower gate structure 142, which may serve as source/drains, respectively. The second transistor may include a second lower gate structure 146 on the substrate 100, and third and fourth impurity regions 106 and 107 at upper portions, respectively, of the substrate 100 adjacent to the second lower gate structure 146, which may serve as source/drains, respectively.

The first lower gate structure 142 may include a first lower gate insulation pattern 122 and a first lower gate electrode 132 stacked on the substrate 100, and the second gate structure 146 may include a second lower gate insulation pattern 126 and a second lower gate electrode 136 stacked on the substrate 100.

The first insulating interlayer 150 may be formed on the substrate 100, and may be on and at least partially cover the first and second transistors. First, second, fourth and fifth lower contact plugs 162, 163, 168 and 169 may extend through the first insulating interlayer 150 to contact the first to fourth impurity regions 102, 103, 106 and 107, respectively, and a third lower contact plug 164 may extend through the first insulating interlayer 150 to contact the first lower gate electrode 132. In some embodiments, a sixth lower contact plug (not shown) may extend through the first insulating interlayer 150 to contact the second lower gate electrode 136.

First to fifth lower wirings 182, 183, 184, 188 and 189 may be formed on the first insulating interlayer 150 to contact upper surfaces of the first to fifth lower contact plugs 162, 163, 164, 168 and 169, respectively. A first lower via 192, a sixth lower wiring 202, a third lower via 212 and an eighth lower wiring 222 may be sequentially stacked on the first lower via 182, and a second lower via 196, a seventh lower wiring 206, a fourth lower via 216 and a ninth lower wiring 226 may be sequentially stacked on the fourth lower wiring 188.

The second insulating interlayer 170 may be formed on the first insulating interlayer 150, and may be on and at least partially cover the first to ninth lower wiring 182, 183, 184, 188, 189, 202, 206, 222 and 226, and the first to fourth lower vias 192, 196, 212 and 216.

Each of the first and second insulating interlayers 150 and 170 may include an oxide, e.g., silicon oxide.

The CSP 240 may be formed on the second insulating interlayer 170. The CSP 240 may include, e.g., polysilicon doped with n-type impurities. Alternatively, the CSP 240 may include a metal silicide layer and a doped polysilicon layer sequentially stacked. The metal silicide layer may include, e.g., tungsten silicide.

The sacrificial layer structure 290, the channel connection pattern 510, the support layer 300 and the support pattern 305 may be formed on the CSP 240.

The channel connection pattern 510 may be formed on the first region I of the substrate 100, and the sacrificial layer structure 290 may be formed on the second region II of the substrate 100. The channel connection pattern 510 may include an air gap 515 therein.

The support layer 300 may be formed on the channel connection pattern 510 and the sacrificial layer structure 290, and may also be formed in a first opening 302 extending through the channel connection pattern 510 and the sacrificial layer structure 290 to expose an upper surface of the CSP 240, which may be referred to as the support pattern 305.

The support pattern 305 may have various layouts in a plan view. For example, a plurality of support patterns 305 may be spaced apart from each other in the second and third directions D2 and D3 on the first region I of the substrate 100, the support pattern 305 may extend in the third direction D3 on a portion of the second region II of the substrate 100 adjacent to the first region I of the substrate 100, and a plurality of support patterns 305 each of which may extend in the second direction D2 may be spaced apart from each other in the third direction D3 on the second region II of the substrate 100. FIG. 4 shows the support pattern 305 extending in the third direction D3 on the portion of the second region II of the substrate 100 adjacent to the first region I of the substrate 100.

The channel connection pattern 510 may include polysilicon doped with n-type impurities or undoped polysilicon. The sacrificial layer structure 290 may include first, second and third sacrificial layers 260, 270 and 280 sequentially stacked in the first direction D1. Each of the first and third sacrificial layers 260 and 280 may include an oxide, e.g., silicon oxide, and the second sacrificial layer 270 may include a nitride, e.g., silicon nitride. The support layer 300 and the support pattern 305 may include a material having an etching selectivity with respect to the first to third sacrificial layers 260, 270 and 280, e.g., polysilicon doped with n-type impurities.

The gate electrode structure may include gate electrodes at a plurality of levels spaced apart from each other in the first direction D1 on the support layer 300 and the support pattern 305. Each of the gate electrodes may extend in the second direction D2. The first insulation pattern 315 may be formed between the gate electrodes, and between the gate electrode and the support layer 300 or the support pattern 305. The first insulation pattern 315 may include an oxide, e.g., silicon oxide.

In example embodiments, the gate electrode structure may include first, second and third gate electrodes 752, 754 and 756 sequentially stacked in the first direction D1. The first gate electrode 752 may be formed at one or two levels, the second gate electrodes 754 may be formed at a plurality of levels, respectively, and the third gate electrode 756 may be formed at one or two levels. FIGS. 4 to 7 show that the first gate electrode 752 is formed at one level and the third gate electrode 756 is formed at two levels, however, embodiments of the inventive concept may not be limited thereto.

In example embodiments, the first gate electrode 752 may serve as a ground selection line (GSL), the second gate electrode 754 may serve as a word line, and the third gate electrode 756 may serve as a string selection line (SSL).

The gate electrode structure may further include a gate electrode that may be used for erasing data stored in the memory channel structure 462 using a gate induced drain leakage (GIDL) phenomenon, which may be referred to as a GIDL gate electrode. In an example embodiment, the GIDL gate electrode may be formed at a level lower than that of the first gate electrode 752 and at a level higher than that of the third gate electrode 756 in the first direction D1. Alternatively, the GIDL gate electrode may be formed at a level between that of the second gate electrode 754 and that of the third gate electrode 756 and at the level lower than that of the first gate electrode 752 in the first direction D1.

In example embodiments, the gate electrode structure may have a staircase shape in which lengths in the second direction D2 decreases in the first direction D1 from a lowermost level toward an uppermost level, and may include steps arranged in the second direction D2 on the second region II of the substrate 100. The gate electrode structure may further include steps arranged in the third direction D3 on the second region II of the substrate 100.

Hereinafter, a portion of the gate electrode structure corresponding to the step, that is, an end portion of each of the gate electrodes that is not overlapped by upper ones of the gate electrodes may be referred to as a pad. Thus, the pad of each of the gate electrodes may be formed on the second region II of the substrate 100.

The gate electrode structure may include first pads having a relatively large length in the second direction D2 and second pads having a relatively small length in the second direction D2. The numbers of the first pads and the second pads may not be limited.

Each of the first to third gate electrodes 752, 754 and 756 may include a gate conductive pattern and a gate barrier pattern on and at least partially covering a surface of the gate conductive pattern. The gate conductive pattern may include a metal having a low resistance, e.g., tungsten, titanium, tantalum, platinum, etc., and the gate barrier pattern may include a metal nitride, e.g., titanium nitride, tantalum nitride, etc.

In example embodiments, a plurality of gate electrode structures may be spaced apart from each other in the third direction D3. The third division pattern 620 may be formed on the CSP 240 between neighboring ones of the gate structures in the third direction D3. The third division pattern 620 may extend in the second direction D2 on the first and second regions I and II of the substrate 100.

The fourth division pattern 625 may extend through the gate electrode structure in the second direction D2 on the first region I of the substrate 100 and a portion of the second region II of the substrate 100 adjacent to the first region I of the substrate 100. Unlike the third division pattern 620, the fourth division pattern 625 may not extend to an end portion of the second region II of the substrate 100, and a plurality of fourth division patterns 625 may be spaced apart from each other in the second direction D2 on the second region II of the substrate 100.

However, the fourth division pattern 625 may extend from the first region I of the substrate 100 to a portion of the second region II of the substrate 100 overlapping the third gate electrodes 756 in the first direction D1, and thus the third gate electrode 756 may be divided by the fourth division pattern 625.

The third gate electrode 756 may be further divided by the second division pattern 470 extending through an upper portion of the gate structure, e.g., upper two levels at which the third gate electrodes 756 are formed to the portion of the second region II of the substrate 100 overlapping the third gate electrodes 756 in the first direction D1.

FIG. 3A shows a third hole 490 (refer to FIGS. 12 to 14) for forming the third division pattern 620, and description of the third division pattern 620 may also apply to the fourth division pattern 625.

Referring to FIG. 3A, the third division pattern 620 in accordance with example embodiments may have a bar shape extending in the second direction D2, and fourth recesses 621 may be formed at each of opposite sidewalls in the third direction D3.

That is, the third division pattern 620 may be formed, as described below with reference to FIGS. 12 to 24, in a third opening 493 that may be formed by forming the third holes 490, each of which may have a shape of a triangle in a plan view, spaced apart from each other in the second direction D2 by a first distance S1, and enlarging horizontal widths of the third holes 490 through an etching process so that the third holes 490 may be connected with each other. The fourth recess 621 having a sharp shape may be formed at a portion of each of opposite sidewalls in the third direction D3 of the third division pattern 620 adjacent to a vertex of the triangle shape of each of the third holes 490.

In example embodiments, a plurality of fourth recesses 621 may be spaced apart from each other in the second direction D2 on each of opposite sidewalls in the third direction D3 of the third division pattern 620, and neighboring two ones of the fourth recesses 621 in the second direction D2 may form a fourth recess pair. In example embodiments, a plurality of fourth recess pairs may be spaced apart from each other in the second direction D2 on each of opposite sidewalls in the third direction D3 of the third division pattern 620, and the fourth recess pairs on the opposite sidewalls in the third direction D3 of the third division pattern 620 may be arranged in a zigzag pattern in the second direction D2, and may not overlap each other in the third direction D3.

Thus, a second distance S2 between neighboring ones of the fourth recesses 621 in the third direction D3 may have a relatively large value. Accordingly, electrical interference between portions of the gate electrodes at opposite sidewalls, respectively, in the third direction D3 of the third division pattern 620, particularly, portions of the gate electrodes adjacent to the fourth recesses 621 having the sharp shape to which an electric field may be concentrated at the respective opposite sidewalls in the third direction D3 of the third division pattern 620 may be reduced.

For the convenience of explanation, the opposite sidewalls in the third direction D3 of the third division pattern 620 may be referred to as first and second sidewalls, respectively, and ones of the fourth recesses spaced apart from each other in the second direction D2 on the first sidewall of the third division pattern 620 may be referred to as sixth recesses, and ones of the fourth recesses spaced apart from each other in the second direction D2 on the second sidewall of the third division pattern 620 may be referred to as sixth recesses.

In example embodiments, the sixth recesses may be spaced apart from each other by a fifth distance and sixth distance alternately in the second direction D2, and the sixth distance may be greater than the fifth distance. Additionally, the seventh recesses may be spaced apart from each other by a seventh distance and eighth distance alternately in the second direction D2, and the eighth distance may be greater than the seventh distance.

That is, the sixth recesses spaced apart from each other in the second direction D2 by the fifth distance may form a sixth recess pair, and the sixth recess pairs may be spaced apart from each other in the second direction D2 by the sixth distance. Additionally, the seventh recesses spaced apart from each other in the second direction D2 by the seventh distance may form a seventh recess pair, and the seventh recess pairs may be spaced apart from each other in the second direction D2 by the eighth distance.

Thus, distances between the sixth recesses may be periodically changed in the second direction D2 to have the fifth distance and the sixth distance, and distances between the seventh recesses may be periodically changed in the second direction D2 to have the seventh distance and the eighth distance.

In example embodiments, the fifth and seventh distances may be substantially equal to each other, and the sixth and eighth distances may be substantially equal to each other.

Referring to FIG. 3B, a fifth division pattern 622 in accordance with the comparative embodiment may be formed in a fifth opening that may be formed by forming fifth holes 624, each of which may have a shape of a circle in a plan view, spaced apart from each other in the second direction D2 by a third distance S3, and enlarging horizontal widths of the fifth holes 624 through an etching process so that the fifth holes 624 may be connected with each other. Fifth recesses 628 may be formed to be spaced apart from each other on each of opposite sidewalls in the third direction D3 of the fifth division pattern 622.

The fifth recesses 628 on the opposite sidewalls, respectively, of the fifth division pattern 622 may overlap each other in the third direction D3, and thus a fourth distance S4 between neighboring ones of the fifth recesses 628 in the third direction D3 may have a relatively small value, so that electrical interference between portions of the gate electrodes at opposite sidewalls, respectively, in the third direction D3 of the fifth division pattern 622, particularly, portions of the gate electrodes adjacent to the fifth recesses 628 having the sharp shape to which an electric field may be concentrated at the respective opposite sidewalls in the third direction D3 of the fifth division pattern 622 may increase.

Figure 10:
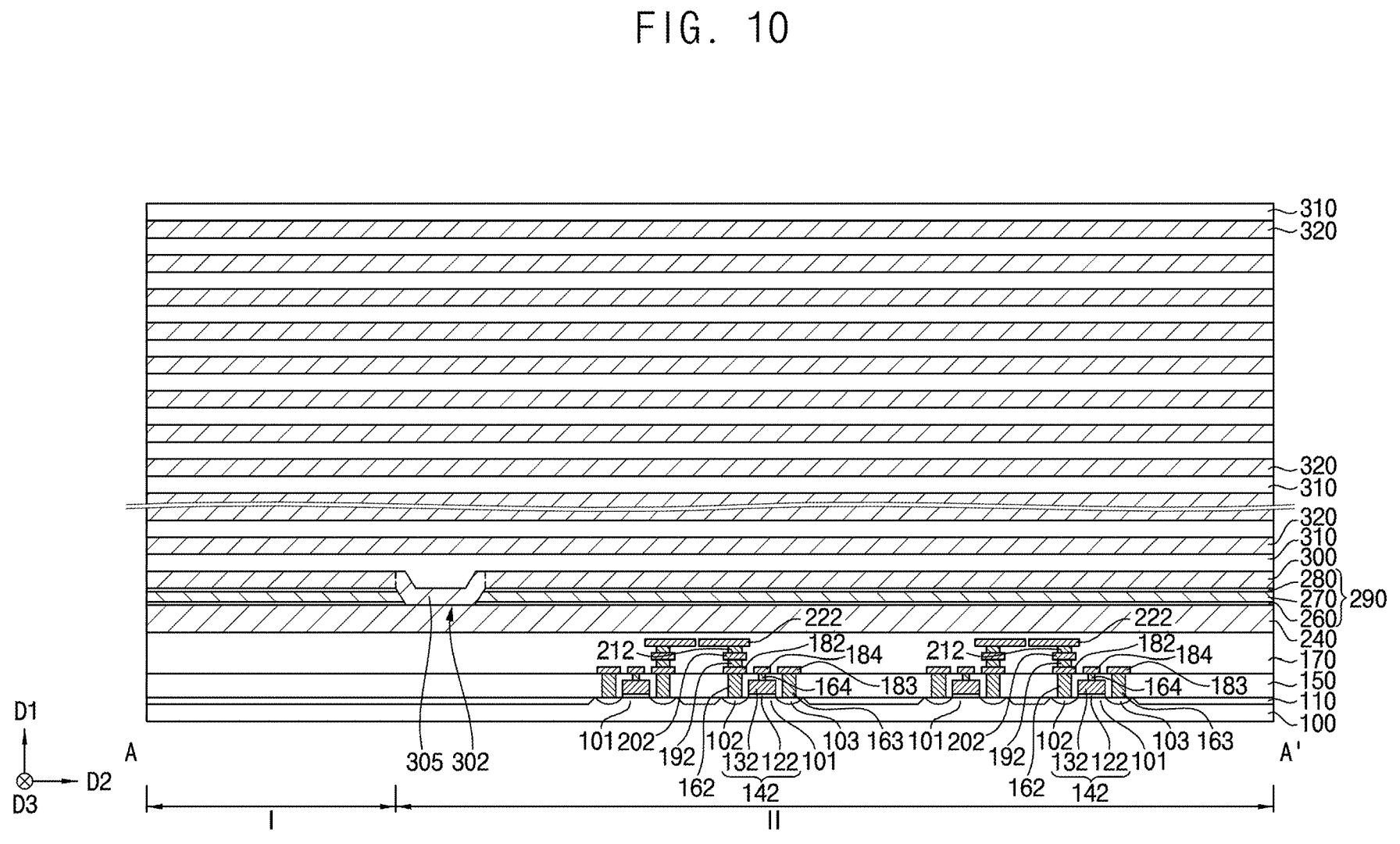
Figure 11:
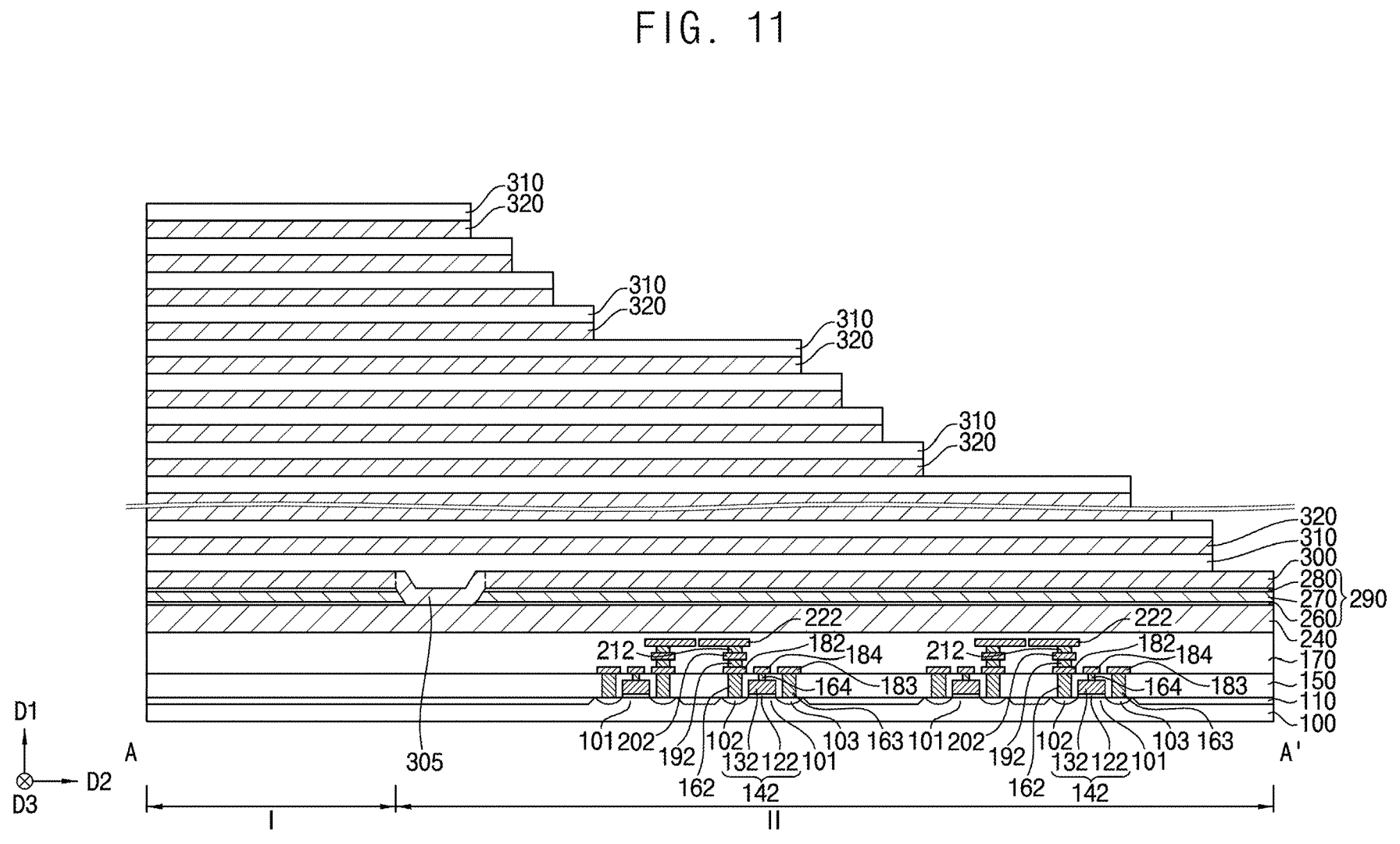
Figure 12:
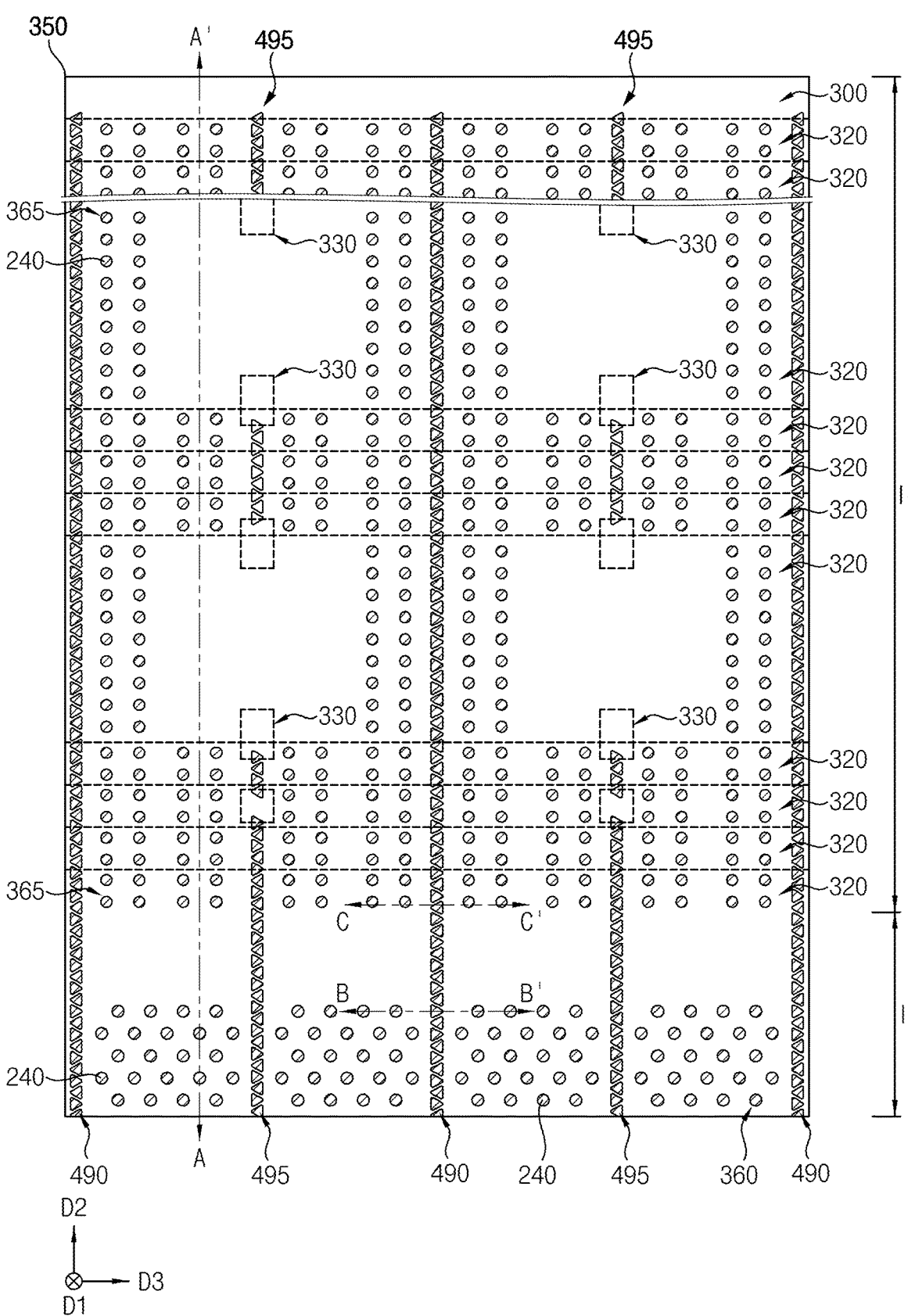

Referring FIGS. 1 to 7 together with FIGS. 10 to 12, the first division pattern 330 may be formed through the first gate electrode 752 on the second region II of the substrate 100. In example embodiments, a plurality of first division patterns 330 may be spaced apart from each other in the second and third directions D2 and D3. In example embodiments, the fourth division pattern 625 may contact an end portion in the second direction D2 of the fourth division pattern 625, and may overlap in the first direction D1 an end portion in the second direction D2 of the insulation pattern structure 600.

Each of the first to fourth division patterns 330, 470, 620 and 625 may include an oxide, e.g., silicon oxide.

In example embodiments, a memory block including the gate electrode structure and the memory channel structures 462 in an area formed by neighboring ones of the third division patterns 620 in the third direction D3 may be defined, and a plurality of memory blocks may be arranged in the third direction D3.

In an example embodiment, the memory block may include two first gate electrodes 752 at each level divided by the first division pattern 330, one second gate electrode 754 at each level, and four third gate electrodes 765 at each level divided by the second and fourth division patterns 470 and 625, however, the inventive concept may not be limited thereto. Alternatively, the memory block may include two first gate electrodes 752 at each level, one second gate electrode 754 at each level, and six third gate electrodes 765 at each level.

Figure 19:
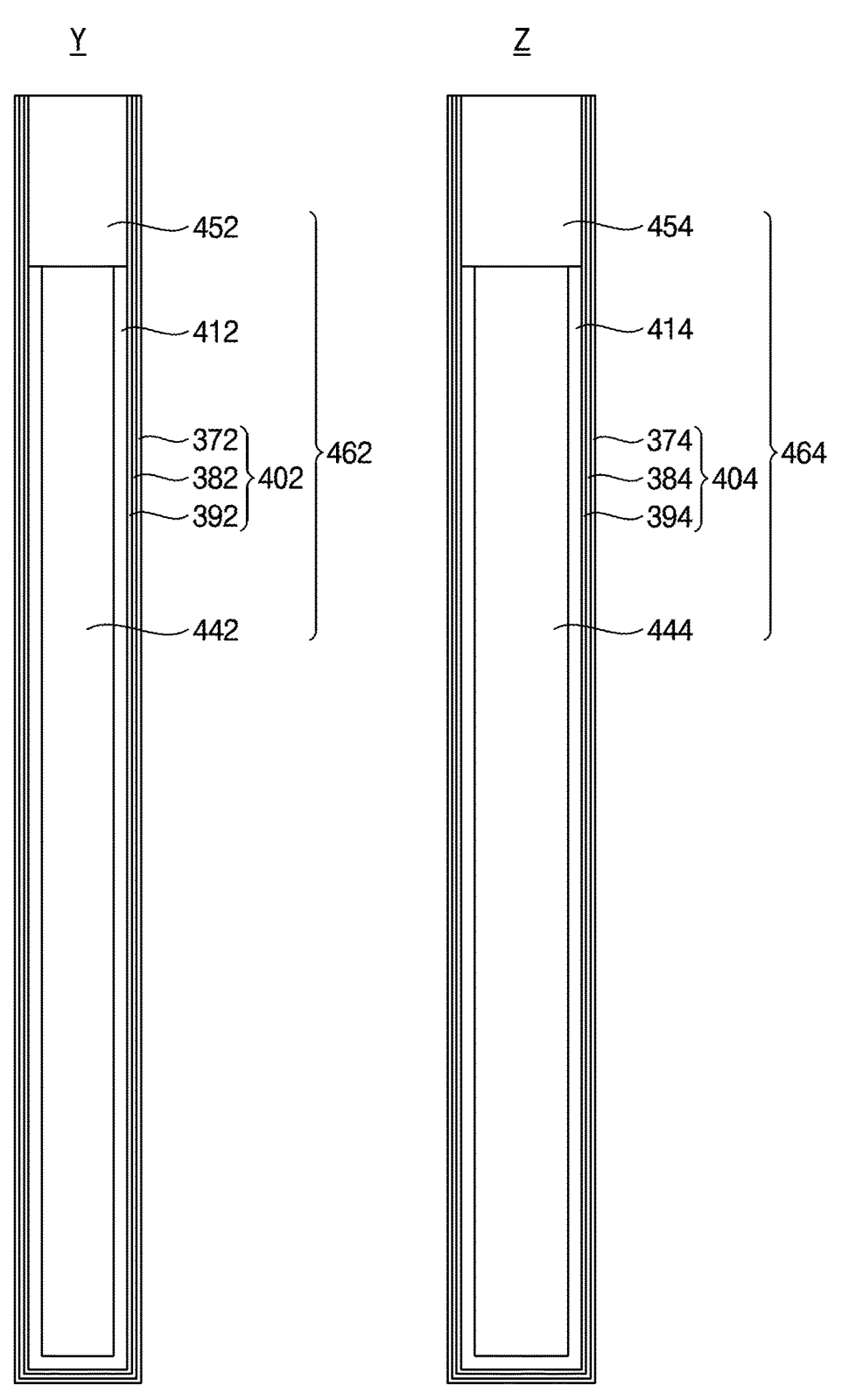

Referring FIGS. 1 to 7 together with FIG. 19, the memory channel structure 462 may be formed on the first region I of the substrate 100, and may contact an upper surface of the CSP 240. The memory channel structure 462 may extend through the channel connection pattern 510, the gate electrode structure, the first insulation pattern 315, and the fourth and fifth insulating interlayers 350 and 980. In example embodiments, the memory channel structure 462 may include a first filling pattern 442 having a pillar shape extending in the first direction D1, a channel 412 on a sidewall of the first filling pattern 442 and having a cup shape, a first capping pattern 452 on upper surfaces of the first filling pattern 442 and the channel 412, and a charge storage structure 402 on an outer sidewall of the channel 412 and a sidewall of the first capping pattern 452.

The charge storage structure 402 may include a tunnel insulation pattern 392, a charge storage pattern 382 and a first blocking pattern 372 sequentially stacked in the horizontal direction, e.g., the second and/or third directions D2 and/or D3, on the outer sidewall of the channel 412.

In example embodiments, a plurality of memory channel structures 462 may be spaced apart from each other in the second and third directions D2 and D3 on the first region I of the substrate 100 to form a memory channel array, and a plurality of memory channel structures 462 included in the memory channel array may be connected to each other by the channel connection pattern 510. Particularly, the charge storage structure 402 may not be formed on a portion of the outer sidewall of each of the channels 412, and the channel connection pattern 510 may contact the outer sidewalls of the channels 412 to electrically connect the channels 412 to each other.

The dummy memory channel structure 464 may be formed on the second region II of the substrate 100, and may contact the upper surface of the CSP 240. The dummy memory channel structure 464 may extend through the sacrificial layer structure 290, the gate electrode structure, the first insulation pattern 315, and the third and fourth insulating interlayers 340 and 350. In example embodiments, the dummy memory channel structure 464 may include a second filling pattern 444 having a pillar shape extending in the first direction D1, a dummy channel 414 on a sidewall of the second filling pattern 444 and having a cup shape, a second capping pattern 454 on upper surfaces of the second filling pattern 444 and the dummy channel 414, and a dummy charge storage structure 404 on an outer sidewall of the dummy channel 414 and a sidewall of the second capping pattern 454.

The dummy charge storage structure 404 may include a dummy tunnel insulation pattern 394, a dummy charge storage pattern 384 and a first dummy blocking pattern 374 sequentially stacked in the horizontal direction, e.g., the second and/or third directions D2 and/or D3, on the outer sidewall of the dummy channel 414.

The dummy memory channel structure 464 may not serve as a memory unit for storing data or a channel through which charge carriers move, but may prevent the gate electrode structure from collapsing or reduce the likelihood of a collapse, and thus may be referred to as a support structure 464.

In example embodiments, a plurality of support structures 464 may be spaced apart from each other in the second and third directions D2 and D3 on the second region II of the substrate 100.

The channel 412 and the dummy channel 414 may include, e.g., undoped polysilicon, the first and second filling patterns 442 and 444 may include an oxide, e.g., silicon oxide, and the first and second capping patterns 452 and 454 may include, e.g., doped polysilicon.

The tunnel insulation pattern 392 and the dummy tunnel insulation pattern 394 may include an oxide, e.g., silicon oxide, the charge storage pattern 382 and the dummy charge storage pattern 384 may include a nitride, e.g., silicon nitride, and the first blocking pattern 372 and the first dummy blocking pattern 374 may include an oxide, e.g., silicon oxide.

The insulation pattern structure 600 may extend through a portion of the gate electrode structure on the second region II of the substrate 100, and may have a shape of, e.g., a rectangle, an ellipse, a circle, etc., in a plan view. In example embodiments, the insulation pattern structure 600 may extend through the second pad of the gate electrode structure having a relatively large length in the second direction D2. The insulation pattern structure 600 may include second and third insulation patterns 317 and 327 alternately and repeatedly stacked in the first direction D1.

The second blocking pattern 615 may be on and at least partially cover lower and upper surfaces and a sidewall facing the memory channel structure 462 and the support structure 464 of each of the first to third gate electrodes 752, 754 and 756. The second blocking pattern 615 may include a metal oxide, e.g., aluminum oxide, hafnium oxide, etc.

The third insulating interlayer 340 may be formed on the support layer 300, and may be on and at least partially cover sidewalls of the gate electrode structure and the first insulation pattern 315, and the fourth and fifth insulating interlayers 350 and 980 may be stacked on the third insulating interlayer 340 and the first insulation pattern 315.

The sixth to ninth insulating interlayers 990, 640, 670 and 700 may be sequentially stacked on the fifth insulating interlayer 980, the memory channel structure 462 and the support structure 464.

The first to third upper contact plugs 632, 634 and 636 may extend through the third to sixth insulating interlayers 340, 350, 980 and 990 and the first insulation pattern 315 to contact upper surfaces of the first to third gate electrodes 752, 754 and 756, respectively, on the second region II of the substrate 100. In example embodiments, each of the gate electrode structure may be formed in an area surrounded by the support structures 464 at each of the first and second pads of the gate electrode structure in a plan view. For example, the support structures 464 may be disposed at respective vertices of a rectangle in a plan view, and each of the first to third upper contact plugs 632, 634 and 636 may be formed in an inside of the rectangle in a plan view.

FIG. 2 shows the layout of the first to third upper contact plugs 632, 634 and 636, however, embodiments of the inventive concept may not be limited thereto.

The through via 950 may extend through the third to seventh insulating interlayers 340, 350, 980, 990 and 640, the insulation pattern structure 600, the support layer 300, the sacrificial layer structure 290, the CSP 240, and an upper portion of the second insulating interlayer 170 on the second region II of the substrate 100, and may contact an upper surface of the eighth lower wiring 222.

In example embodiments, a plurality of through vias 950 may be spaced apart from each other in the area where the insulation pattern structure 600 is formed. FIG. 2 shows six through vias 950 in each area, however, embodiments of the inventive concept may not be limited thereto.

The fourth insulation pattern 650 may be formed on a sidewall of the through via 950, and may be electrically connected to the support layer 300 and the CSP 240. However, the through via 950 may extend through the insulation pattern structure 600, that is, the second and third insulation patterns 317 and 327 to be electrically insulated from the first to third gate electrodes 752, 754 and 756, and thus if an insulation pattern is formed on sidewalls of the support layer 300 and the CSP 240, the fourth insulation pattern 650 may not be formed. The fourth insulation pattern 650 may include an oxide, e.g., silicon oxide.

The fourth to sixth upper contact plugs 682, 684 and 686 may extend through the seventh and eighth insulating interlayers 640 and 670, and may contact upper surfaces of the first to third upper contact plugs 632, 634 and 636, respectively. The seventh upper contact plug 688 may extend through the eighth insulating interlayer 670, and may contact an upper surface of the through via 950. The eighth upper contact plug 690 may extend through the sixth to eighth insulating interlayers 990, 640 and 670, and may contact an upper surface of the first capping pattern 452.

The first to fifth upper wirings 712, 714, 716, 718 and 720 may extend through the ninth insulating interlayer 700, and may contact upper surfaces of the fourth to eighth upper contact plugs 682, 684, 686, 688 and 690, respectively.

In example embodiments, the fifth upper wiring 720 may extend in the third direction D3, and a plurality of fifth upper wirings 720 may be spaced apart from each other in the second direction D2. The fifth upper wiring 720 may serve as a bit line. Alternatively, an upper via and a sixth upper wiring may be further formed on the fifth upper wiring 720, and the sixth upper wiring may serve as the bit line.

The first to fifth upper wirings 712, 714, 716, 718 and 720 may have various layouts on the second region II of the substrate 100.

The first to sixth upper contact plugs 632, 634, 636, 682, 684 and 686, the through via 950, and the first to fifth upper wirings 712, 714, 716, 718 and 720 may include a conductive material, e.g., a metal, a metal nitride, a metal silicide, etc.

As illustrated above, the semiconductor device may include the third and fourth division patterns 620 and 625 between neighboring ones of the gate electrode structures in the third direction D3 and at least partially separating the gate electrode structures, and the fourth recess pairs on the opposite sidewalls in the third direction D3 of each of the third and fourth division patterns 620 and 625 may be arranged in a zigzag pattern in the second direction D2 not to overlap each other in the third direction D3. Thus, the distance between the portions of the gate electrodes in the fourth recesses 621 may increase, and the electrical interference between the gate electrodes may be reduced.

FIGS. 8 to 38 are plan views and cross-sectional views illustrating a method of manufacturing a semiconductor device, for example, a vertical channel NAND flash memory device in accordance with example embodiments. Particularly, FIGS. 8, 12, 15, 20-21, 23-24, 32, 35 and 37 are the plan views, and FIGS. 9-11, 13-14, 16-19, 22, 25-31, 33-34, 36 and 38 are the cross-sectional views.

Figure 18:
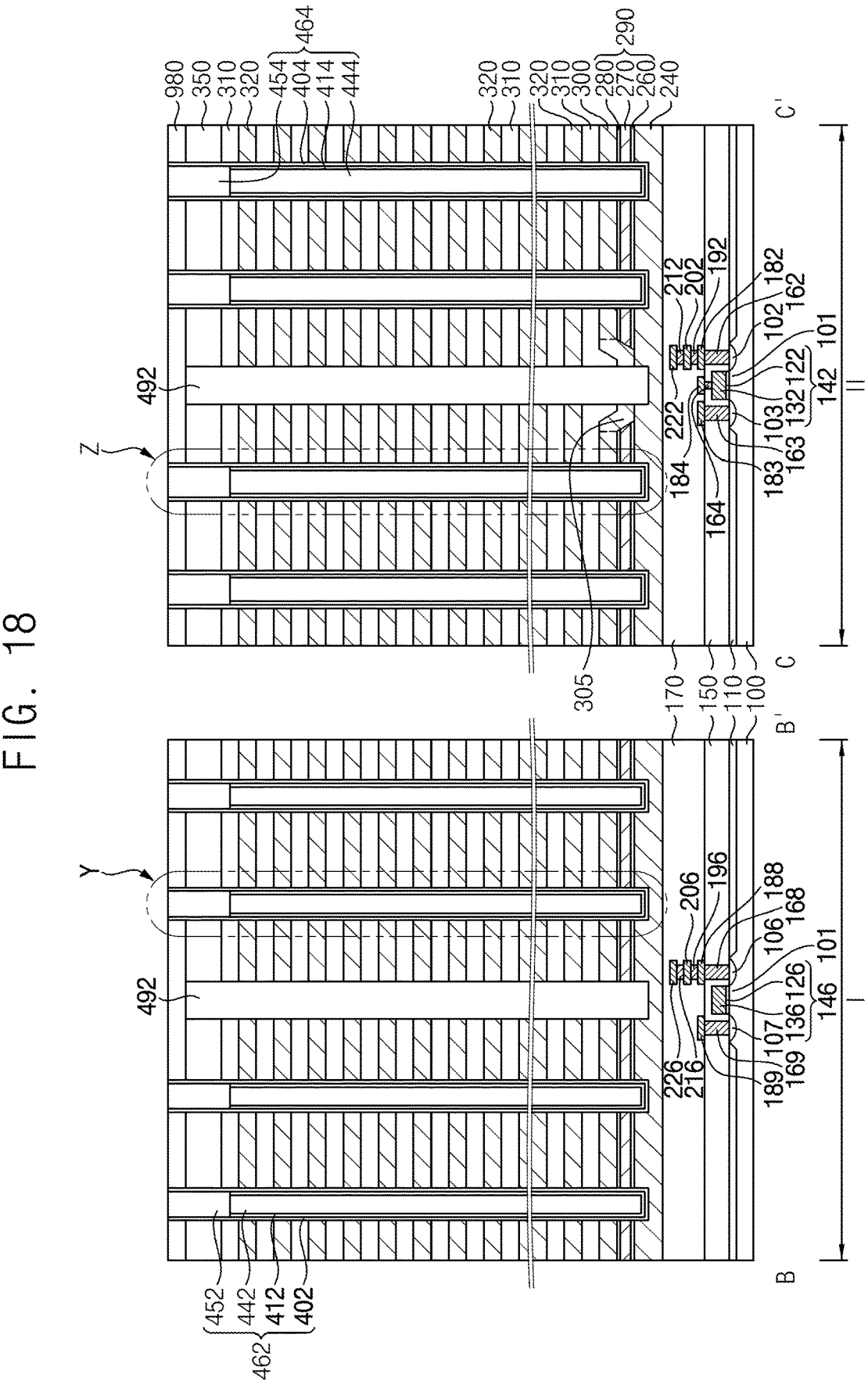
Figure 28:
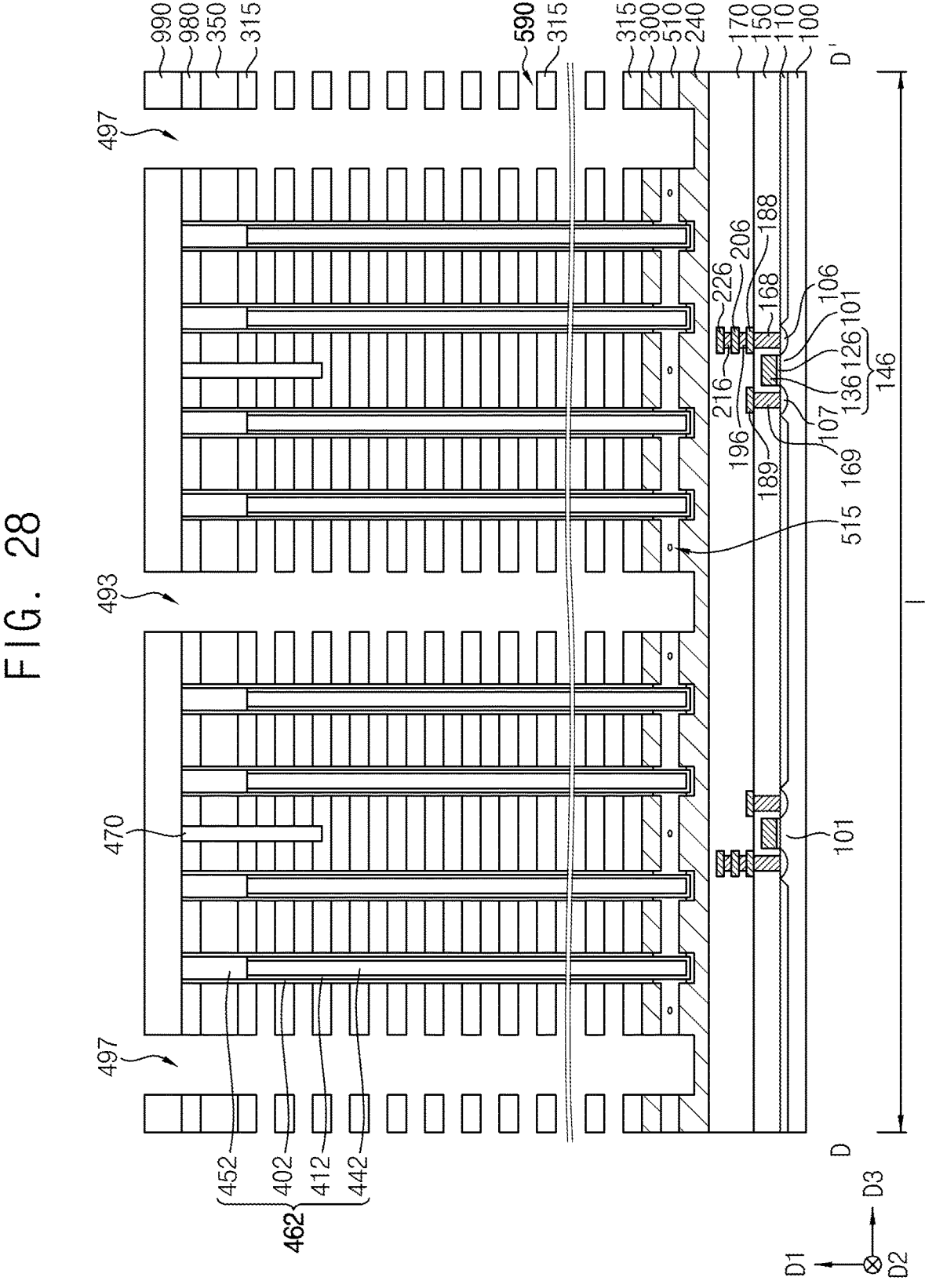
Figure 29:
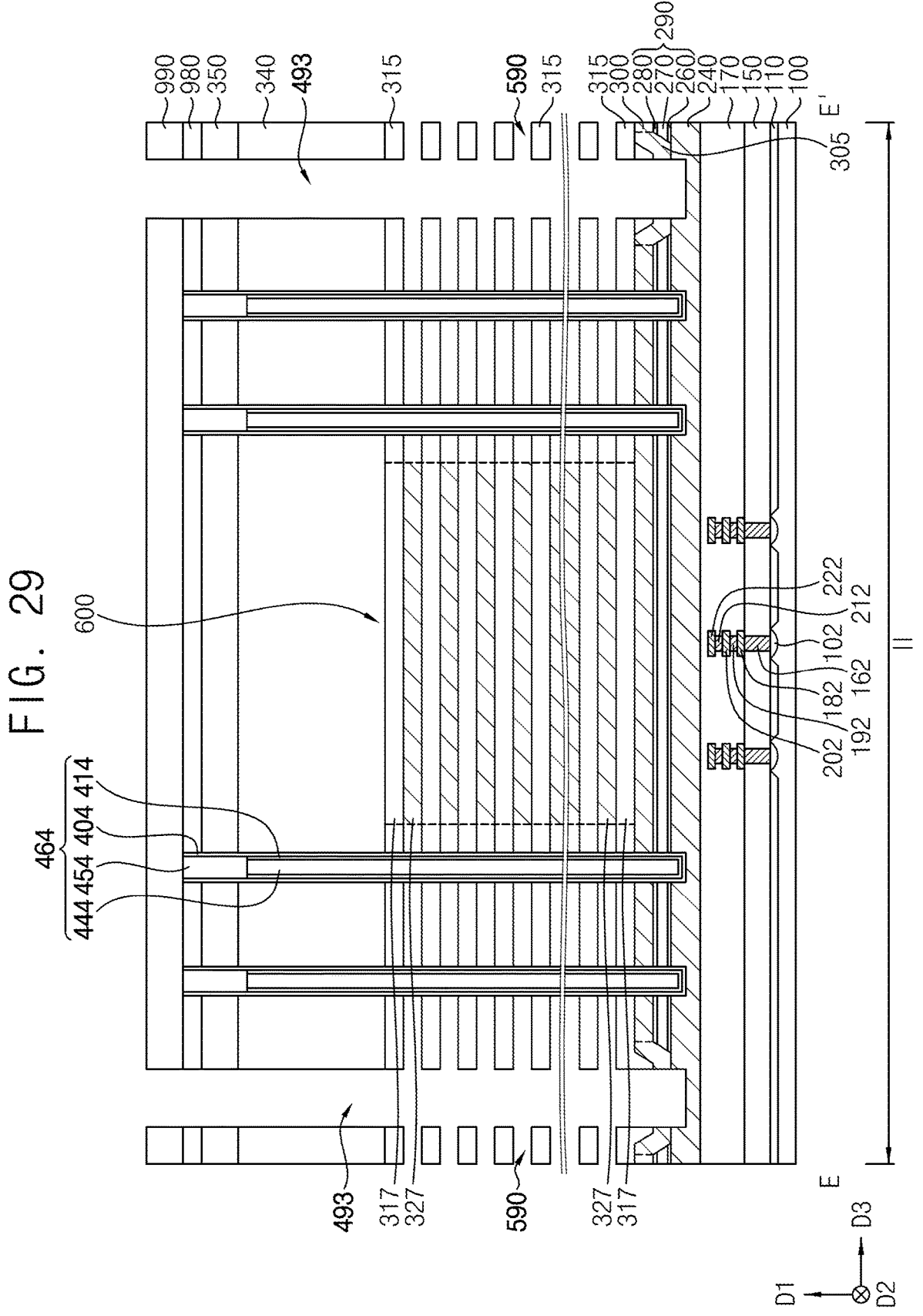
Figure 30:
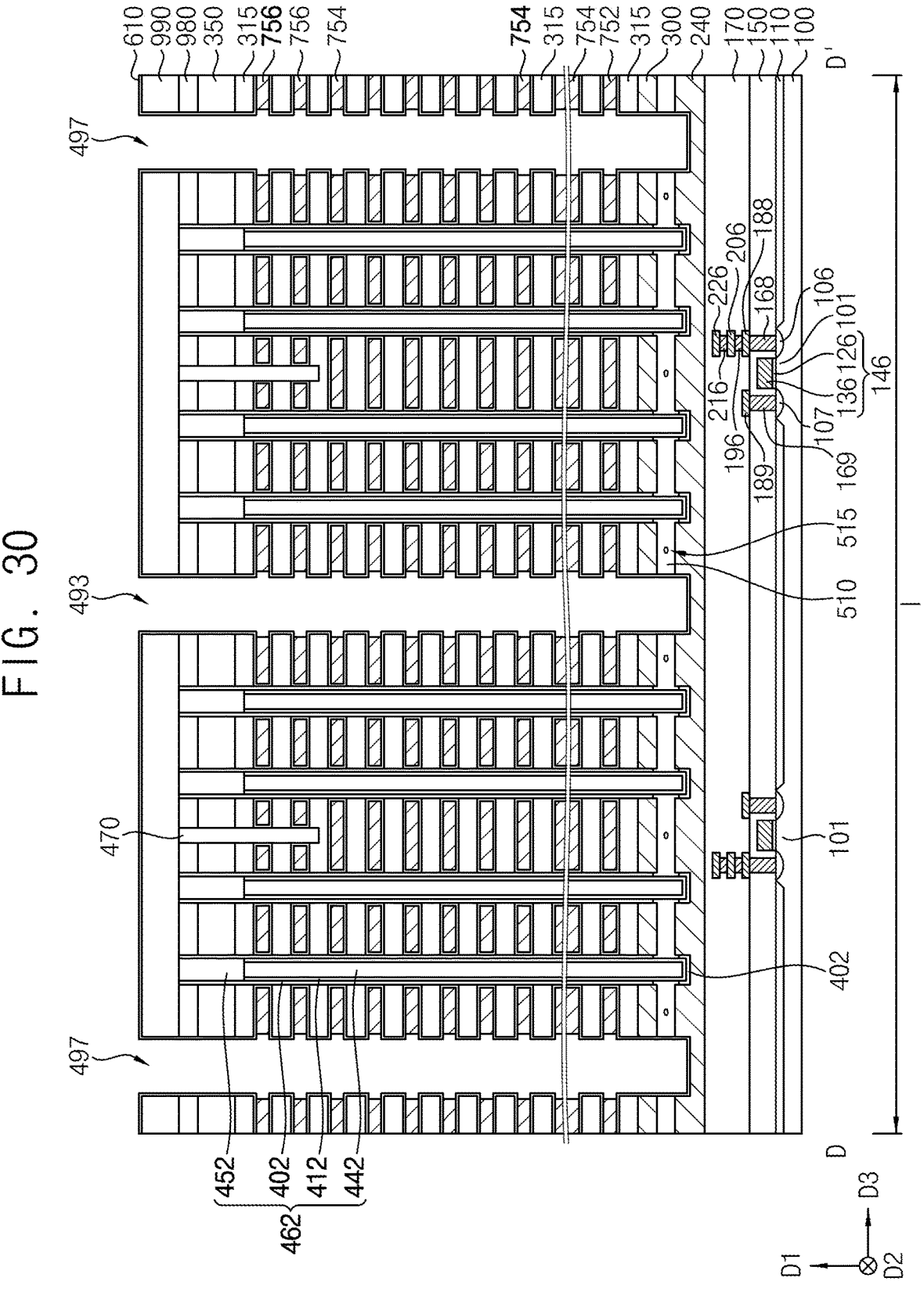
Figure 31:
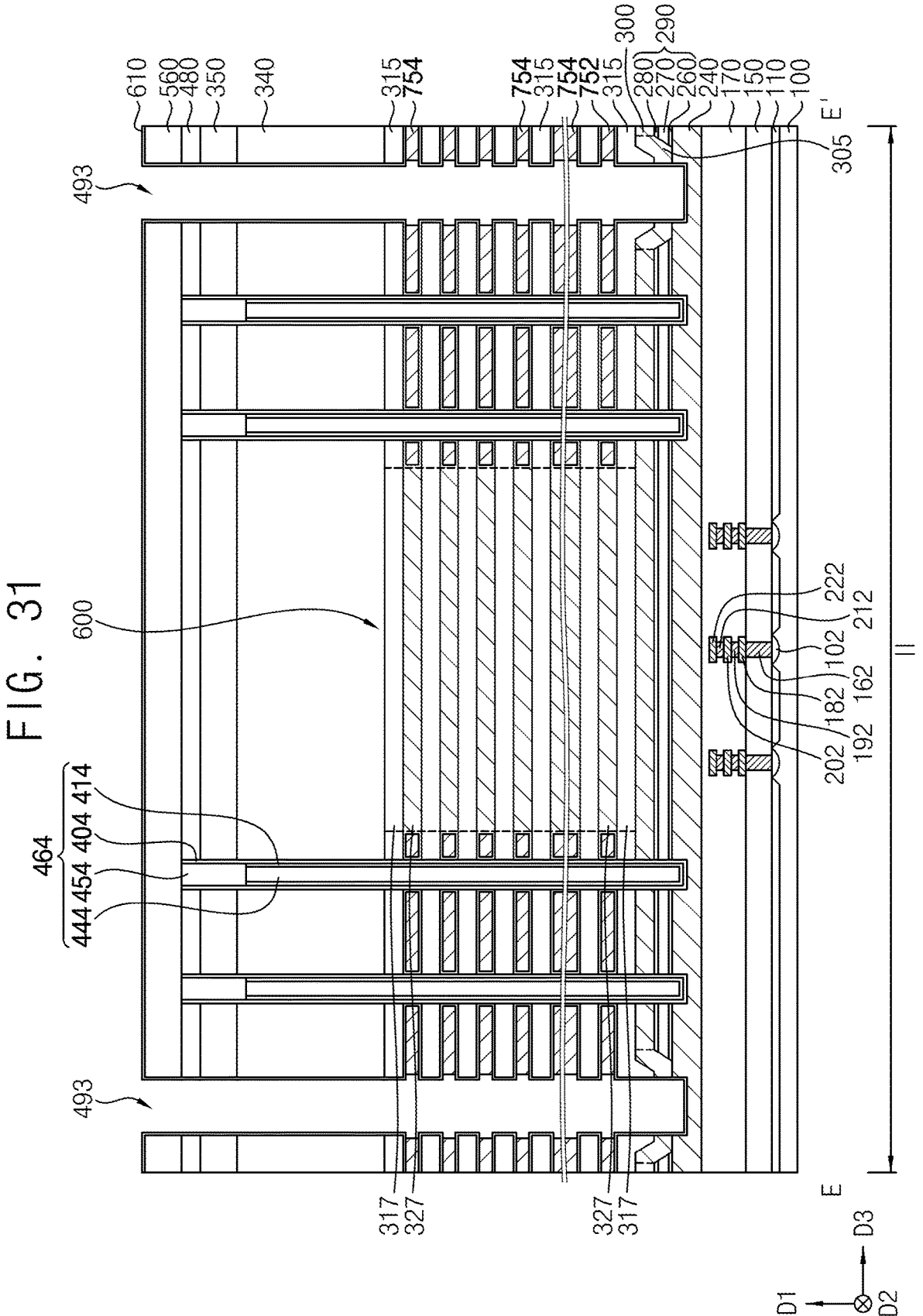
Figure 32:
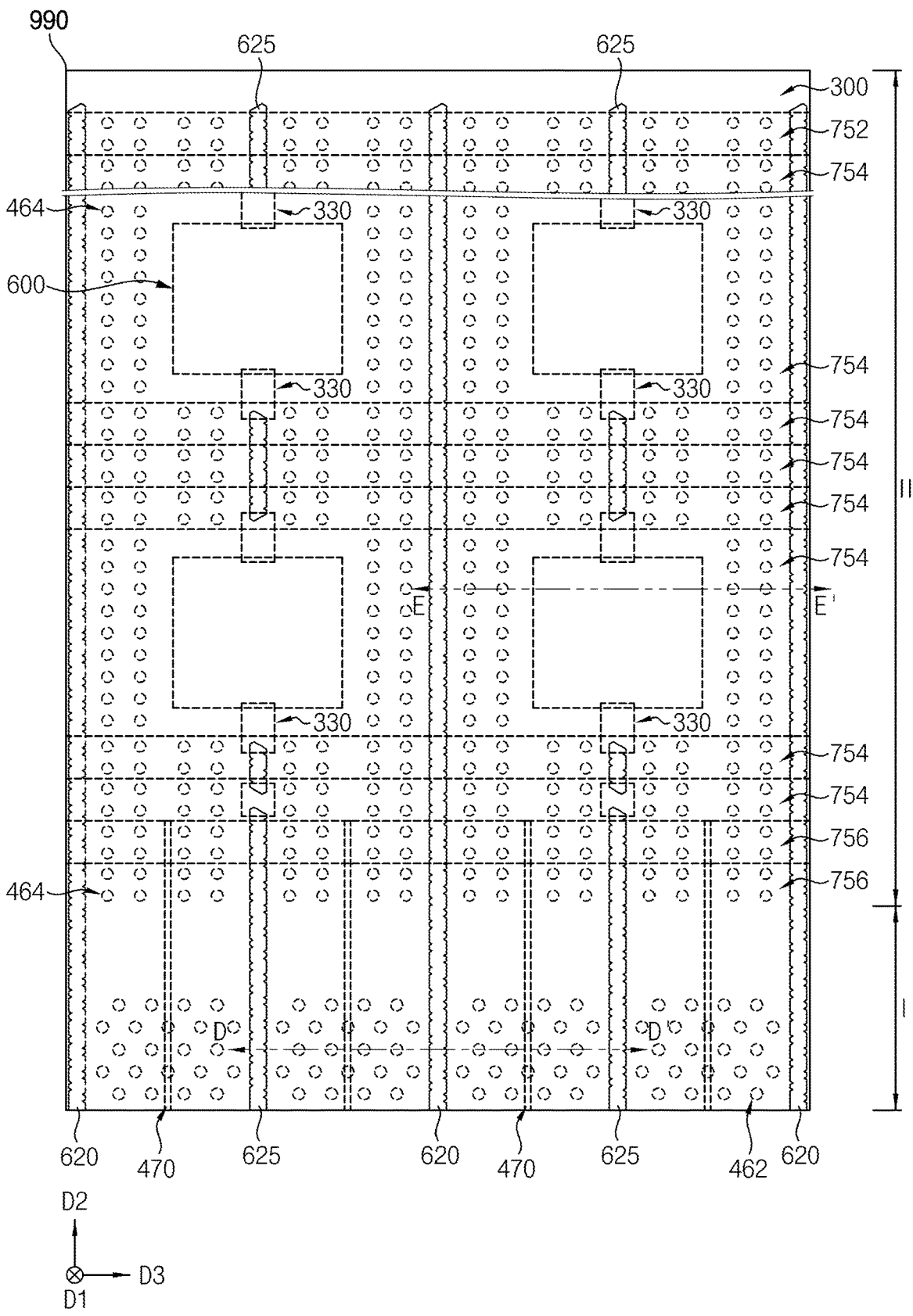
Figure 33:
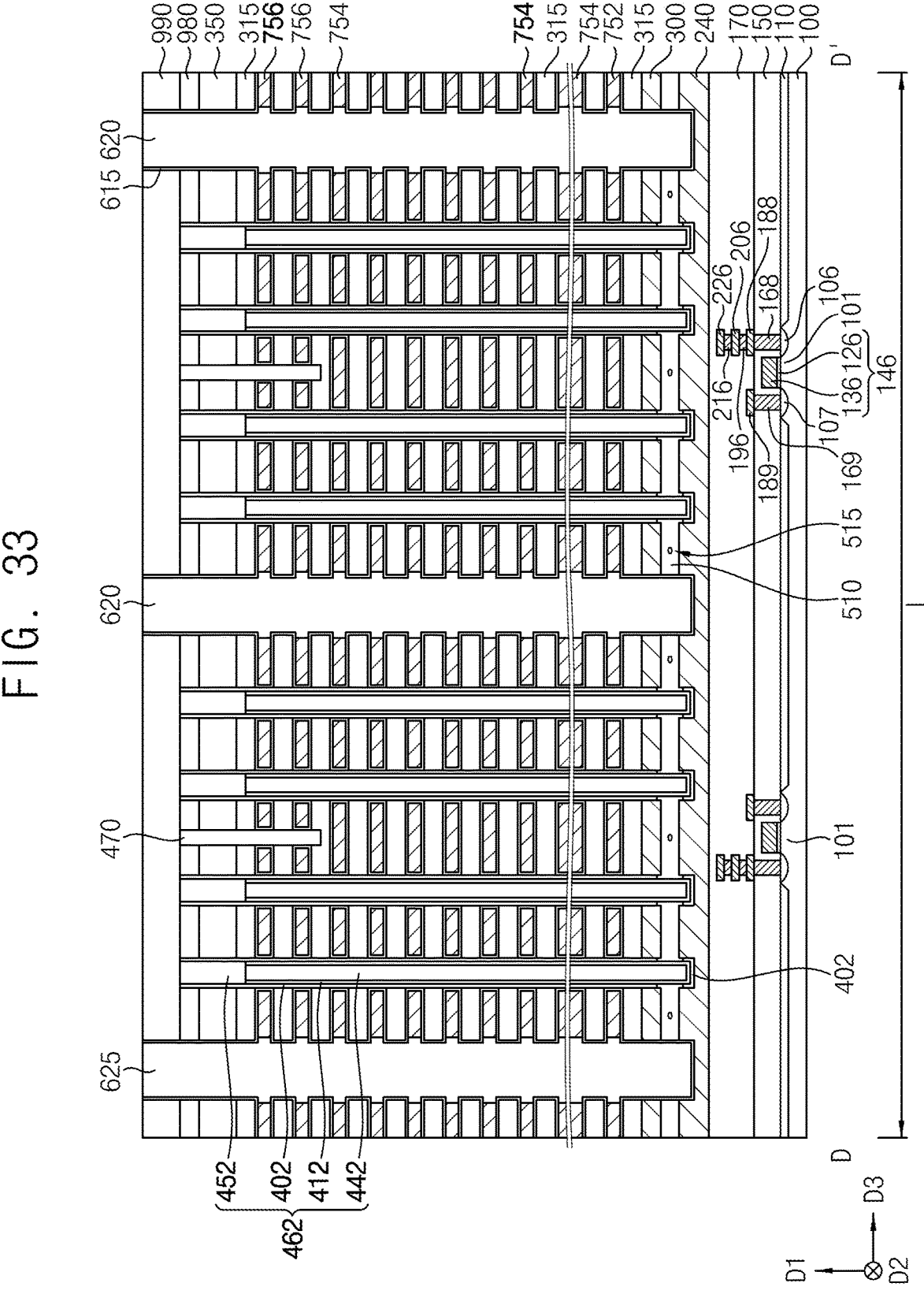
Figure 34:
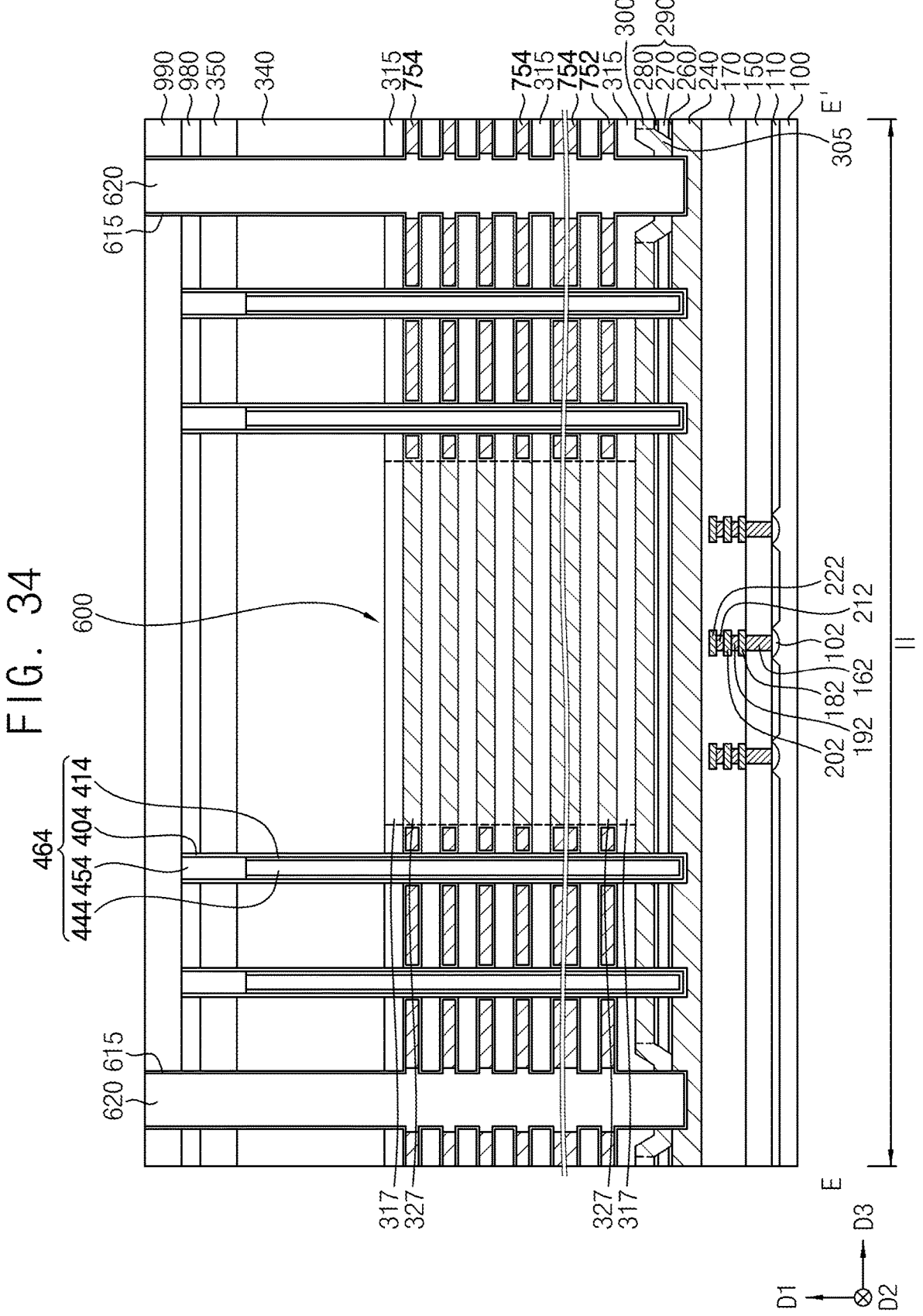

FIGS. 9-11, 13, 36 and 38 are cross-sectional views taken along lines A-A' of corresponding plan views, respectively, each of FIGS. 14, 16-19 and 22 includes cross-sectional views taken along lines B-B' and C-C' of corresponding plan views, respectively, FIGS. 25-28, 30 and 33 are cross-sectional views taken along lines D-D' of corresponding plan views, respectively, and FIGS. 29, 31 and 34 are cross-sectional views taken along lines E-E' of corresponding plan views, respectively. FIGS. 8 to 38 are drawings of region X of FIG. 1, FIG. 19 includes enlarged cross-sectional views of regions Y and Z of FIG. 18, and FIG. 24 is an enlarged plan view of region W of FIG. 23.

Figure 8:
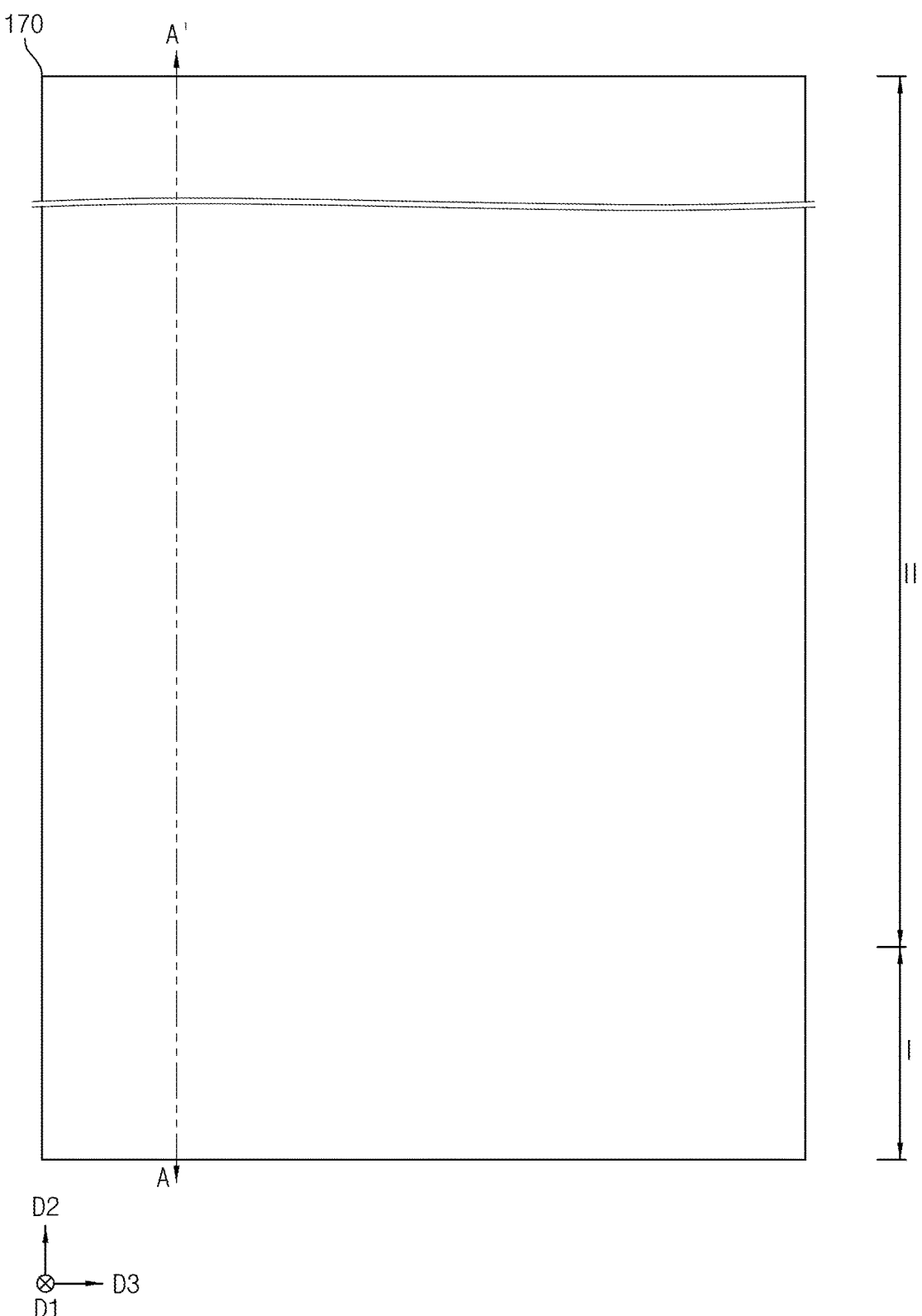
Figure 9:
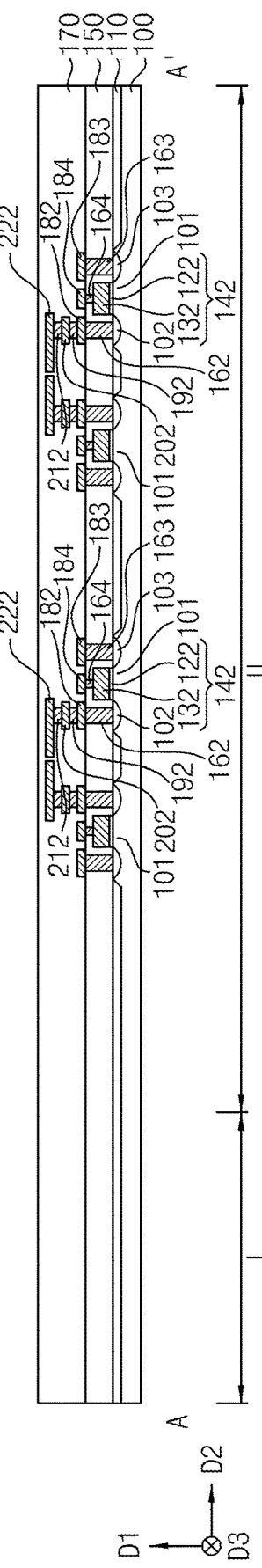

Referring to FIGS. 8 and 9, a lower circuit pattern may be formed on a substrate 100, and first and second insulating interlayers 150 and 170 on and at least partially covering the lower circuit pattern may be sequentially stacked on the substrate 100.

Each element of the lower circuit pattern may be formed by a patterning process or a damascene process.

Referring to FIG. 10, a CSP 240 and a sacrificial structure 290 may be formed on the second insulating interlayer 170, the sacrificial layer structure 290 may be partially removed to form a first opening 302 exposing an upper surface of the CSP 240, and a support layer 300 may be formed on an upper surface of the sacrificial layer structure 290 and the exposed upper surface of the CSP 240.

The sacrificial layer structure 290 may include first, second and third sacrificial layers 260, 270 and 280 sequentially stacked. Each of the first and third sacrificial layers 260 and 280 may include an oxide, e.g., silicon oxide, and the second sacrificial layer 270 may include a nitride, e.g., silicon nitride.

The first opening 302 may have various layouts in a plan view. For example, a plurality of first openings 302 may be spaced apart from each other in the second and third directions D2 and D3 on the first region I of the substrate 100, the first opening 302 may extend in the third direction D3 on a portion of the second region II of the substrate 100 adjacent to the first region I of the substrate 100, and a plurality of first openings 302, each of which may extend in the second direction D2, may be spaced apart from each other in the third direction D3 on the second region II of the substrate 100. FIG. 10 shows the first opening 302 extending in the third direction D3 on the portion of the second region II of the substrate 100 adjacent to the first region I of the substrate 100.

The support layer 300 may include a material having an etching selectivity with respect to the first to third sacrificial layers 260, 270 and 280, e.g., polysilicon doped with n-type impurities. The support layer 300 may have a substantially constant thickness, and thus a first recess may be formed on a portion of the support layer 300 in the first opening 302. Hereinafter, the portion of the support layer 300 in the first opening 302 may be referred to as a support pattern 305.

An insulation layer 310 and a fourth sacrificial layer 320 may be alternately and repeatedly stacked on the support layer 300 and the support pattern 305 in the first direction D1, and a mold layer including the insulation layers 310 and the fourth sacrificial layers 320 may be formed. The insulation layer 310 may include an oxide, e.g., silicon oxide, and the fourth sacrificial layer 320 may include a material having an etching selectivity with respect to the insulation layer 310, e.g., a nitride such as silicon nitride.

However, referring to FIG. 10 together with FIG. 12, a first division pattern 330 extending through a lowermost one of the fourth sacrificial layers 320 may be formed. The first division pattern 330 may be formed on the second region II of the substrate 100. In example embodiments, a plurality of first division patterns 330 may be spaced apart from each other in the second and third directions D2 and D3.

Referring to FIG. 11, a photoresist pattern on and at least partially covering an uppermost one of the insulation layers 310 may be formed, and the uppermost one of the insulation layers 310 and an uppermost one of the fourth sacrificial layers 320 may be etched using the photoresist pattern as an etching mask. Thus, a portion of one of the insulation layers 310 directly under the uppermost one of the fourth sacrificial layers 320 may be exposed.

After performing a trimming process for reducing an area of the photoresist pattern, the uppermost one of the insulation layers 310, the uppermost one of the fourth sacrificial layers 320, the exposed one of the insulation layers 310 and one of the fourth sacrificial layer 320 directly under the exposed one of the insulation layers 310 may be etched by an etching process using the reduced photoresist pattern as an etching mask. The trimming process and the etching process may be repeatedly performed to form a mold having a staircase shape and including a plurality of step layers each of which may include one fourth sacrificial layer 320 and one insulation layer 310 sequentially stacked.

Hereinafter, the "step layer" may refer to all portions of the fourth sacrificial layer 320 and the insulation layer 310 at the same level, which may include an unexposed portion as well as an exposed portion of the fourth sacrificial layer 320 and the insulation layer 310, and a "step" may refer to only the exposed portion of the "step layer." In example embodiments, the steps may be arranged in the second direction D2. Alternatively, the steps may be arranged in the third direction D3.

In example embodiments, lengths in the second direction of the steps included in the mold may be substantially constant except for some of the steps. Lengths in the second direction D2 of some of the steps may be greater than a length in the second direction D2 of other ones of the steps, and hereinafter, ones of the steps having a relatively small length in the second direction D2 may be referred to as first steps, and ones of the steps having a relatively large length in the second direction D2 may be referred to as second steps. FIG. 11 shows two second steps. In plan views hereinafter, the steps are shown by dotted lines.

The mold may be formed on the support layer 300 and the support pattern 305 on the first and second regions I and II of the substrate 100, and an upper surface of an edge portion of the support layer 300 may not be covered by the mold, but may be exposed. The steps included in the mold may be formed on the second region II of the substrate 100.

Figure 13:
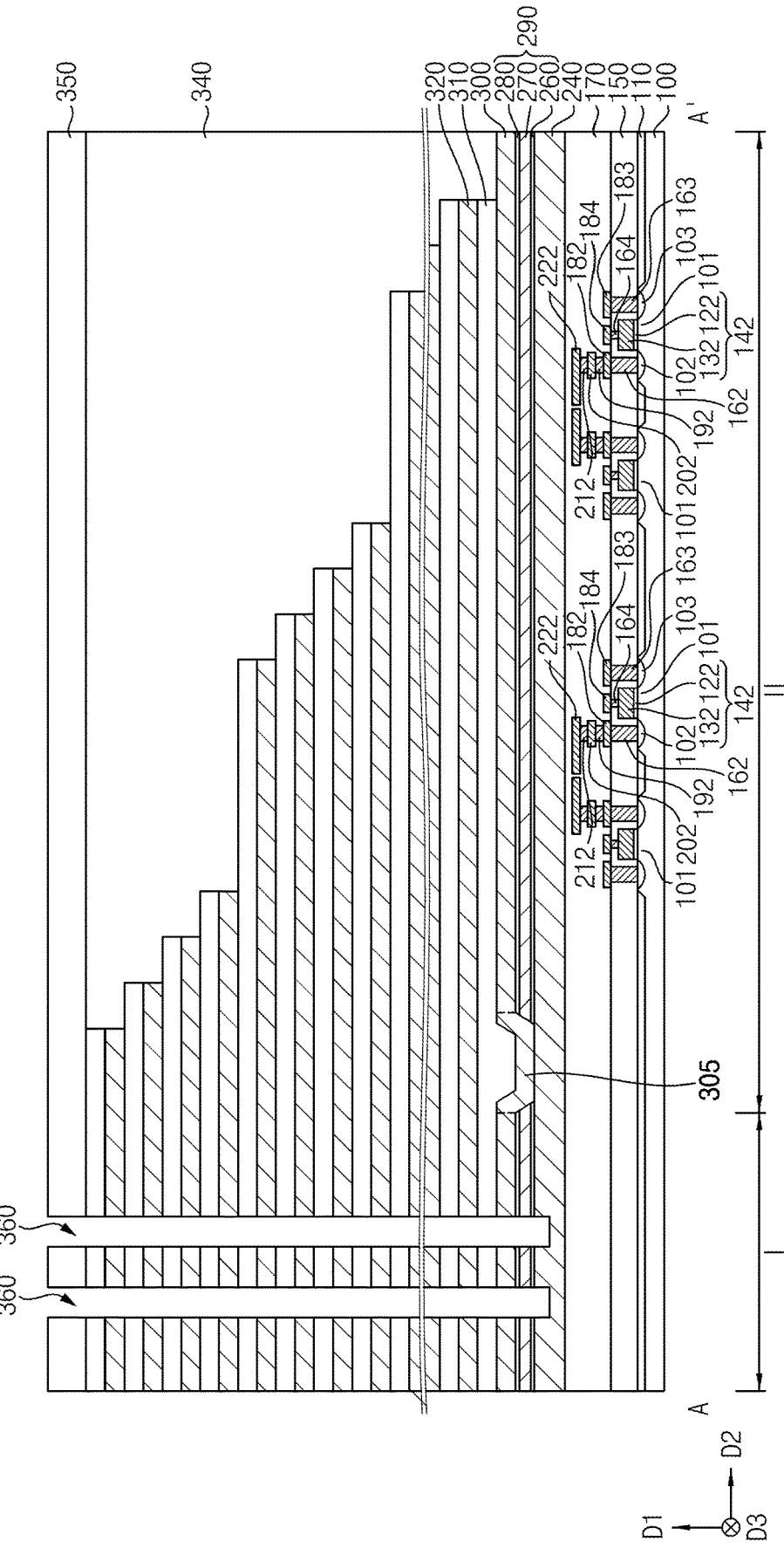
Figure 14:
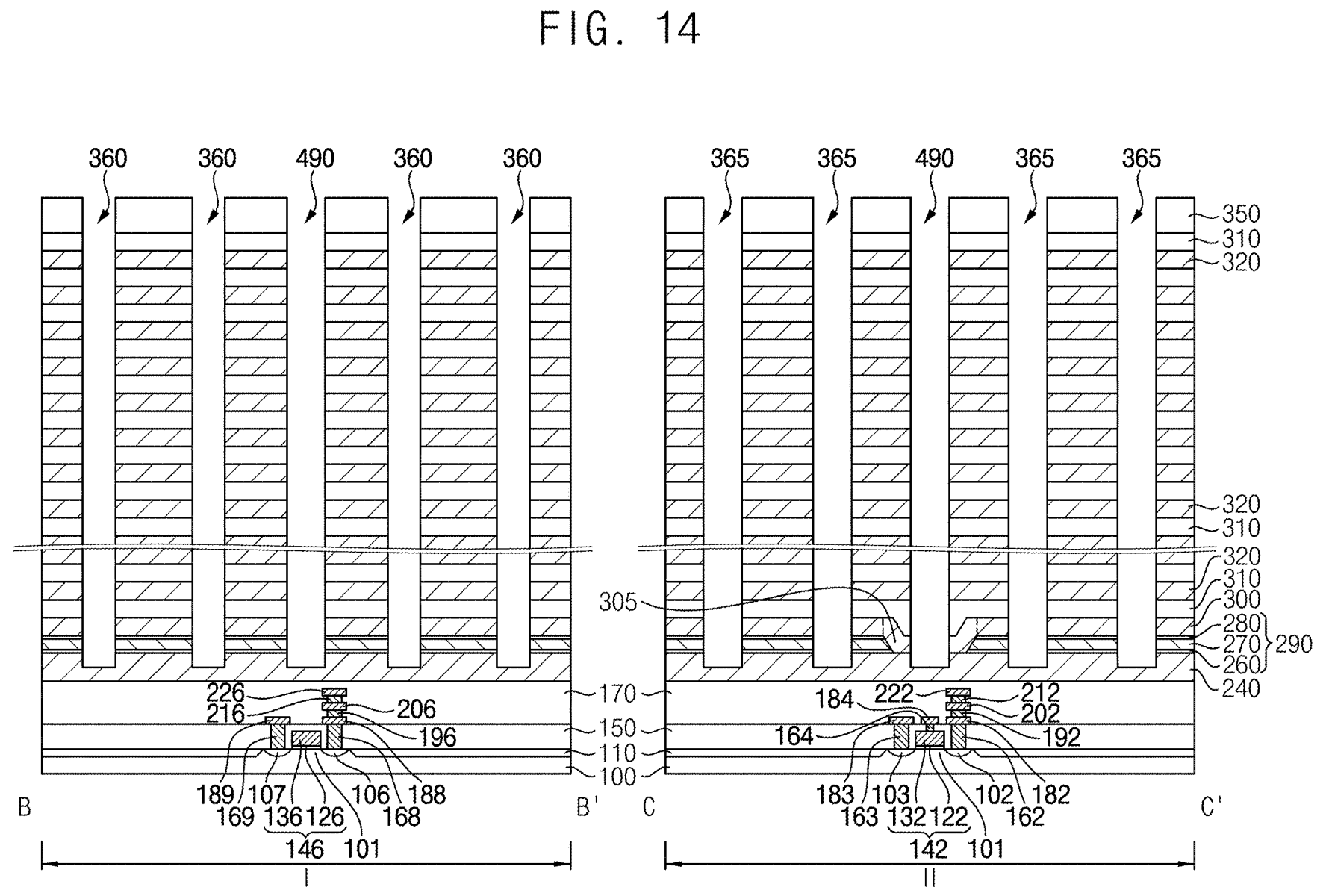

Referring to FIGS. 12 to 14, a third insulating interlayer 340 may be formed on the CSP 240 to be on and at least partially cover the mold and the exposed upper surface of the support layer 300, and may be planarized until an upper surface of the uppermost one of the insulation layers 310 is exposed. Thus, a sidewall of the mold may be at least partially covered by the third insulating interlayer 340. A fourth insulating interlayer 350 may be formed on the mold and the third insulating interlayer 340.

An etching process may be performed to form a first hole 360 through the fourth insulating interlayer 350, the mold, the support layer 300 and the sacrificial layer structure 290, which may extend in the first direction D1 and expose an upper surface of the CSP 240 on the first region I of the substrate 100. Additionally, a second hole 365 may be formed through the third and fourth insulating interlayers 340 and 350, a portion of the mold, the support layer 300 and the sacrificial layer structure 290 by an etching process, which may extend in the first direction D1 and expose the upper surface of the CSP 240 on the second region II of the substrate 100. In example embodiments, a plurality of first holes 360 may be spaced apart from each other in the second and third directions D2 and D3 on the first region I of the substrate 100, and a plurality of second holes 365 may be spaced apart from each other in the second and third directions D2 and D3 on the second region II of the substrate 100.

Furthermore, third and fourth holes 490 and 495 may be formed through the third and fourth insulating interlayers 340 and 350, the mold, the support layer 300 and the sacrificial layer structure 290 by an etching process, which may extend in the first direction D1 and expose the upper surface of the CSP 240 on the first and second regions I and II of the substrate 100.

The first to fourth holes 360, 365, 490 and 495 may be formed simultaneously or together by one etching process, or sequentially formed by independent etching processes. In example embodiments, the etching process may be performed until the first to fourth holes 360, 365, 490 and 495 expose the upper surface of the CSP 240, and further, the first to fourth holes 360, 365, 490 and 495 may extend through an upper portion of the CSP 240.

In example embodiments, each of the first and second holes 360 and 365 may have a shape of a circle, an ellipse, or a rectangle with chamfered or rounded vertices in a plan view, and each of the third and fourth holes 490 and 495 may have a shape of a triangle or a triangle with chamfered or rounded vertices in a plan view. For example, ones of the third holes 490 each of which has a vertex toward one direction of the third direction D3 and ones of the third holes 490 each of which has a vertex toward the other one of the third direction D3, that is, a reverse direction to the one direction of the third direction D3 may be alternately and repeatedly disposed in the second direction D2. Likewise, ones of the fourth holes 495 each of which has a vertex toward one direction of the third direction D3 and ones of the fourth holes 495 each of which has a vertex toward the other one of the third direction D3, that is, a reverse direction to the one direction of the third direction D3 may be alternately and repeatedly disposed in the second direction D2.

FIG. 12 shows that each of the first and second holes 360 and 365 has a shape of a circle in a plan view, and each of the third and fourth holes 490 and 495 has a shape of a triangle with chamfered vertices in a plan view.

In example embodiments, a plurality of third holes 490 may be spaced apart from each other in the second direction D2 by a first distance S1 (refer to FIG. 24) on the first and second regions I and II of the substrate 100, and may be disposed to each of opposite end portions in the second direction D2 of the mold having the staircase shape. Additionally, a plurality of third holes 490 may be spaced apart from each other in the third direction D3.

In example embodiments, a plurality of fourth holes 495 may be spaced apart from each other in the second direction D2 between neighboring ones of the third holes 490 in the third direction D3. However, unlike the third holes 490 disposed in the second direction D2 to the end portions of the mold by the first distance S1 on the first and second regions I and II of the substrate 100, a plurality of fourth holes 495 may be disposed in the second direction D2 by the first distance S1 on the first region I of the substrate 100, while a distance between fourth hole groups, each of which may include a plurality of fourth holes 495 spaced apart from each other in the second direction D2 by the first distance S1, may be greater than the first distance S1 on the second region II of the substrate 100.

In example embodiments, ones of the fourth holes 495 may extend through a portion of the first division pattern 330.

Figure 15:
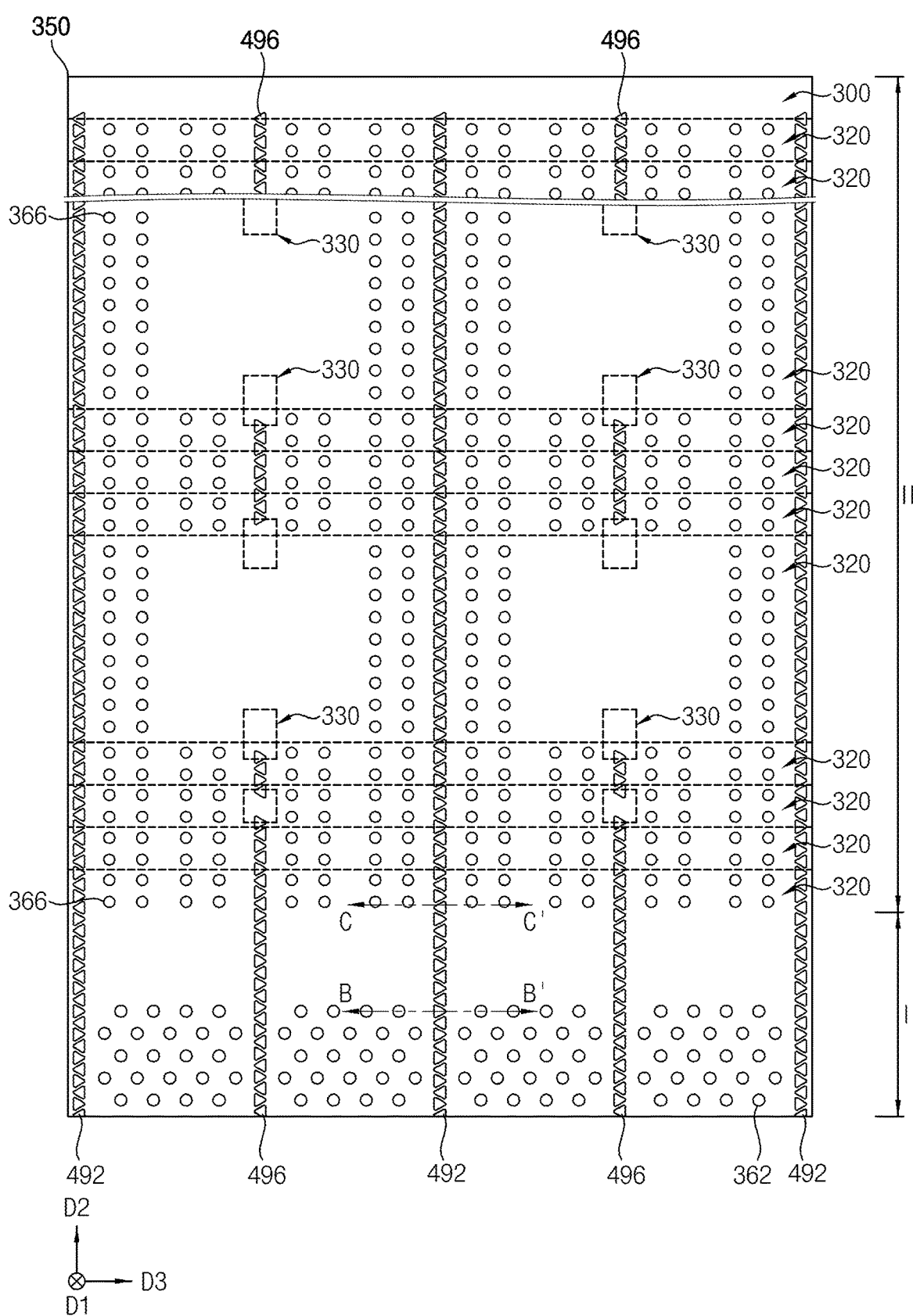
Figure 16:
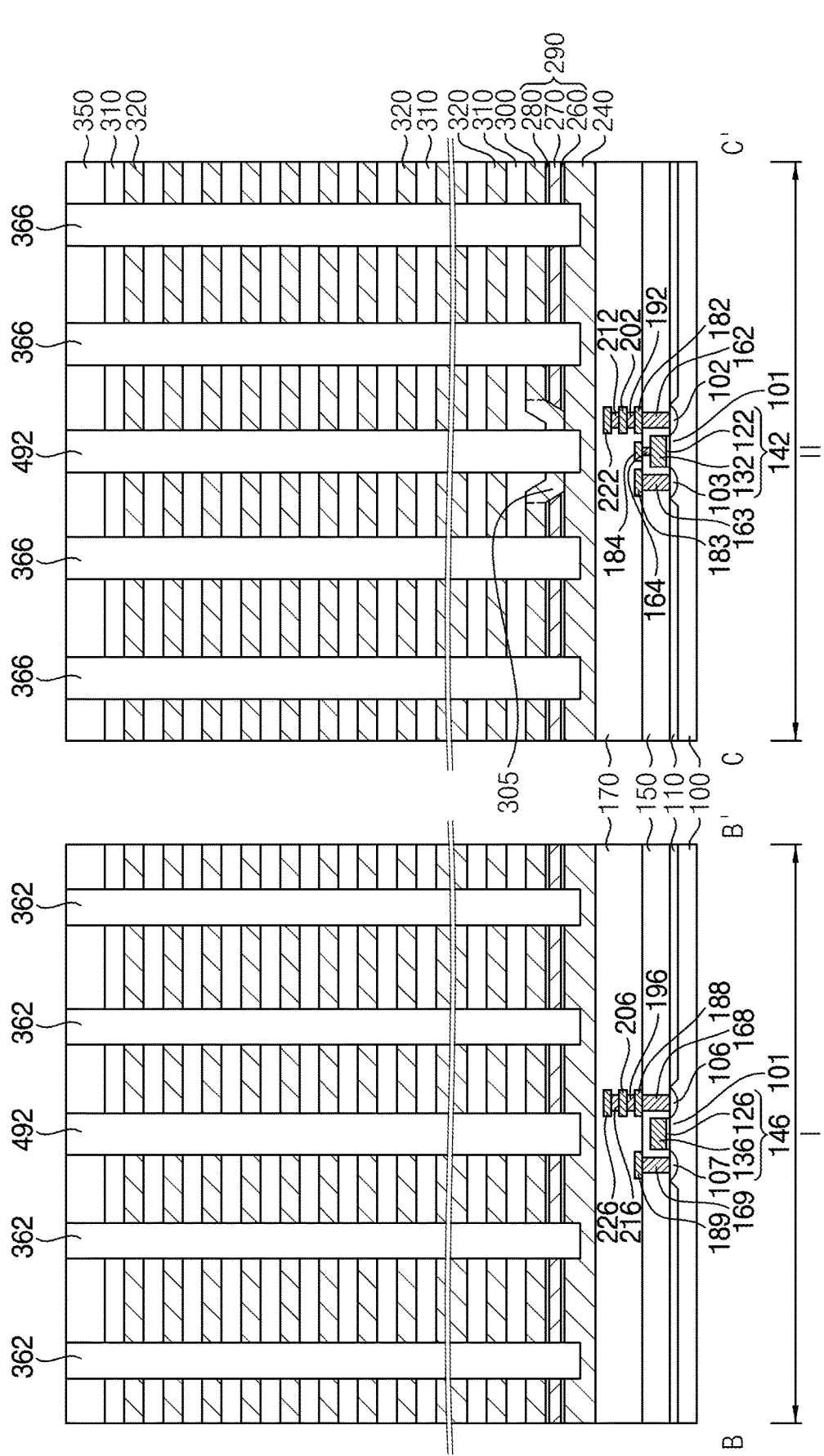

Referring to FIGS. 15 and 16, fifth to eighth sacrificial patterns 362, 366, 492 and 496 may be formed in the first to fourth holes 360, 365, 490 and 495, respectively.

The fifth to eighth sacrificial patterns 362, 366, 492 and 496 may be formed by forming a fifth sacrificial layer on the CSP 240 and the fourth insulating interlayer 350 to at least partially fill the first to fourth holes 360, 365, 490 and 495, and planarizing the fifth sacrificial layer until an upper surface of the fourth insulating interlayer 350 is exposed.

The fifth sacrificial layer may include, e.g., polysilicon.

Referring to FIG. 17, a fifth insulating interlayer 980 may be formed on the fourth insulating interlayer 350 and the fifth to eighth sacrificial patterns 362, 366, 492 and 496, the fifth insulating interlayer 980 may be patterned to expose fifth and sixth sacrificial patterns 362 and 366, respectively, and the exposed fifth and sixth sacrificial patterns 362 and

366 may be removed to form the first and second holes 360 and 365 exposing the upper surface of the CSP 240.

Referring to FIGS. 18 and 19, a charge storage structure layer and a channel layer may be formed on sidewalls of the first and second holes 360 and 365, the exposed upper surface of the CSP 240 and an upper surface of the fifth insulating interlayer 980, and a filling layer may be formed on the channel layer to at least partially fill a remaining portion of each of the first and second holes 360 and 365.

The charge storage structure layer may include a first blocking layer, a charge storage layer and a tunnel insulation layer sequentially stacked.

The filling layer, the channel layer and the charge storage structure layer may be planarized until the upper surface of the fifth insulating interlayer 980 is exposed. Thus, a charge storage structure 402, a channel 412 and a first filling pattern 442 may be formed in the first hole 360, and a dummy charge storage structure 404, a dummy channel 414 and a second filling pattern 444 may be formed in the second hole 365. The charge storage structure 402 may include a first blocking pattern 372, a charge storage pattern 382 and a tunnel insulation pattern 392 sequentially stacked, and the dummy charge storage structure 404 may include a dummy blocking pattern 374, a dummy charge storage pattern 384 and a dummy tunnel insulation pattern 394 sequentially stacked.

Upper portions of the first filling pattern 442 and the channel 412 may be removed to form a second recess, upper portions of the second filling pattern 444 and the dummy channel 414 may be removed to form a third recess, and first and second capping patterns 452 and 454 may be formed to at least partially fill the second and third recesses, respectively.

The charge storage structure 402, the channel 412, the first filling pattern 442 and the first capping pattern 452 in the first hole 360 may form a memory channel structure 462, and the dummy charge storage structure 404, the dummy channel 414, the second filling pattern 444 and the second capping pattern 454 may form a dummy memory channel structure 464. The dummy memory channel structure 464 may prevent the mold from collapsing or reduce the likelihood of a collapse, and thus may also be referred to as a support structure 464.

In example embodiments, each of the memory channel structure 462 and the support structure 464 may have a pillar shape extending in the first direction D1. In example embodiments, a plurality of memory channel structures 462 may be spaced apart from each other in the second and third directions D2 and D3 on the first region I of the substrate 100, and a plurality of support structures 464 may be spaced apart from each other in the second and third directions D2 and D3 on the second region II of the substrate 100.

Figure 20:
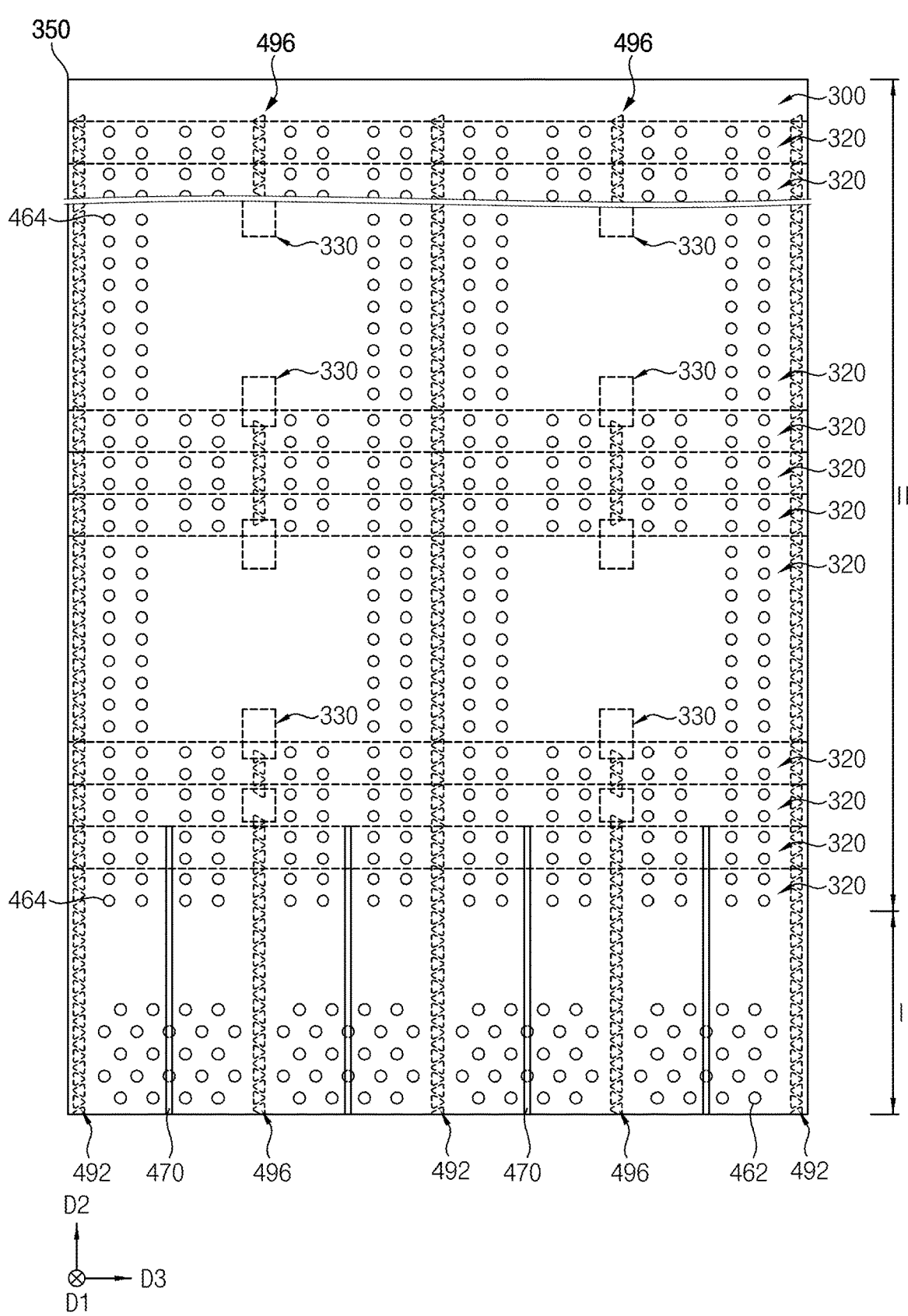

Referring to FIG. 20, the fifth insulating interlayer 980, ones of the insulation layers 310 and ones of the fourth sacrificial layers 320 may be etched to form a second opening extending in the second direction D2 through the fifth insulating interlayer 980, the ones of the insulation layers 310 and the ones of the fourth sacrificial layers 320, and a second division pattern 470 may be formed in the second opening.

In example embodiments, the second division pattern 470 may extend through an upper portion of some ones of the memory channel structures 462. Additionally, the second division pattern 470 may extend through the fourth and fifth insulating interlayers 350 and 980, ones of the fourth sacrificial layers 320 at upper two levels, and ones of the insulation layers 310 at upper two levels, and may further partially extend through one of the insulation layers 310 directly under the ones of the insulation layers 310 at the upper two levels. The second division pattern 470 may extend in the second direction D2 on the first and second regions I and II of the substrate 100, and may extend through upper two steps included in the mold. Thus, ones of the fourth sacrificial layers 320 at the upper two levels may be divided in the third direction D3 by the second division pattern 470.

Figure 21:
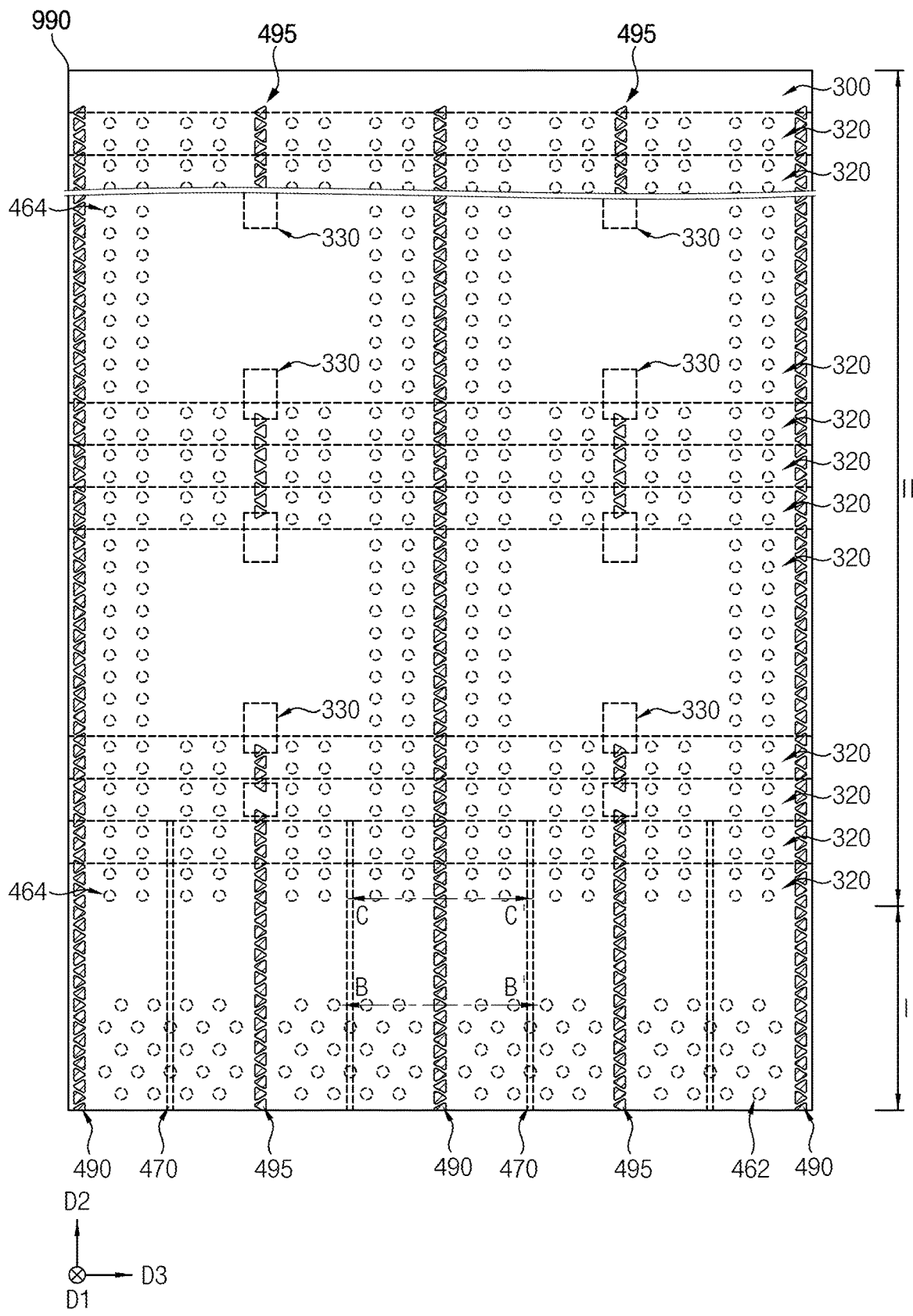
Figure 22:
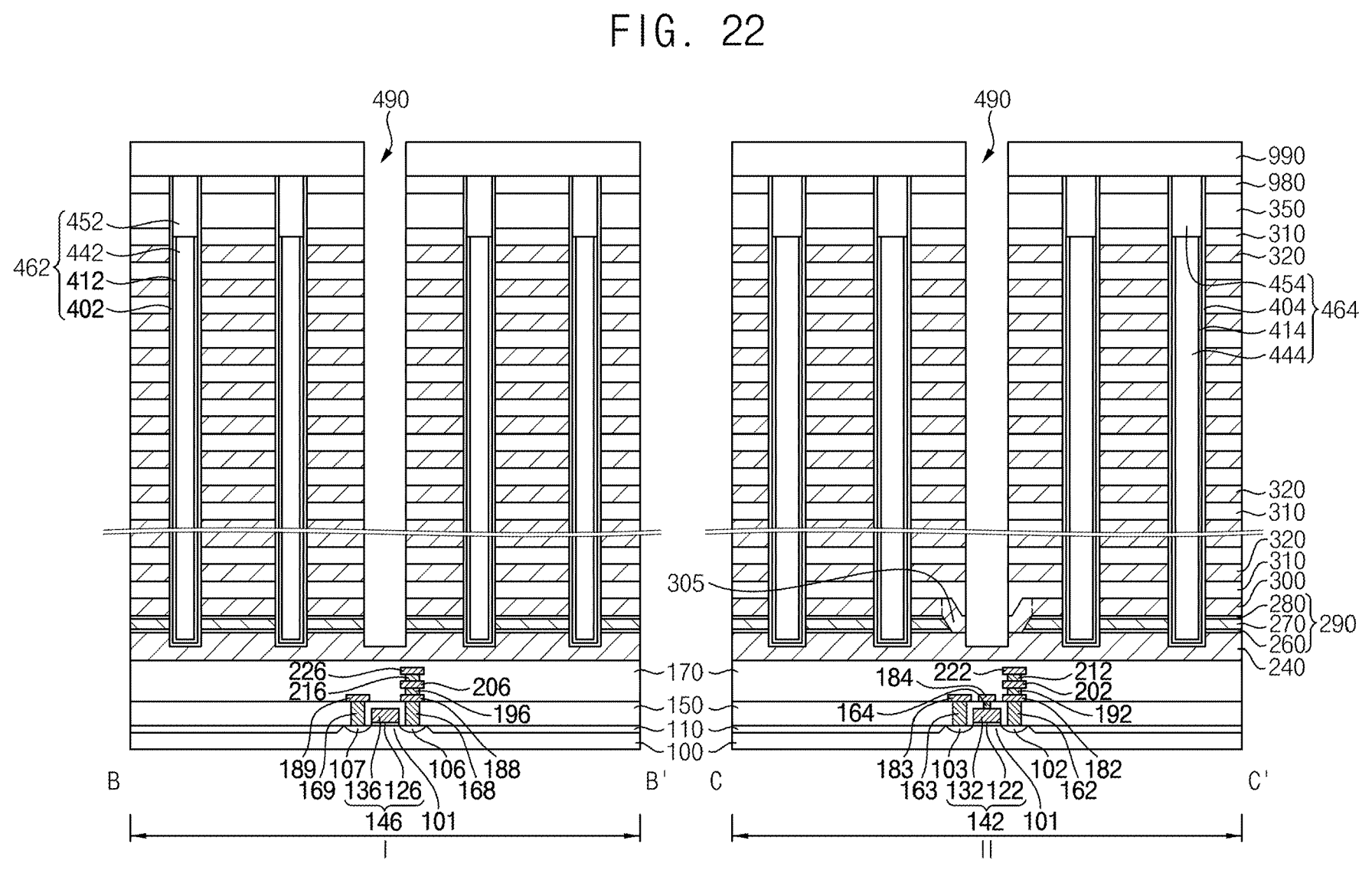

Referring to FIGS. 21 and 22, a sixth insulating interlayer 990 may be formed on the fifth insulating interlayer 980, the memory channel structure 462 and the second division pattern 470, the sixth insulating interlayer 990 may be patterned to expose the seventh and eighth sacrificial patterns 492 and 496, and the exposed seventh and eighth sacrificial patterns 492 and 496 may be removed to form the third and fourth holes 490 and 495 exposing the upper surface of the CSP 240.

Figure 23:
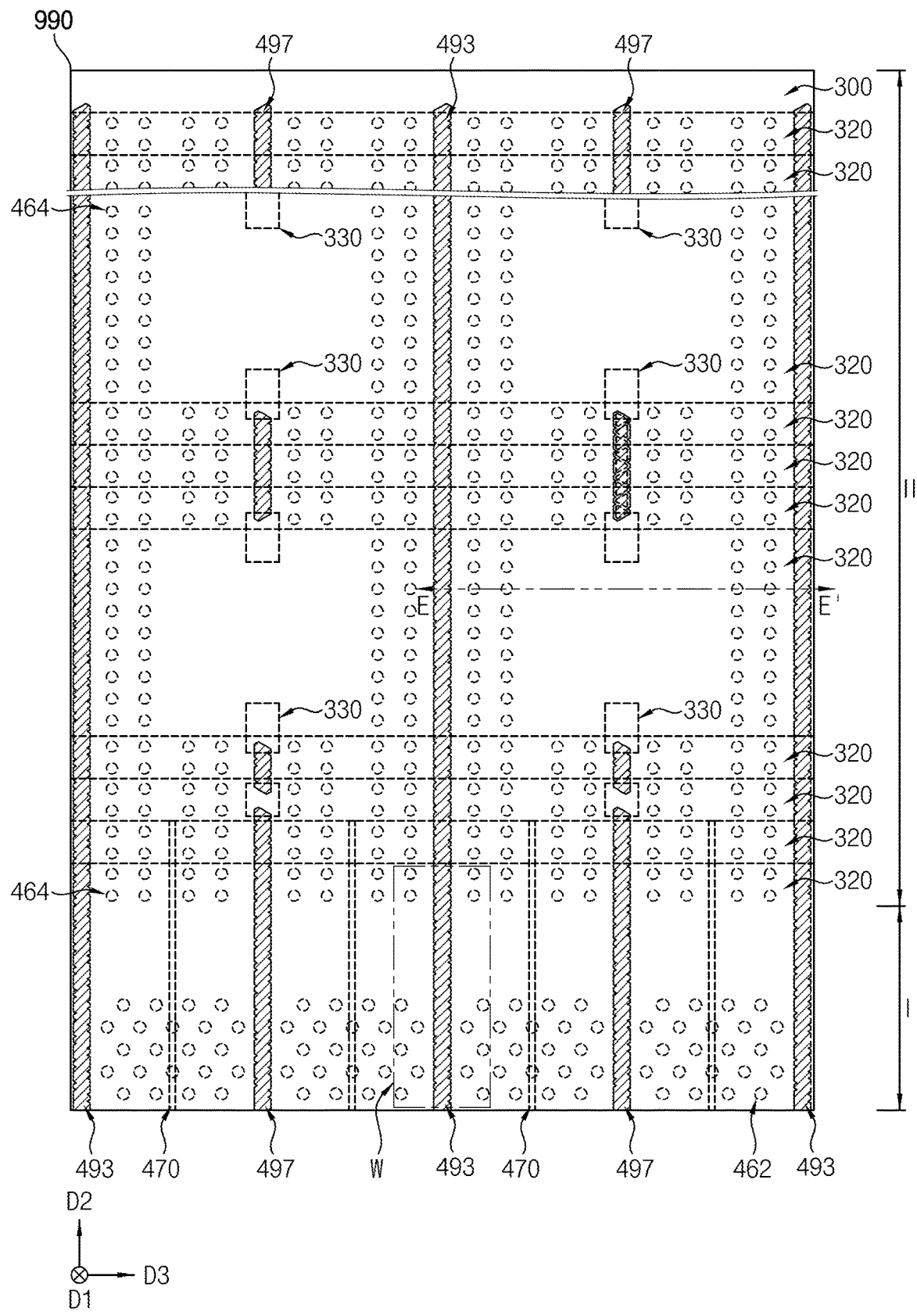
Figure 24:
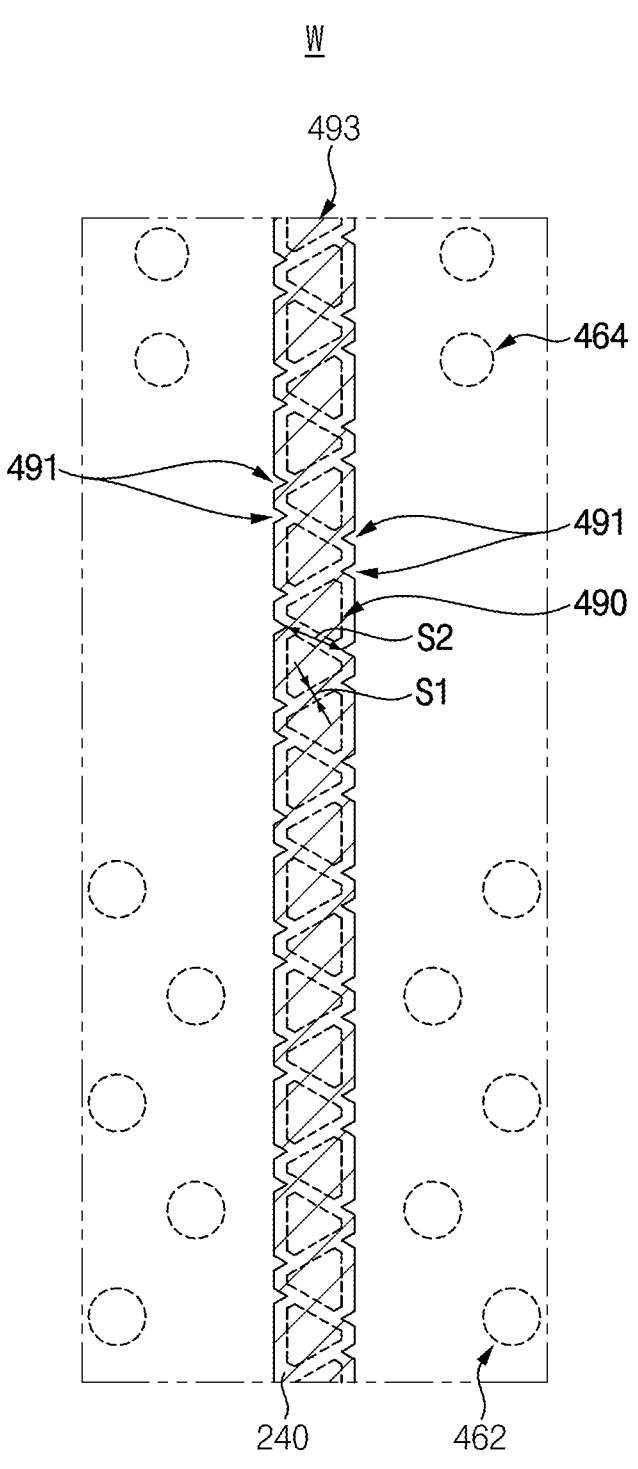

Referring to FIGS. 23 and 24, in example embodiments, a wet etching process may be performed to enlarge widths of the third and fourth holes 490 and 495, and thus neighboring ones of the third holes 490 in the second direction D2 may be connected with each other to form a third opening 493 and neighboring ones of the fourth holes 495 in the second direction D2 may be connected with each other to form a fourth opening 497.

In example embodiments, the third opening 493 may extend in the second direction D2 to each of opposite end portions in the second direction D2 of the mold having the staircase shape on the first and second regions I and II of the substrate 100, and a plurality of third openings 493 may be spaced apart from each other in the third direction D3. Thus, the mold may be divided into a plurality of parts spaced apart from each other in the third direction D3 by each of the third openings 493. As the third opening 493 is formed, the insulation layers 310 and the fourth sacrificial layers 320 included in the mold may be divided into first insulation patterns 315 and fourth sacrificial patterns 325, respectively, each of which may extend in the second direction D2.

In example embodiments, the fourth opening 497 may continuously extend in the second direction D2 on the first region I of the substrate 100, while a plurality of fourth openings 497, each of which may be formed by connecting fourth holes 495 included in each fourth hole group, may be spaced apart from each other in the second direction D2. The fourth openings 497 spaced apart from each other in the second direction D2 may be formed between neighboring ones of the third openings 493 in the third direction D3.

However, unlike the third opening 493, a plurality of fourth openings 497 may be spaced apart from each other in the second direction D2, and thus the mold may not be entirely divided by the fourth opening 497. In example embodiments, a portion of the mold between neighboring ones of the fourth openings 497 in the second direction D2 may at least partially overlap the first division pattern 330 in the first direction D1.

Each of the fourth openings 497 may continuously extend in the second direction D2 on the first region I of the substrate 100, and may continuously extend to each of opposite end portions of ones of the step layers at upper two levels of the mold on the second region II of the substrate 100. Thus, ones of the fourth sacrificial patterns 325 at the upper two levels of the mold may be divided in the third direction D3 by the fourth opening 497 and the second division patterns 470 at opposite sides in the third direction D3 of the fourth opening 497.

Even though the mold is divided into a plurality of parts, each of which may extend in the second direction D2, spaced apart from each other in the third direction D3 by the wet etching process for forming the third and fourth openings 493 and 497, the mold may not collapse due to the support structures 464 and the memory channel structures 462.

In example embodiments, the wet etching process may be performed until the third and fourth openings 493 and 497 expose the upper surface of the CSP 240, and further, the third and fourth openings 493 and 497 may extend through an upper portion of the CSP 240.

In example embodiments, each of the third and fourth openings 493 and 497 may extend to a give length in the second direction D2, and first protrusion portions 491 protruding toward a central portion of each of the third and fourth openings 493 and 497 may be formed on each of opposite sidewalls in the third direction D3 of each of the third and fourth holes 493 and 497. That is, a horizontal width of each of the third and fourth holes 490 and 495 having a shape of a triangle or a triangle with chamfered or rounded vertices in a plan view may be enlarged by a wet etching process, and thus neighboring ones of the third holes 490 may be connected with each other to form the third opening 493 extending in the second direction D2 and neighboring ones of the fourth holes 495 may be connected with each other to form the fourth opening 497 extending in the second direction D2.

In example embodiments, as the wet etching process is performed, the first protrusion portions 491 may be formed on each of opposite sidewalls of the third opening 493 at positions adjacent to the vertices of the third holes 490 arranged in the second direction D2, and the first protrusion portions 491 may be formed on each of opposite sidewalls of the fourth opening 497 at positions adjacent to the vertices of the fourth holes 497 arranged in the second direction D2.

In example embodiments, the first protrusion portions 491 may be spaced apart from each other in the second direction D2 on the sidewall of each of the third and fourth openings 493 and 497. In example embodiments, a plurality of first protrusion portion pairs, each of which may include neighboring two ones of the first protrusion portions 491 in the second direction D2, may be spaced apart from each other in the second direction D2, and a distance between the first protrusion portion pairs may be greater than a distance between the first protrusion portions 491 in each of the first protrusion portion pairs.

In example embodiments, the first protrusion portion pairs on opposite sidewalls of each of the third and fourth openings 493 and 497 may be arranged in a zigzag pattern in the second direction D2. That is, the first protrusion portion pairs spaced apart from each other in the second direction D2 on one sidewall of each of the third and fourth openings 493 and 497 may not overlap in the third direction D3 the first protrusion portion pairs spaced apart from each other in the second direction D2 on another sidewall of a corresponding one of the third and fourth openings 493 and 497.

Thus, one of the first protrusion portions 491 on one sidewall of each of the third and fourth openings 493 and 497 may be spaced apart from another one of the first protrusion portions 491 on another sidewall of the corresponding one of the third and fourth openings 493 and 497 by a second distance S2, which may be greater than a distance between one of the first protrusion portions 491 on one sidewall of each of the third and fourth openings 493 and 497 and another one of the first protrusion portions 491 on another sidewall of the corresponding one of the third and fourth openings 493 and 497 that overlap each other in the third direction D3.

Figure 25:
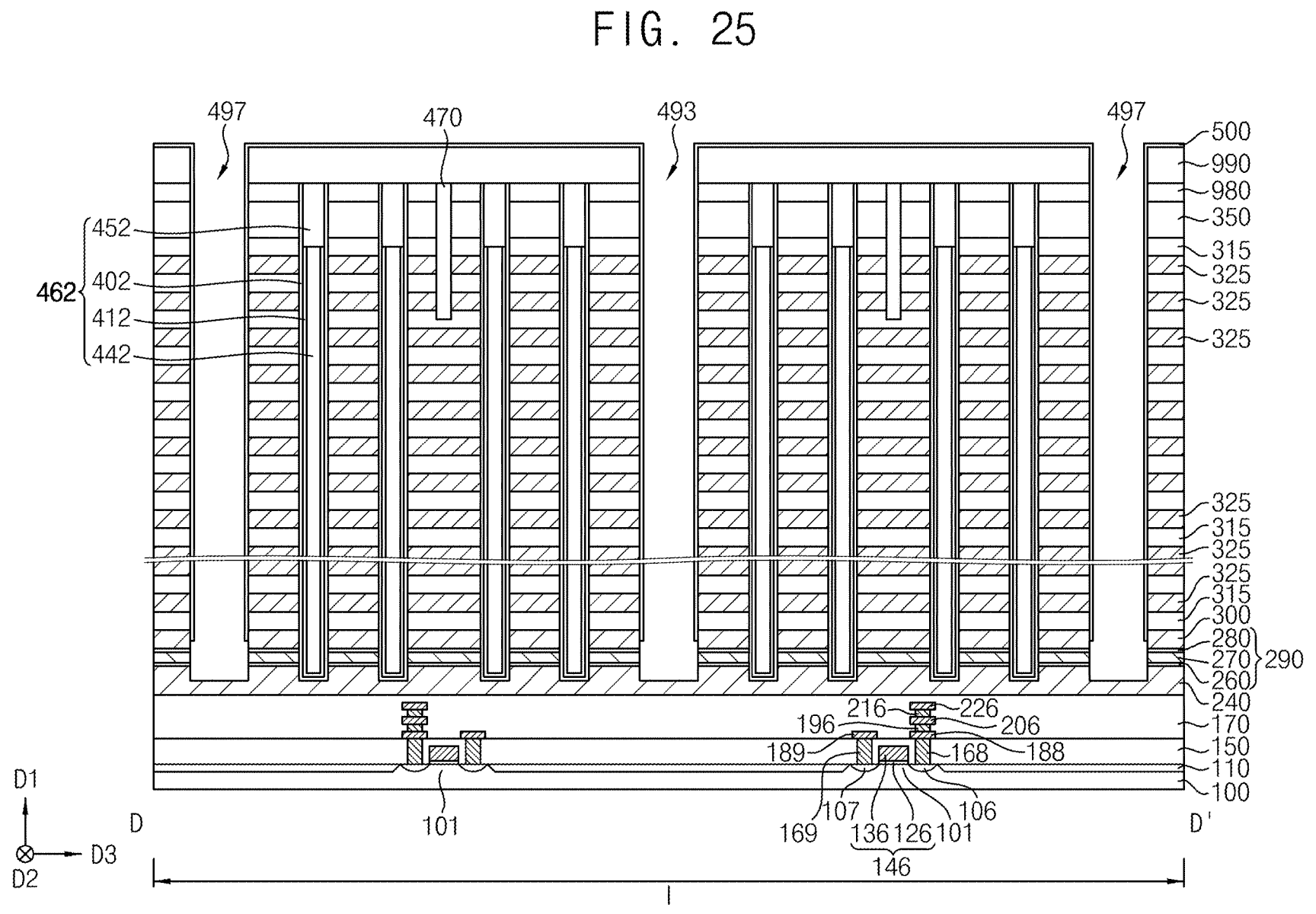

Referring to FIG. 25, a ninth sacrificial pattern may be formed on a lower portion of each of the third and fourth openings 493 and 497, a spacer layer may be formed on an upper surface of the ninth sacrificial pattern, sidewalls of the third and fourth openings 493 and 497 and an upper surface of the sixth insulating interlayer 990, and an anisotropic etching process may be performed on the spacer layer to remove a portion of the spacer layer on the upper surface of the ninth sacrificial pattern so that a spacer 500 may be formed.

In example embodiments, an upper surface of the ninth sacrificial pattern may be higher than an upper surface of the sacrificial layer structure 290 and lower than an upper surface of the support layer 300 in the first direction D1. Thus, the spacer 500 may be on and at least partially cover sidewalls of the first insulation patterns 315 and the fourth sacrificial patterns 325 exposed by each of the third and fourth openings 493 and 497. The spacer 500 may include, e.g., undoped polysilicon.

The ninth sacrificial pattern may be removed.

Figure 26:
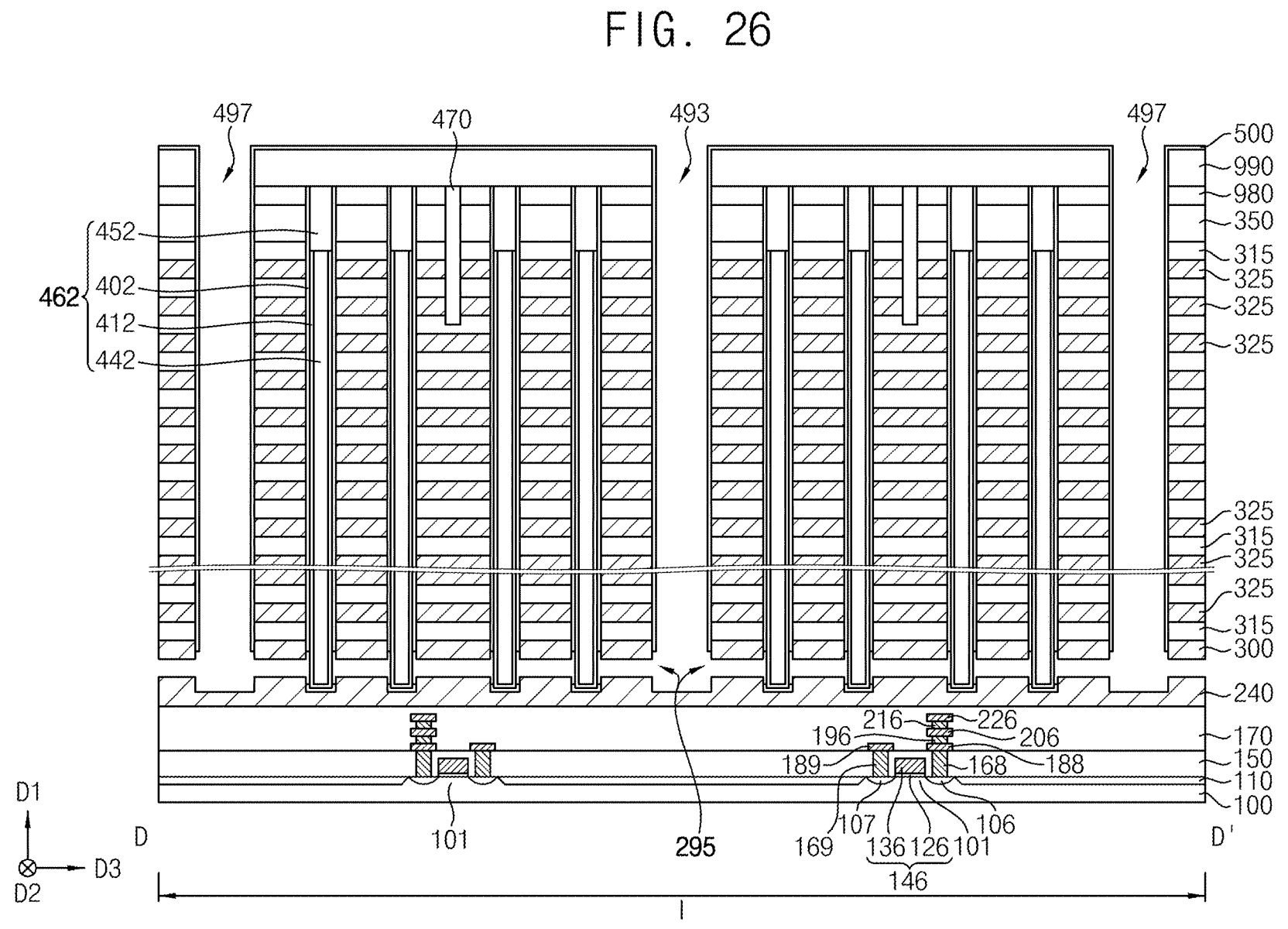

Referring to FIG. 26, the sacrificial layer structure 290 may be removed through the third and fourth openings 493 and 497 by, e.g., a wet etching process to form a first gap 295.

The wet etching process may be performed using, e.g., hydrofluoric acid (HF) and/or phosphoric acid ($H_3PO_4$). In example embodiments, each of the third and fourth openings 493 and 497 may not extend through the support layer 300 and the sacrificial layer structure 290, but may extend through the support pattern 305 on the second region II of the substrate 100. Thus, the sacrificial layer structure 290 may not be removed by the wet etching process on the second region II of the substrate 100.

As the first gap 295 is formed, a lower surface of the support layer 300 and the upper surface of the CSP 240 may be exposed. Additionally, a sidewall of a portion of charge storage structure 402 on the first region I of the substrate 100 may be removed by the first gap 295, and the portion of the charge storage structure 402 may also be removed to expose an outer sidewall of the channel 412. Thus, the charge storage structure 402 may be divided into an upper portion extending through the mold and at least partially covering an outer sidewall of a most portion of the channel 412 and a lower portion at least partially covering a lower surface of the channel 412 on the CSP 240.

Referring to FIG. 27, the spacer 500 may be removed, and a channel connection layer may be formed on the sidewalls of the third and fourth openings 493 and 497 and in the first gap 295, and a portion of the channel connection layer in the third and fourth openings 493 and 497 may be removed by, e.g., an etch back process to form a channel connection pattern 510 in the first gap 295.

As the channel connection pattern 510 is formed, the channels 412 between neighboring ones of the third and fourth openings 493 and 497 in the third direction D3 may be connected with each other.

An air gap 515 may be formed in the channel connection pattern 510.

Referring to FIGS. 28 and 29, the fourth sacrificial patterns 325 exposed by the third and fourth openings 493 and 497 may be removed to form a second gap 590 between neighboring ones of the first insulation patterns 315 in the first direction D1, and a portion of an outer sidewall of the charge storage structure 402 included in the memory channel structure 462 and a portion of an outer sidewall of the dummy charge storage structure 404 included in the support structure 464 may be exposed by the second gap 590.

In example embodiments, a wet etching process may be performed using, e.g., phosphoric acid ($H_3PO_4$) or sulfuric acid ($H_2SO_4$) to remove the fourth sacrificial patterns 325.

The wet etching process may be performed through the third and fourth openings 493 and 497, and an entire portion of the fourth sacrificial pattern 325 between the third and fourth openings 493 and 497 may be removed by an etching solution provided from the third and fourth openings 493 and 497 in both directions. However, in an area where the fourth opening 497 is not formed between the third openings 493 on the second region II of the substrate 100, the etching solution may be provided from the third opening 493 in a single direction, and thus a portion of the fourth sacrificial pattern 325 may not be removed but remain, which may be referred to as a third insulation pattern 327. Additionally, a portion of the first insulation pattern 315 overlapping the third insulation pattern 327 in the first direction D1 may be referred to as a second insulation pattern 317. The second and third insulation patterns 317 and 327 alternately and repeatedly stacked in the first direction D1 may form an insulation pattern structure 600.

The insulation pattern structure 600 may extend through a portion of the mold on the second region II of the substrate 100, and may have a shape of, e.g., a rectangle, an ellipse, a circle, etc., in a plan view. In example embodiments, the insulation pattern structure 600 may extend through the second step of the mold having a relatively large length in the second direction D2.

Referring to FIGS. 30 and 31, a second blocking layer 610 may be formed on the outer sidewalls of the charge storage structure 402 and the dummy charge storage structure 404 exposed by the third and fourth openings 493 and 497, inner walls of the second gaps 590, surfaces of the first insulation patterns 315, sidewalls of the fourth to sixth insulating interlayers 350, 980 and 990, and an upper surface of the sixth insulating interlayer 990, and a gate electrode layer may be formed on the second blocking layer 610.

The gate electrode layer may include a gate barrier layer and a gate conductive layer sequentially stacked. The gate barrier layer may include a metal nitride, and the gate conductive layer may include a metal. The second blocking layer 610 may include a metal oxide, e.g., aluminum oxide, hafnium oxide, etc.

The gate electrode layer may be partially removed to form a gate electrode in each of the second gaps 590. In example embodiments, the gate electrode layer may be partially removed by a wet etching process. As a result, the fourth sacrificial pattern 325 in the mold including the step layers of the fourth sacrificial pattern 325 and the first insulation pattern 315 may be replaced with the gate electrode and the second blocking layer 620 on and at least partially covering lower and upper surfaces of the gate electrode.

In example embodiments, the gate electrode may extend in the second direction D2, and a plurality of gate electrodes may be spaced apart from each other in the first direction D1 to form a gate electrode structure. The gate electrode structure may have a staircase shape including the gate electrode as a step layer. An end portion of each of the gate electrodes in the second direction D2 that is not overlapped by ones of the gate electrodes overlying each of the gate electrodes may be referred to as a pad. The gate electrode structure may include first pads having a relatively small length in the second direction D2 and second pads having a relatively large length in the second direction D2, and the numbers of the first and second pads may not be limited.

In example embodiments, a plurality of gate electrode structures may be spaced apart from each other in the third direction D3, which may be separated by the third openings 493 in the third direction D3. As illustrated above, the fourth openings 497 may be spaced apart from each other in the second direction D2, the gate electrode structure may not be entirely divided by the fourth openings 497. However, one of the gate electrodes at a lowermost level in the gate electrode structure may be divided in the third direction D3 by the fourth openings 497, the first division pattern 330 and the insulation pattern structure 600, and ones of the gate electrodes at upper two levels may be divided in the third direction D3 by the fourth opening 497 and the second division pattern 470.

The gate electrode structure may include first, second and third gate electrodes 752, 754 and 756 sequentially stacked in the first direction D1. In example embodiments, the first gate electrode 752 may be formed at a lowermost level in the first direction D1 and serve as a ground selection line (GSL), the third gate electrode 756 may be formed at an uppermost level and a second level from above and serve as a string selection line (SSL), and the second gate electrode 754 may be formed at a plurality of levels between the first and third gate electrodes 752 and 756 and serve as a word line.

In example embodiments, the first to third gate electrodes 752, 754 and 756, the charge storage structures 402 and the channels 412 between neighboring ones of the third openings 493 in the third direction D3 may form a memory block, which may include, e.g., two GSLs, one word line and four SSLs at each level, however, the inventive concept may not be limited thereto.

Referring to FIGS. 32 to 34, a third division layer may be formed on the second blocking layer 610 to at least partially fill the third and fourth openings 493 and 497, and may be planarized until the upper surface of the sixth insulating interlayer is exposed.

Thus, the second blocking layer 610 may be transformed into a second blocking pattern 615, and third and fourth division patterns 620 and 625 may be formed in the third and fourth openings 493 and 497, respectively.

Referring to FIGS. 32 to 34 together with FIG. 3A, in example embodiments, each of the third and fourth division patterns 620 and 625 may have a bar shape extending in the second direction D2, and fourth recesses 621 may be formed on each of opposite sidewalls in the third direction D3, which may correspond to the first protrusion portions 491 of the mold on each of opposite sidewalls of each of the third and fourth openings 493 and 497.

Figure 35:
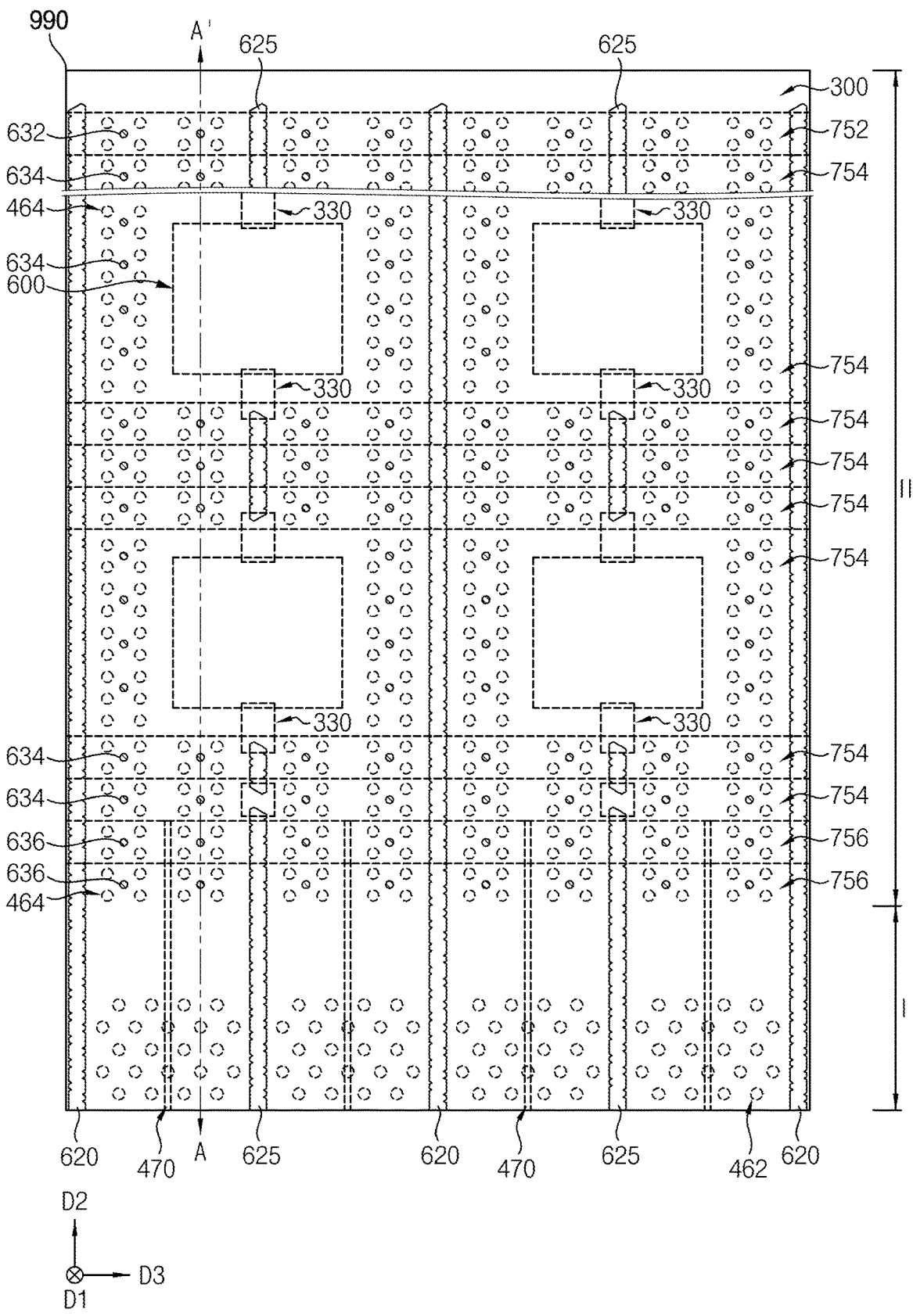
Figure 36:
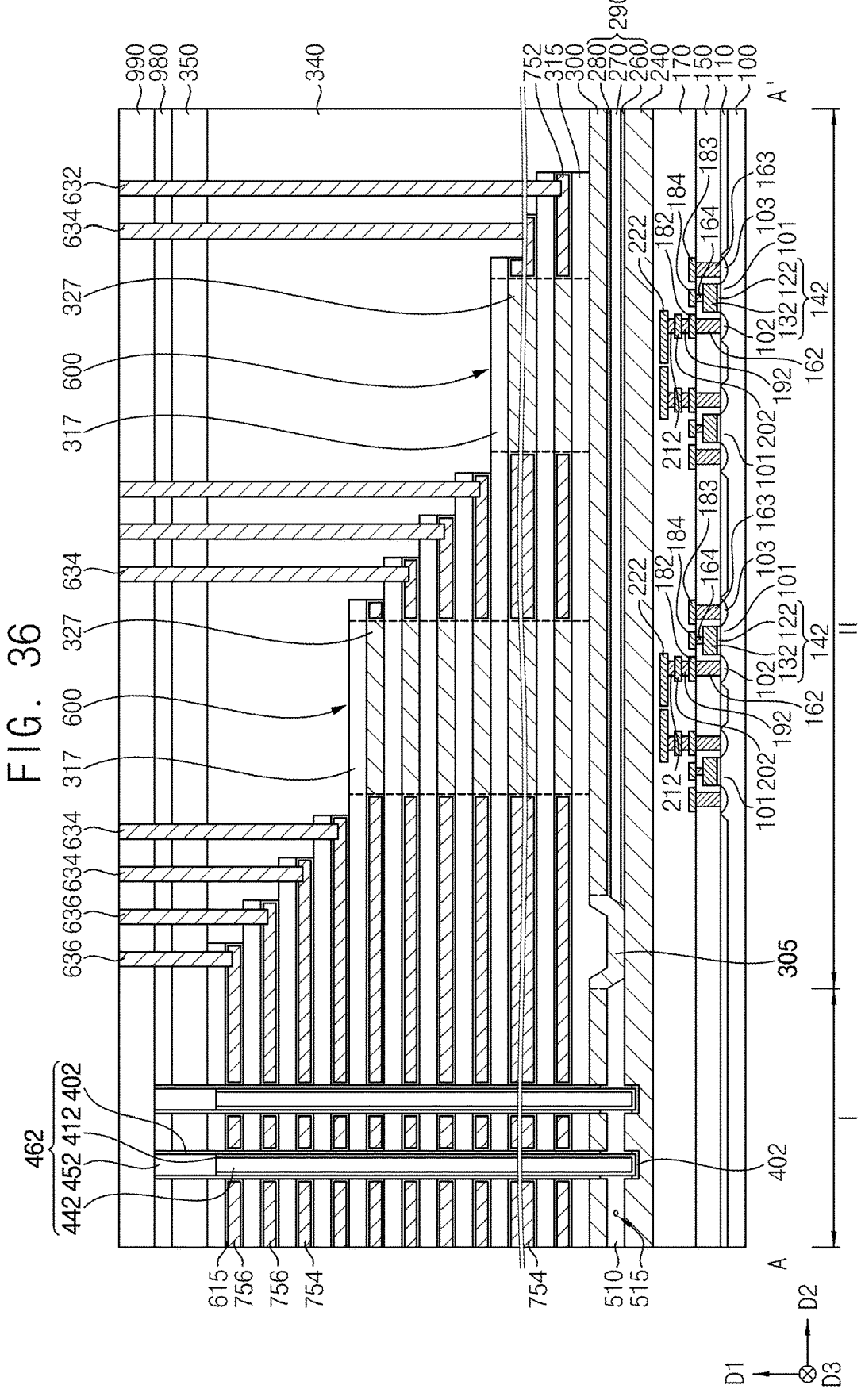

Referring to FIGS. 35 and 36, first to third upper contact plugs 632, 634 and 636 may be formed through the third to sixth insulating interlayers 340, 350, 980 and 990, and the first insulation pattern 315 on the second region II of the substrate 100.

The first to third upper contact plugs 632, 634 and 636 may contact pads of the first to third gate electrodes 752, 754 and 756, respectively.

Figure 37:
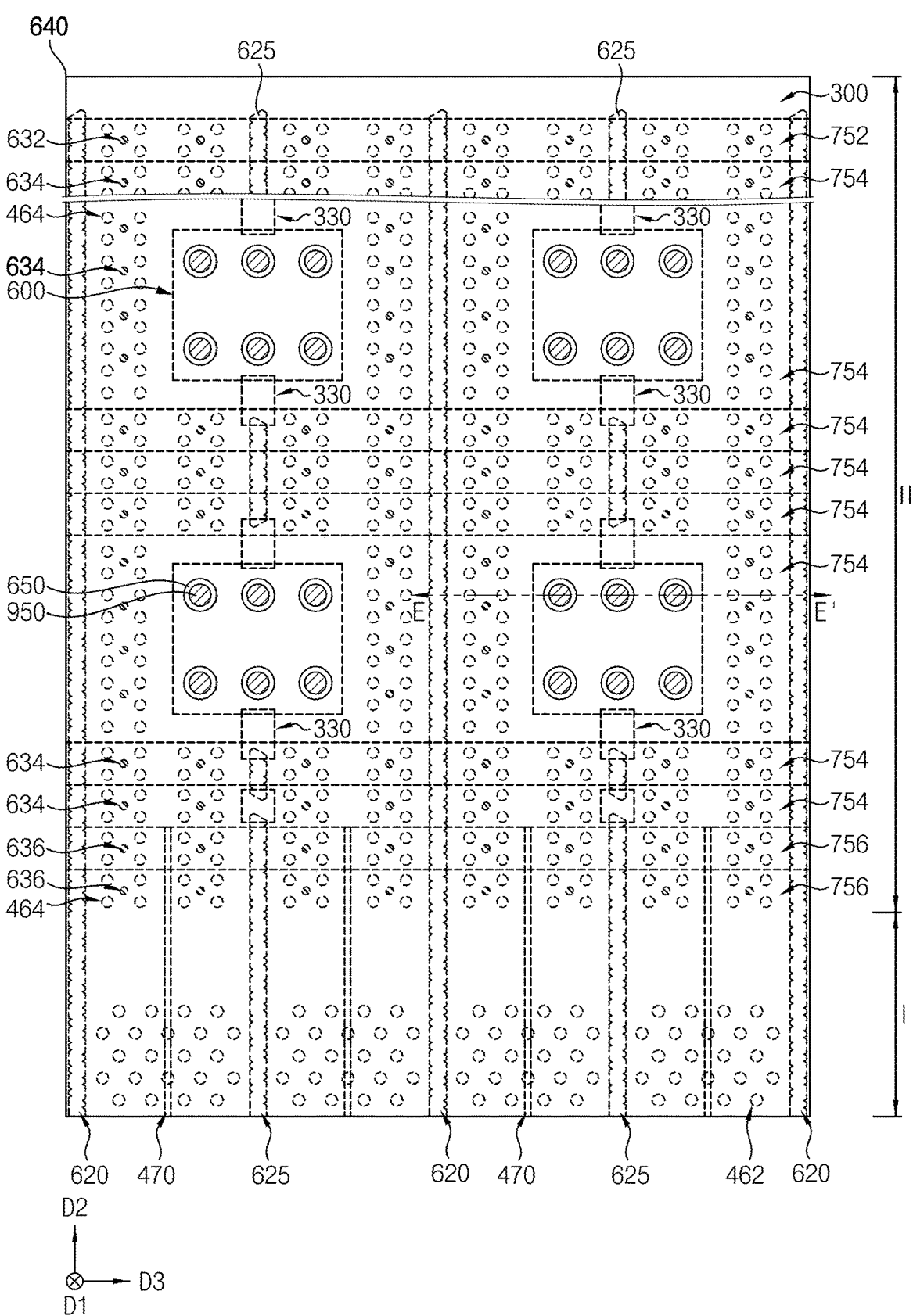
Figure 38:
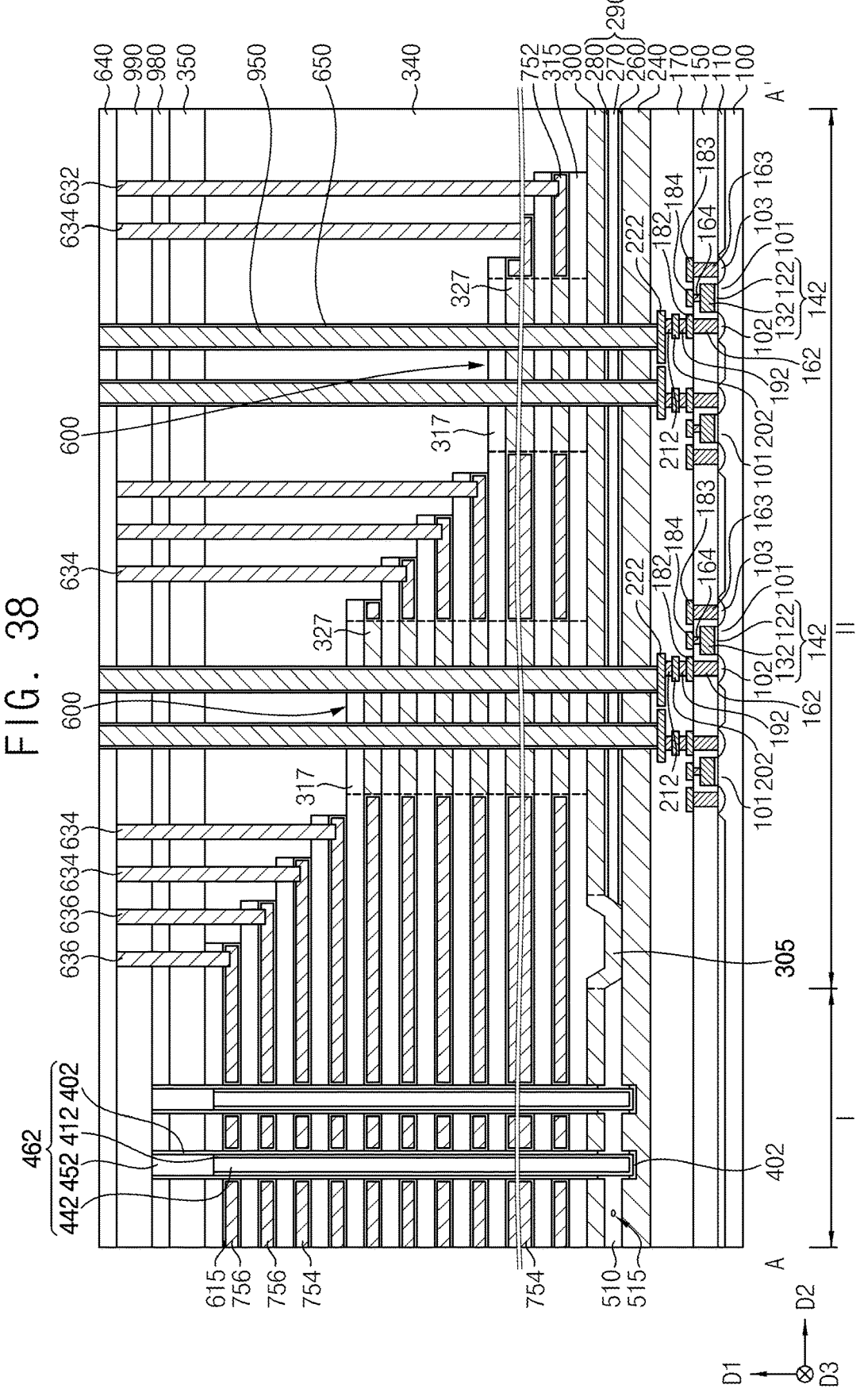

Referring to FIGS. 37 and 38, a seventh insulating interlayer 640 may be formed on the sixth insulating interlayer 990, the third and fourth division patterns 620 and 625, and the first to third upper contact plugs 632, 634 and 636, and a through via 950 may be formed through the third to seventh insulating interlayers 340, 350, 980, 990 and 640, the insulation pattern structure 600, the support layer 300, the sacrificial layer structure 290, the CSP 240 and an upper portion of the second insulating interlayer 170 to contact an upper surface of the eighth lower wiring 222.

A fourth insulation pattern 650 may be formed on a sidewall of the through via 950, and thus the support layer 300 and the CSP 240 may be electrically insulated from each other.

Referring again to FIGS. 1 to 7, an eighth insulating interlayer 670 may be formed on the seventh insulating interlayer 640, the through via 950 and the fourth insulation pattern 650, and fourth to eighth upper contact plugs 682, 684, 686, 688 and 690 may be formed.

The fourth to sixth upper contact plugs 682, 684 and 686 may extend through the seventh and eighth insulating interlayers 640 and 670 to contact upper surfaces of the first to third upper contact plugs 632, 634 and 636, respectively, the seventh upper contact plug 688 may extend through the eighth insulating interlayer 670 to contact an upper surface of the through via 950, and the eighth upper contact plug 690 may extend through the sixth to eighth insulating interlayers 990, 640 and 670 to contact an upper surface of the first capping pattern 452.

A ninth insulating interlayer 700 may be formed on the eighth insulating interlayer 670 and the fourth to eighth upper contact plugs 682, 684, 686, 688 and 690, and first to fifth upper wirings 712, 714, 716, 718 and 720 may be formed through the ninth insulating interlayer 700.

The first to fifth upper wirings 712, 714, 716, 718 and 720 may contact upper surfaces of the fourth to eighth upper contact plugs 682, 684, 686, 688 and 690, respectively.

The semiconductor device according to some embodiments may be manufactured by the above processes.

As illustrated above, when the first and second holes 360 and 365 for forming the memory channel structure 462 and the support structure 464, respectively, are formed, the third and fourth holes 490 and 495 for forming the third and fourth division patterns 620 and 625, respectively, may be formed. The additional etching process may be performed on the third and fourth holes 490 and 495 to enlarge the horizontal widths of the third and fourth holes 490 and 495 so that the neighboring third holes 490 may be connected to form the third opening 493 and the neighboring fourth holes 495 may be connected to form the fourth opening 497.

In example embodiments, each of the third and fourth holes 490 and 495 may have a shape of a triangle or a triangle with chamfered or rounded vertices in a plan view. Thus, the first protrusion portion pairs of the mold on the opposite sidewalls in the third direction D3 of each of the third and fourth openings 493 and 497 may be disposed in a zigzag pattern in the second direction D2, and the second distance S2 between neighboring ones of the first protrusion portions 491 may have a relatively large value.

Accordingly, the neighboring ones of the fourth recesses 621 in the third direction D3 on the opposite sidewalls of each of the third and fourth division patterns 620 and 625 in the corresponding ones of the third and fourth holes 490 and 495 may be spaced apart from each other by the second distance S2, which has the relatively large value, and the electrical interference between the portions of the gate electrodes at the respective opposite sides in the third direction D3 of each of the third and fourth division patterns 620 and 625 may decrease.

If, as in the comparative embodiment shown in FIG. 3B, the fifth holes 624 having a shape of a circle in a plan view are formed in the second direction D2, instead of the third and fourth holes 490 and 495, second protrusion portions of the mold may be formed on opposite sidewalls of the fifth opening that may be formed by enlarging the horizontal widths of the fifth holes 624, and the fifth recesses 628 may be formed to be spaced apart from each other by a given distance on each of the opposite sidewalls in the third direction D3 of the fifth division pattern 622 in the fifth opening.

If the fifth holes 624 are spaced apart from each other by the third distance S3 in the second direction D2, when the horizontal with of each of the fifth holes 624 is enlarged through an etching process by, e.g., half of the third distance S3, the fifth opening, which may be formed by connecting the fifth holes 625 with each other, may have a very small width periodically in the second direction D2, so that the division pattern 622 may not sufficiently separate the gate electrodes from each other. Thus, during the etching process, the horizontal width of each of the fifth holes 624 has to be enlarged by, more than the third distance S3, which may cause a loss of area due to the fifth division pattern 622.

Additionally, the fifth recesses 628 on the opposite sidewalls of the fifth opening overlap each other in the third direction D3, and thus the fourth distance S4 between neighboring ones of the fifth recesses 628 in the third direction D3 may have a relatively small value, so that electrical interference may develop between the portions of the gate electrodes on the opposite sidewalls in the third direction D3 of the fifth division pattern 622.

However, in example embodiments, each of the third and fourth holes 490 and 495 may have the shape of a triangle or a triangle with chamfered or rounded vertices in a plan view, even if the horizontal width of each of the third and fourth holes 490 and 495 is enlarged through the etching process by, e.g., half of the first distance S1 between the third holes 490 or the fourth holes 495 neighboring in the second direction D2, each of the third and fourth holes 493 and 497 that may be formed from the corresponding ones of the third and fourth holes 490 and 495 may have a sufficient large width in the third direction D3. Accordingly, the loss of the area due to the third and fourth division patterns 620 and 625 may be reduced.

Figure 39:
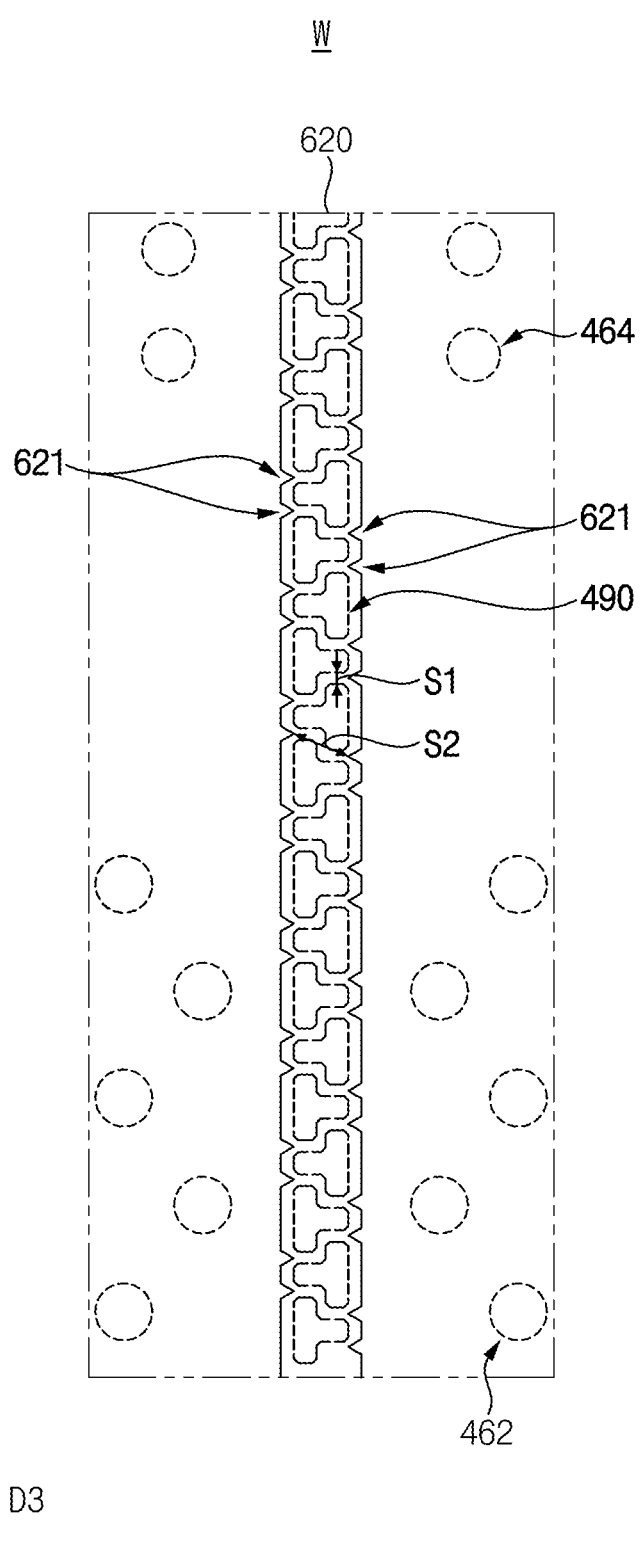
FIGS. 39 and 40 are plan views illustrating the division patterns in accordance with example embodiments.
Figure 40:
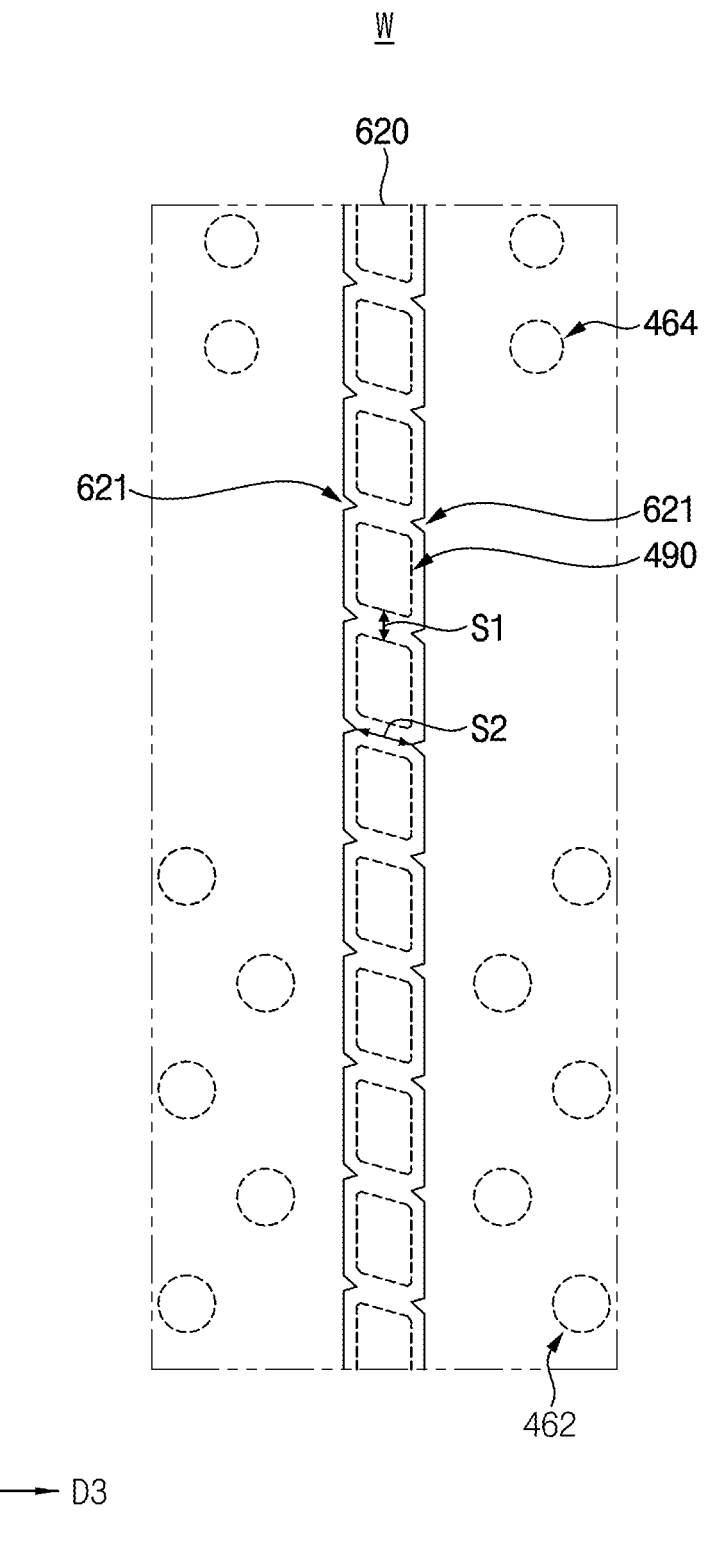

FIGS. 39 and 40 are plan views illustrating the division patterns in accordance with example embodiments, which may correspond to FIG. 3A or FIG. 24. Descriptions of the third division pattern 620 may be applied to the fourth division pattern 625.

Referring to FIG. 39, each of the third holes 490 for forming the third division pattern 620 may have a "T" shape in a plan view.

Ones of the third holes 490 having a T shape toward one direction of the third direction D3 and ones of the third holes 490 having a T shape toward another direction of the third direction D3 may be alternately disposed in the second direction D2.

Thus, the third division pattern 620 in the third opening 493, which may be formed by enlarging the horizontal widths of the third holes 490 disposed in the second direction D2 to connect the enlarged third holes 490 to each other, may include the fourth recesses 621 on each of opposite sidewalls in the third direction D3. A plurality of fourth recess pairs, each of which may include neighboring two ones of the fourth recesses 621 in the second direction D2, may be spaced apart from each other in the second direction D2, and the fourth recess pairs on the opposite sidewalls of the third division pattern 620 may be arranged in a zigzag pattern in the second direction D2 not to overlap each other in the third direction D3.

Referring to FIG. 40, each of the third holes 490 may have a shape of a parallelogram, a rhombus, a parallelogram with chamfered or rounded vertices, or a rhombus with chamfered or rounded vertices in a plan view.

Thus, the third division pattern 620 in the third opening 493, which may be formed by enlarging the horizontal widths of the third holes 490 disposed in the second direction D2 to connect the enlarged third holes 490 to each other, may include the fourth recesses 621 on each of opposite sidewalls in the third direction D3. A plurality of fourth recess pairs, each of which may include neighboring two ones of the fourth recesses 621 in the second direction D2, may be spaced apart from each other in the second direction D2, and the fourth recess pairs on the opposite sidewalls of the third division pattern 620 may be arranged in a zigzag pattern in the second direction D2 not to overlap each other in the third direction D3.

The fourth recesses 621 on each of the opposite sidewalls in the third direction D3 of the third division pattern 620 may be spaced apart from each other in the second direction D2 by a given distance.

Figure 41:
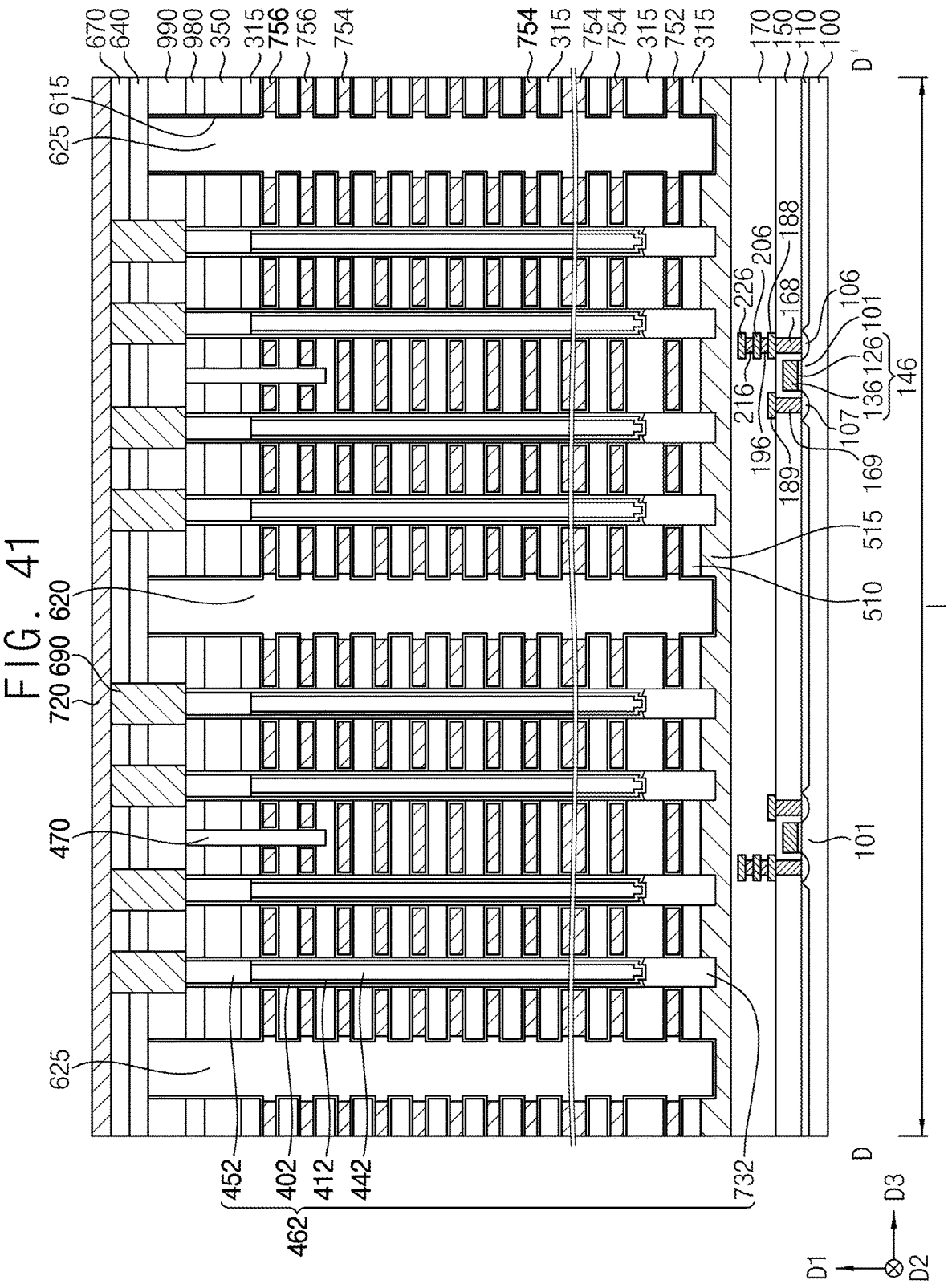
FIG. 41 is a cross-sectional view illustrating a semiconductor device in accordance with example embodiments.

FIG. 41 is a cross-sectional view illustrating a semiconductor device in accordance with example embodiments, which may correspond to FIG. 6. This semiconductor device may be substantially the same as or similar to that of FIGS. 1 to 7, except for the memory channel structure 462, the channel connection pattern 510, the support layer 300 and the support pattern 305.

Referring to FIG. 41, the memory channel structure 462 may further include a first semiconductor pattern 732 on the substrate 100, and the charge storage structure 402, the channel 412, the first filling pattern 442 and the first capping pattern 452 may be formed on the first semiconductor pattern 732.

The first semiconductor pattern 732 may include, e.g., single crystalline silicon or polysilicon. In an example embodiment, an upper surface of the first semiconductor pattern 732 may be formed at a height in the first direction D1 between a height of a lower surface of the first insulation pattern 315 and a height of an upper surface of the first insulation pattern 315. The charge storage structure 402 may have a cup shape of which a lower central portion on the upper surface of the first semiconductor pattern 732 is opened, and may contact an upper edge surface of the first semiconductor pattern 732. The channel 412 may have a cup shape on the first semiconductor pattern 732, and may contact an upper surface of a central portion of the first semiconductor pattern 732. Thus, the channel 412 may be electrically connected to the first semiconductor pattern 732.

The support structure 464 may further include a second semiconductor pattern, and the dummy charge storage structure 404, the second filling pattern 444 and the second capping pattern 454 may be formed on the second semiconductor pattern.

The channel connection pattern 510, the support layer 300 and the support pattern 305 may not be formed between the CSP 240 and the first gate electrode 752. In an example embodiment, one of the first insulation patterns 315 between the first and second gate electrodes 752 and 754 may have a thickness greater than those of other ones of the first insulation patterns 315.

Figure 42:
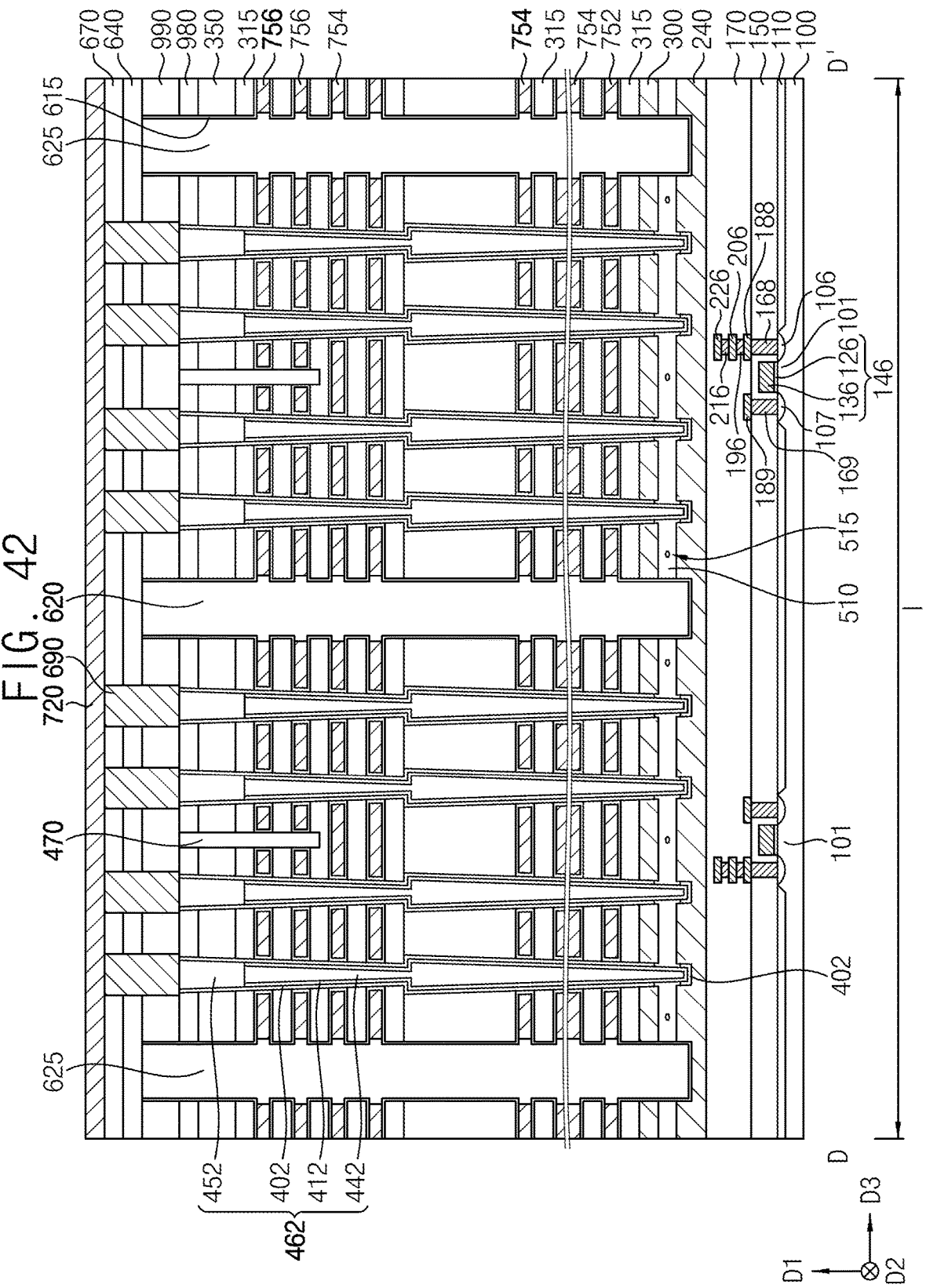
FIG. 42 is a cross-sectional view illustrating a semiconductor device in accordance with example embodiments.

FIG. 42 is a cross-sectional view illustrating a semiconductor device in accordance with example embodiments, which may correspond to FIG. 6. This semiconductor device may be substantially the same as or similar to that of FIGS. 1 to 7, except for the shape of the memory channel structure 462.

Referring to FIG. 42, the memory channel structure 462 may include lower and upper portions sequentially stacked in the first direction D1, and each of the lower and upper portions may have a width in the third direction D3 gradually increasing from a bottom toward a top thereof in the first direction D1. In example embodiments, an upper surface of the lower portion of the memory channel structure 462 may have a width greater than a lower surface of the upper portion of the memory channel structure 462.

FIG. 42 shows that the memory channel structure 462 includes two portions stacked in the first direction D1, however, embodiments of the inventive concept may not be limited thereto, and may include more than two portions stacked in the first direction D1. Each of the portions of the memory channel structure 462 may have a width in the third direction D3 gradually increasing from a bottom toward a top thereof in the first direction D1, and an upper surface of a portion of the memory channel structure 462 may have a width greater than a lower surface of a portion of the memory channel structure 462 thereon.

The support structure 464 may have a shape similar to that of the memory channel structure 462. That is, the support structure 464 may include a plurality of portions sequentially stacked in the first direction D1, and each of the portions may have a width in the third direction D3 gradually increasing from a bottom toward a top thereof.

Figure 43:
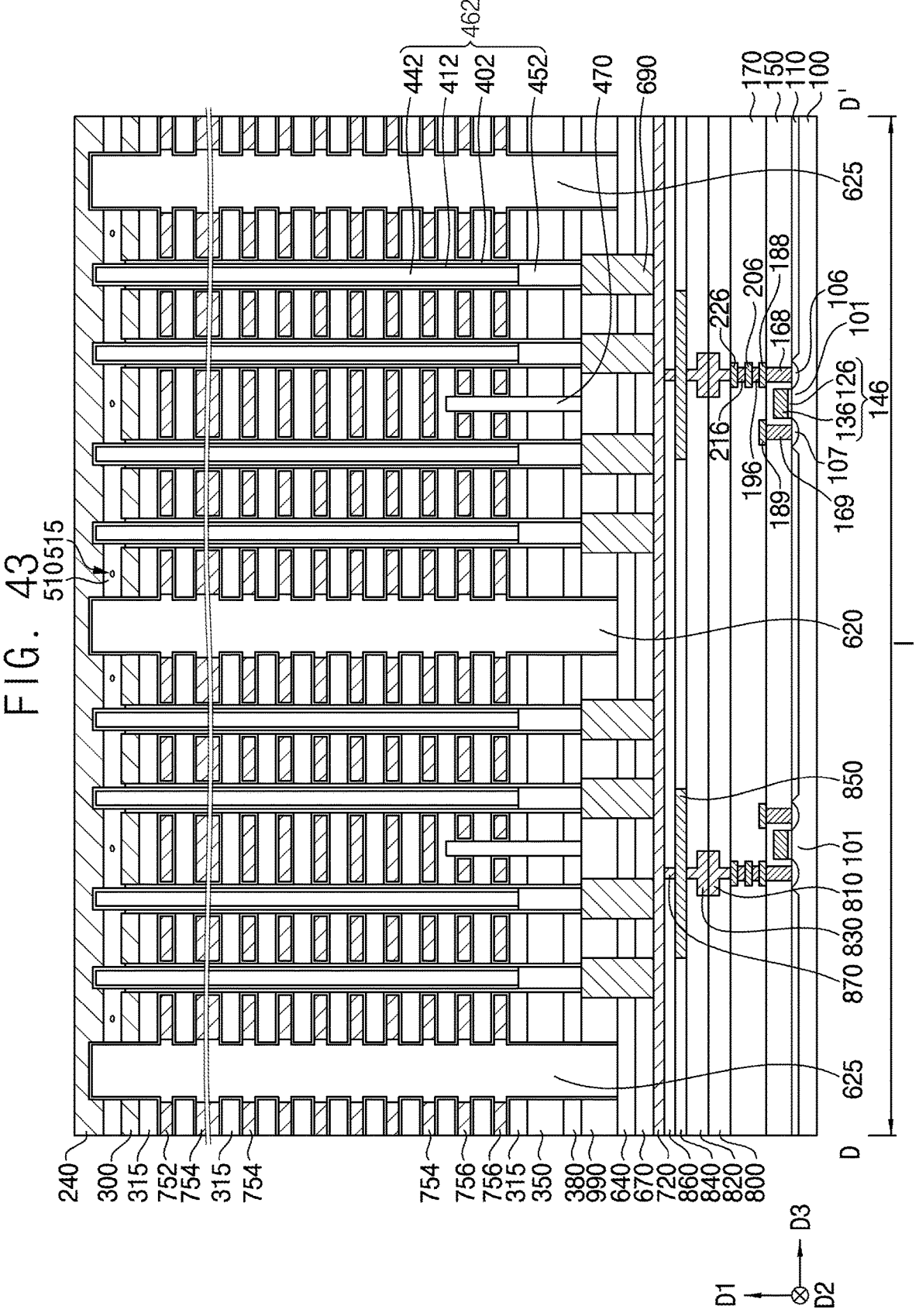
FIG. 43 is a cross-sectional view illustrating a semiconductor device in accordance with example embodiments.

FIG. 43 is a cross-sectional view illustrating a semiconductor device in accordance with example embodiments, which may correspond to FIG. 6. This semiconductor device may be substantially the same as or similar to that of FIGS. 1 to 7, except that the semiconductor device is overturned and bonding structures are further formed.

Referring to FIG. 43, in example embodiments, tenth to thirteenth insulating interlayers 800, 820, 840 and 860 may be sequentially stacked on the eighth and ninth lower wirings 222 and 226 and the second insulating interlayer 170. Additionally, a first bonding pattern extending through the tenth insulating interlayer 800 to contact the eighth lower wiring 222 and a second bonding pattern 810 extending through the tenth insulating interlayer 800 to contact the ninth lower wiring 226 may be formed, and a third bonding pattern extending through the eleventh insulating interlayer 820 to contact the first bonding pattern and a fourth bonding pattern 830 extending through the eleventh insulating interlayer 820 to contact the second bonding pattern 810 may be formed. The first and third bonding patterns and the second and fourth bonding patterns 810 and 830 may include a metal, e.g., copper, aluminum, etc., and may be formed by, e.g., a dual damascene process.

Additionally, a seventh upper wiring extending through the twelfth insulating interlayer 840 to contact the third bonding pattern and an eighth upper wiring 850 extending through the twelfth insulating interlayer 840 to contact the fourth bonding pattern may be formed, and a first upper via extending through the thirteenth upper insulating interlayer 860 to contact the seventh upper wiring and a second upper via 870 extending through the thirteenth insulating interlayer 860 to contact the eighth upper wiring 850 may be formed.

At least some of the first to fifth upper wirings 712, 714, 716, 718 and 720 and the sixth upper wiring may be electrically connected to the lower circuit pattern through the first and third bonding patterns and the second and fourth bonding patterns 810 and 830.

An upper surface and an upper sidewall of the channel 412 may not be covered by the charge storage structure 402, and may contact the CSP 240.

Figure 44:
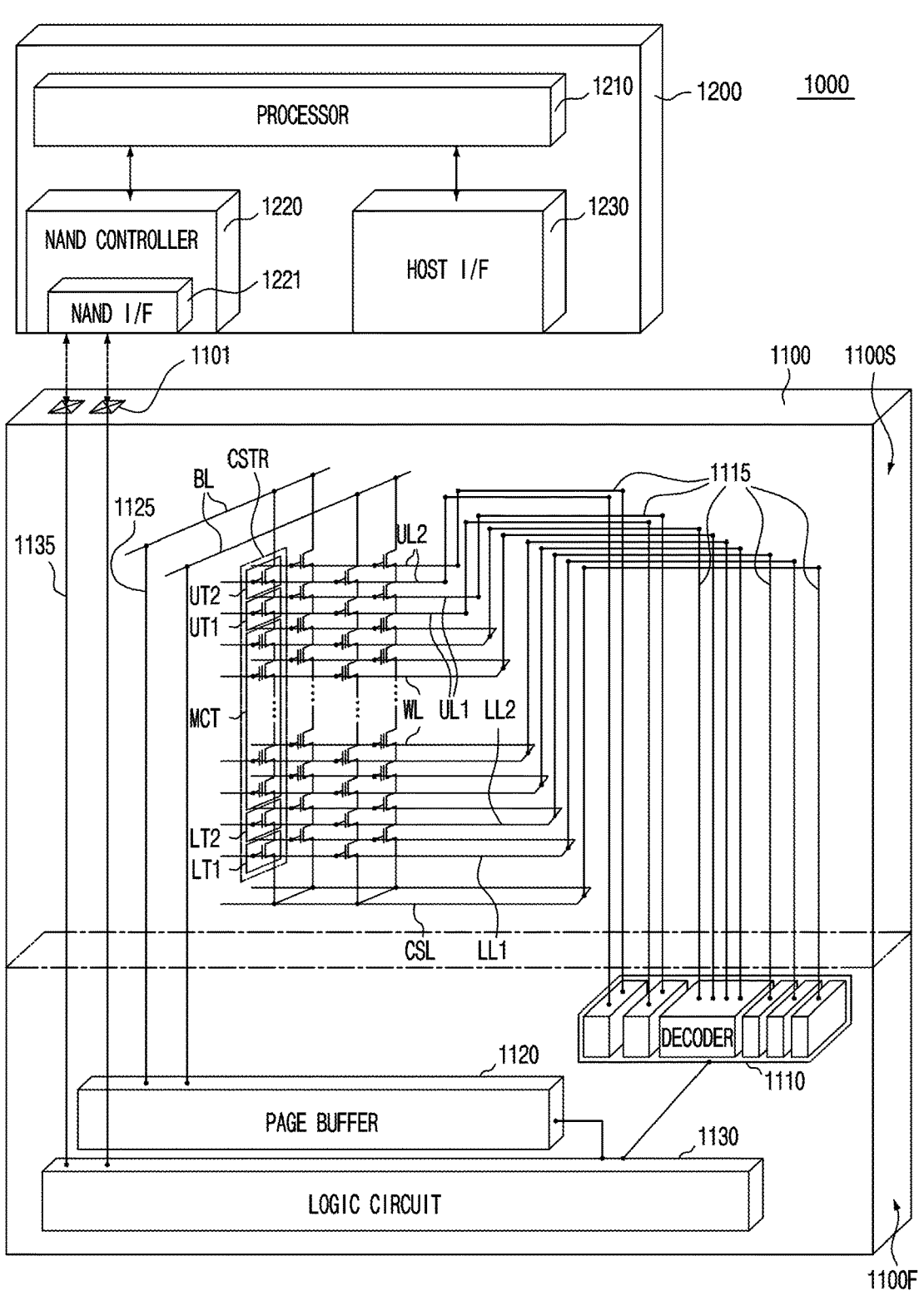
FIG. 44 is a schematic diagram illustrating an electronic system including a semiconductor device in accordance with example embodiments.

FIG. 44 is a schematic diagram illustrating an electronic system including a semiconductor device in accordance with example embodiments.

Referring to FIG. 44, an electronic system 1000 may include a semiconductor device 1100 and a controller 1200 electrically connected to the semiconductor device 1100. The electronic system 1000 may be a storage device including one or a plurality of semiconductor devices 1100 or an electronic device including a storage device. For example, the electronic system 1000 may be a solid state drive (SSD) device, a universal serial bus (USB), a computing system, a medical device, or a communication device that may include one or a plurality of semiconductor devices 1100.

The semiconductor device 1100 may be a non-volatile memory device, for example, a NAND flash memory device illustrated with reference to FIGS. 1 to 7. The semiconductor device 1100 may include a first structure 1100F and a second structure 1100S on the first structure 1100F. FIG. 44 shows that the first structure 1100F is under the second structure 1100S, however, the first structure 1100F may be formed at a side of or on the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending to the second structure 1110S in the first structure 1100F. The bit lines BL may be electrically connected to the page buffer 1120 through second connection wirings 1125 extending to the second structure 1100S in the first structure 1100F.

In the first structure 1100F, the decoder circuit 1110 and the page buffer 1120 may perform a control operation for at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending to the second structure 1100S in the first structure 1100F.

The controller 1200 may include a processor 1210, a NAND controller 1220, and a host interface 1230. The electronic system 1000 may include a plurality of semiconductor devices 1100, and in this case, the controller 1200 may control the plurality of semiconductor devices 1100.

The processor 1210 may control operations of the electronic system 1000 including the controller 1200. The processor 1210 may be operated by firmware, and may control the NAND controller 1220 to access the semiconductor device 1100. The NAND controller 1220 may include a NAND interface 1221 for communicating with the semiconductor device 1100. Through the NAND interface 1221, control command for controlling the semiconductor device 1100, data to be written in the memory cell transistors MCT of the semiconductor device 1100, data to be read from the memory cell transistors MCT of the semiconductor device 1100, etc., may be transferred. The host interface 1230 may provide communication between the electronic system 1000 and an outside host. When a control command is received from the outside host through the host interface 1230, the processor 1210 may control the semiconductor device 1100 in response to the control command.

Figure 45:
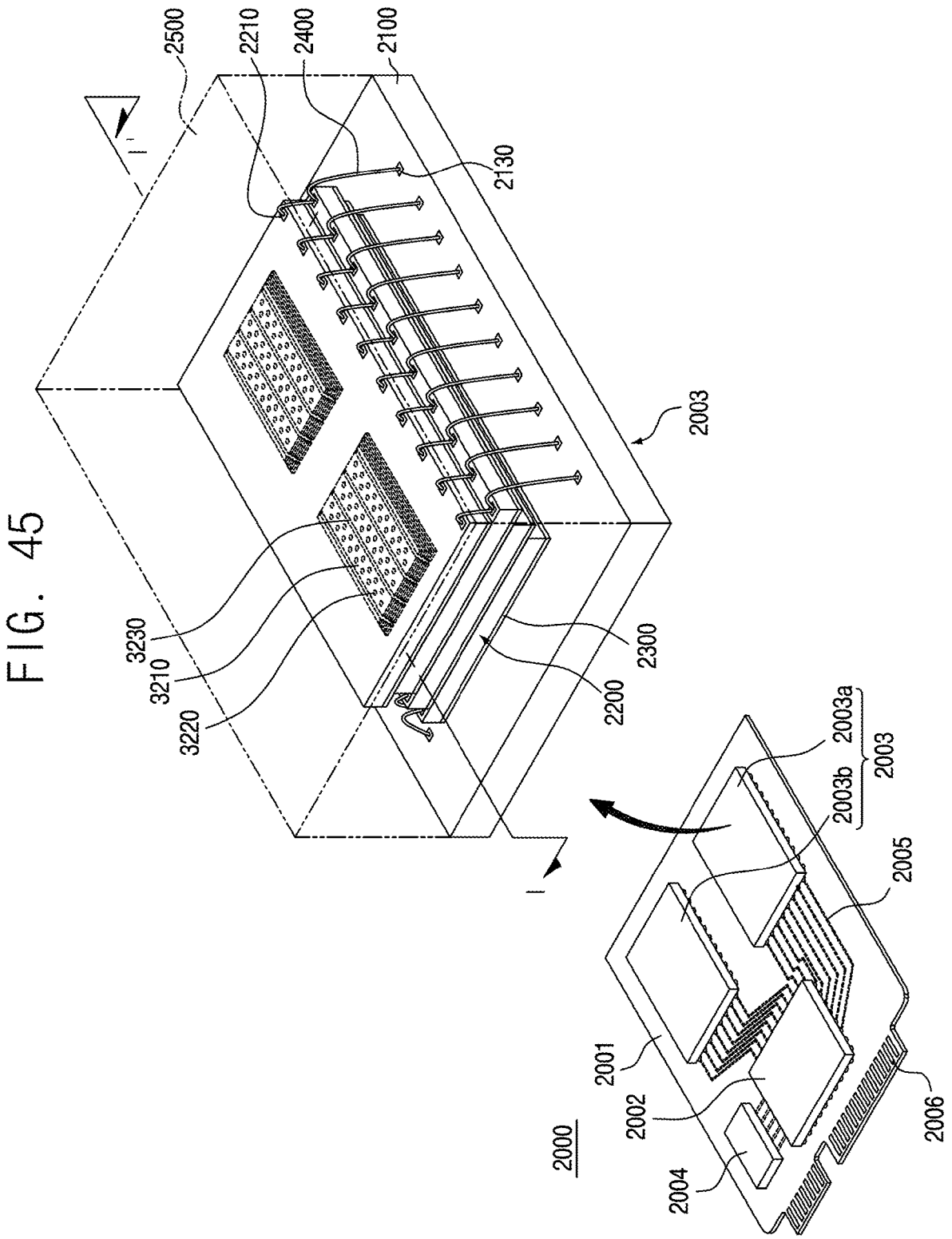
FIG. 45 is a schematic perspective view illustrating an electronic system including a semiconductor device in accordance with example embodiments.

FIG. 45 is a schematic perspective view illustrating an electronic system including a semiconductor device in accordance with example embodiments.

Referring to FIG. 45, an electronic system 2000 may include a main substrate 2001, a controller 2002 mounted on the main substrate 2001, at least one semiconductor package 2003, and a dynamic random access memory (DRAM) device 2004. The semiconductor package 2003 and the DRAM device 2004 may be connected to the controller 2002 by wiring patterns 2005 on the main substrate 2001.

The main substrate 2001 may include a connector 2006 having a plurality of pins connected to an outside host. The number and layout of the plurality pins in the connector 2006 may be changed depending on communication interface between the electronic system 2000 and the outside host. In example embodiments, the electronic system 2000 may communicate with the outside host according to one of a USB, peripheral component interconnect express (PCI-Express), serial advanced technology attachment (SATA), M-Phy for universal flash storage (UFS), etc. In example embodiments, the electronic system 2000 may be operated by power source provided from the outside host through the connector 2006. The electronic system 2000 may further include power management integrated circuit (PMIC) for distributing the power source provided from the outside host to the controller 2002 and the semiconductor package 2003.

The controller 2002 may write data to the semiconductor package 2003 or read data from the semiconductor package 2003, and may enhance the operation speed of the electronic system 2000.

The DRAM device 2004 may be a buffer memory for reducing the speed difference between the semiconductor package 2003 for storing data and the outside host. The DRAM device 2004 included in the electronic system 2000 may serve as a cache memory, and may provide a space for temporarily storing data during the control operation for the semiconductor package 2003. If the electronic system 2000 includes the DRAM device 2004, the controller 2002 may further include a DRAM controller for controlling the DRAM device 2004 in addition to the NAND controller for controlling the semiconductor package 2003.

The semiconductor package 2003 may include first and second semiconductor packages 2003a and 2003b spaced apart from each other. The first and second semiconductor packages 2003a and 2003b may be semiconductor packages each of which may include a plurality of semiconductor chips 2200. Each of the first and second semiconductor packages 2003a and 2003b may include a package substrate 2100, the semiconductor chips 2200, bonding layers 2300 disposed under the semiconductor chips 2200, a connection structure 2400 for electrically connecting the semiconductor chips 2200 and the package substrate 2100, and a mold layer 2500 on and at least partially covering the semiconductor chips 2200 and the connection structure 2400 on the package substrate 2100.

The package substrate 2100 may be a printed circuit board (PCB) including package upper pads 2130. Each semiconductor chip 2200 may include an input/output pad 2210. The input/output pad 2210 may correspond to the input/output pad 1101 of FIG. 44. Each semiconductor chip 2200 may include gate electrode structures 3210, memory channel structures 3220 extending through the gate electrode structures 3210, and division structures 3230 for dividing the gate electrode structures 3210. Each semiconductor chip 2200 may include a semiconductor device illustrated with reference to FIGS. 1 to 7.

In example embodiments, the connection structure 2400 may be a bonding wire for electrically connecting the input/output pad 2210 and the package upper pads 2130. Thus, in each of the first and second semiconductor packages 2003a and 2003b, the semiconductor chips 2200 may be electrically connected with each other by a bonding wire method, and may be electrically connected to the package upper pads 2130 of the package substrate 2100. Alternatively, in each of the first and second semiconductor packages 2003a and 2003b, the semiconductor chips 2200 may be electrically connected with each other by a connection structure including a through silicon via (TSV), instead of the connection structure 2400 of the bonding wire method.

In example embodiments, the controller 2002 and the semiconductor chips 2200 may be included in one package. In example embodiments, the controller 2002 and the semiconductor chips 2200 may be mounted on an interposer substrate different from the main substrate 2001, and the controller 2002 and the semiconductor chips 2200 may be connected with each other by a wiring on the interposer substrate.

Figure 46:
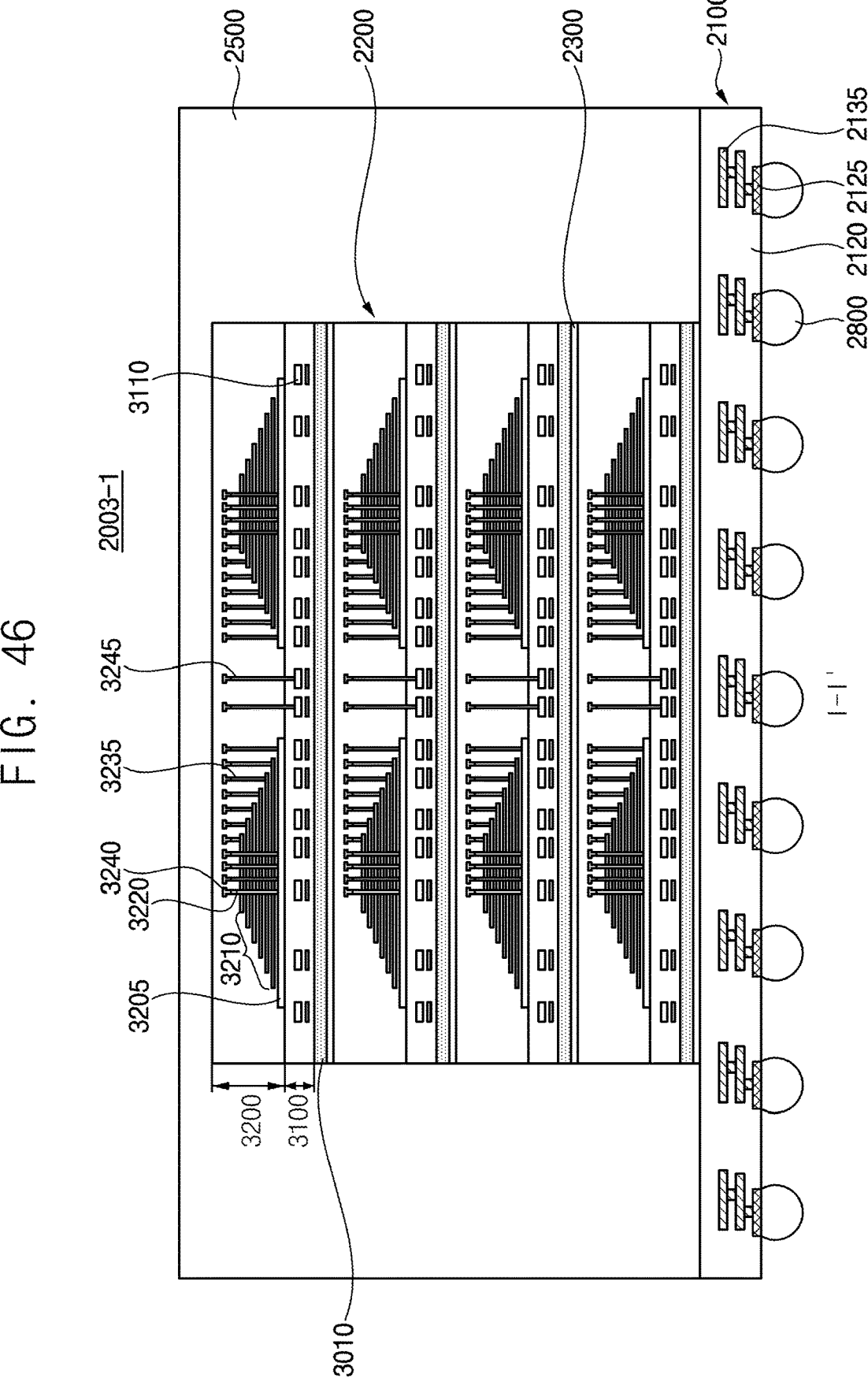
FIGS. 46 and 47 are schematic cross-sectional views illustrating a semiconductor package that may include a semiconductor device in accordance with example embodiments.
Figure 47:

FIGS. 46 and 47 are schematic cross-sectional views illustrating a semiconductor package that may include a semiconductor device in accordance with example embodiments. FIGS. 46 and 47 illustrate example embodiments of the semiconductor package 2003 shown in FIG. 45, and show a cross-section taken along a line I-I' of the semiconductor package 2003 in FIG. 45.

Referring to FIG. 46, in the semiconductor package 2003, the package substrate 2100 may be a PCB. The package substrate 2100 may include a substrate body part 2120, upper pads 2130 (refer to FIG. 45) on an upper surface of the substrate body part 2120, lower pads 2125 on a lower surface of the substrate body part 2120 or exposed through the lower surface of the substrate body part 2120, and inner wirings 2135 for electrically connecting the upper pads 2130 and the lower pads 2125 in an inside of the substrate body part 2120. The upper pads 2130 may be electrically connected to the connection structures 2400. The lower pads 2125 may be connected to wiring patterns 2005 of the main substrate 2010 in the electronic system 2000 through conductive connection parts 2800, as shown in FIG. 45.

Each semiconductor chip 2200 may include a semiconductor substrate 3010, and a first structure 3100 and a second structure 3200 sequentially stacked on the semiconductor substrate 3010. The first structure 3100 may include a peripheral circuit region in which peripheral circuit wirings 3110 may be formed. The second structure 3200 may include a common source line 3205, a gate electrode structure 3210 on the common source line 3205, memory channel structures 3220 and division structures 3230 (refer to FIG. 45) extending through the gate electrode structure 3210, bit lines 3240 electrically connected to the memory channel structures 3220, and gate connection wirings 3235 electrically connected to the word lines WL of the gate electrode structure 3210 (refer to FIG. 44).

Each semiconductor chip 2200 may include a through wiring 3245 being electrically connected to the peripheral circuit wirings 3110 of the first structure 3100 and extending in the second structure 3200. The through wiring 3245 may be disposed at an outside of the gate electrode structure 3210, and the through wirings 3245 may extend through the gate electrode structure 3210. Each semiconductor chip 2200 may further include the input/output pad 2210 (refer to FIG. 45) electrically connected to the peripheral circuit wirings 3110 of the first structure 3100.

Referring to FIG. 47, in a semiconductor package 2003A, each semiconductor chip 2200a may include a semiconductor substrate 4010, a first structure 4100 on the semiconductor substrate 4010, and a second structure 4200 on and bonded with the first structure 4100 by a wafer bonding method.

The first structure 4100 may include a peripheral circuit region in which a peripheral circuit wiring 4110 and first bonding structures 4150 may be formed. The second structure 4200 may include a common source line 4205, a gate electrode structure 4210 between the common source line 4205 and the first structure 4100, memory channel structures 4220 and the division structure 3230 (refer to FIG. 45) extending through the gate electrode structure 4210, and second bonding structures 4250 electrically connected to the memory channel structures 4220 and the word lines WL (refer to FIG. 44) of the gate electrode structure 4210. For example, the second bonding structures 4250 may be electrically connected to the memory channel structures 4220 and the word lines WL (refer to FIG. 44) through the bit lines 4240 electrically connected to the memory channel structures 4220 and the gate connection wirings 4235 electrically connected to the word lines WL (refer to FIG. 44), respectively. The first bonding structures 4150 of the first structure 4100 and the second bonding structures 4250 of the second structure 4200 may contact each other to be bonded with each other. The first bonding structures 4150 and the second bonding structures 4250 may include, for example, copper.

Each semiconductor chip 2200a may further include the input/output pad 2210 (refer to FIG. 45) electrically connected to the peripheral circuit wirings 4110 of the first structure 4100.

The semiconductor chips 2200 of FIG. 46 and the semiconductor chips 2200a of FIG. 47 may be electrically connected with each other by the connection structures 2400 in a bonding wire method. However, in example embodiments, semiconductor chips such as the semiconductor chips 2200 of FIG. 46 and the semiconductor chips 2200a of FIG.

47 in the same semiconductor package may be electrically connected with each other by a connection structure including a TSV.

While example embodiments have been particularly shown and described, it will be understood by one of ordinary skill in the art that variations in form and detail may be made therein without departing from the spirit and scope of the claims.

What is claimed is:

1. A semiconductor device comprising:
a gate electrode structure including gate electrodes spaced apart from each other on a substrate in a first direction substantially perpendicular to an upper surface of the substrate, each of the gate electrodes extending in a second direction substantially parallel to the upper surface of the substrate;
a first division pattern extending on the substrate in the second direction through the gate electrode structure, the first division pattern dividing the gate electrode structure in a third direction substantially parallel to the upper surface of the substrate and crossing the second direction; and
a memory channel structure extending through the gate electrode structure on the substrate, the memory channel structure including:
a channel extending in the first direction; and
a charge storage structure on an outer sidewall of the channel,
wherein:
the first division pattern includes first and second sidewalls opposite to each other in the third direction,
first recesses are spaced apart from each other in the second direction on the first sidewall of the first division pattern, and second recesses are spaced apart from each other in the second direction on the second sidewall of the first division pattern, and
the first recesses do not overlap the second recesses in the third direction.

2. The semiconductor device of claim 1, wherein neighboring ones of the first recesses in the second direction form a first recess pair, and the first recess pair is one of a plurality of first recess pairs spaced apart from each other in the second direction, and
wherein neighboring ones of the second recesses in the second direction form a second recess pair, and the second recess pair is one of a plurality of second recess pairs spaced apart from each other in the second direction.

3. The semiconductor device of claim 2, wherein a distance in the second direction between the neighboring ones of the first recesses included in each of the plurality of first recess pairs is greater than a distance in the second direction between neighboring ones of the plurality of first recess pairs, and
wherein a distance in the second direction between the neighboring ones of the second recesses included in each of the plurality of second recess pairs is greater than a distance in the second direction between neighboring ones of the plurality of second recess pairs.

4. The semiconductor device of claim 2, wherein the plurality of first recess pairs and the plurality of second recess pairs are on the first and second sidewalls of the first division pattern in a zigzag pattern in the second direction.

5. The semiconductor device of claim 1, wherein distances in the second direction between the first recesses periodically change, and wherein distances in the second direction between the second recesses periodically change.

6. The semiconductor device of claim 1, wherein the first recesses and the second recesses are on the first and second sidewalls of the first division pattern in a zigzag pattern in the second direction.

7. The semiconductor device of claim 1, wherein distances in the second direction between the first recesses are substantially constant in the second direction, and
wherein distances in the second direction between the second recesses are substantially constant in the second direction.

8. The semiconductor device of claim 1, wherein the first division pattern is one of a plurality of first division patterns spaced apart from each other in the third direction.

9. A semiconductor device comprising:
a gate electrode structure including gate electrodes spaced apart from each other on a substrate in a first direction substantially perpendicular to an upper surface of the substrate, each of the gate electrodes extending in a second direction substantially parallel to the upper surface of the substrate;
a first division pattern extending on the substrate in the second direction through the gate electrode structure, the first division pattern dividing the gate electrode structure in a third direction substantially parallel to the upper surface of the substrate and crossing the second direction; and
a memory channel structure extending through the gate electrode structure on the substrate, the memory channel structure including:
a channel extending in the first direction; and
a charge storage structure on an outer sidewall of the channel,
wherein:
the first division pattern includes first and second sidewalls opposite to each other in the third direction,
first recesses are spaced apart from each other in the second direction on the first sidewall of the first division pattern, and second recesses are spaced apart from each other in the second direction on the second sidewall of the first division pattern,
distances in the second direction between the first recesses periodically change, and
distances in the second direction between the second recesses periodically change.

10. The semiconductor device of claim 9, wherein distances in the second direction between the first recesses include a first distance and a second distance greater than the first distance, and
wherein the first recesses are spaced apart from each other in the second direction alternately by the first distance and the second distance.

11. The semiconductor device of claim 10, wherein distances in the second direction between the second recesses include a third distance and a fourth distance greater than the third distance, and
wherein the second recesses are spaced apart from each other in the second direction alternately by the third distance and the fourth distance.

12. The semiconductor device of claim 11, wherein the first and third distances are substantially equal to each other, and the second and fourth distances are substantially equal to each other.

13. The semiconductor device of claim 9, wherein neighboring ones of the first recesses in the second direction form a first recess pair, and the first recess pair is one of a plurality of first recess pairs spaced apart from each other in the second direction, and wherein neighboring ones of the second recesses in the second direction form a second recess pair, and the second recess pair is one of a plurality of second recess pairs spaced apart from each other in the second direction.

14. The semiconductor device of claim 13, wherein a distance in the second direction between the neighboring ones of the first recesses included in each of the plurality of first recess pairs is greater than a distance in the second direction between neighboring ones of the plurality of first recess pairs, and wherein a distance in the second direction between the neighboring ones of the second recesses included in each of the plurality of second recess pairs is greater than a distance in the second direction between neighboring ones of the plurality of second recess pairs.

15. A semiconductor device comprising:

a lower circuit pattern on a substrate;

a common source plate (CSP) on the lower circuit pattern;

a gate electrode structure including gate electrodes spaced apart from each other on the CSP in a first direction substantially perpendicular to an upper surface of the substrate, each of the gate electrodes extending in a second direction substantially parallel to the upper surface of the substrate;

first division patterns each extending on the CSP in the second direction through the gate electrode structure, each of the first division patterns dividing the gate electrode structure in a third direction substantially parallel to the upper surface of the substrate and crossing the second direction; and a memory channel structure extending through the gate electrode structure on the substrate, the memory channel structure including:

a channel extending in the first direction; and a charge storage structure on an outer sidewall of the channel, wherein:

the first division pattern includes first and second sidewalls opposite to each other in the third direction, first recesses are spaced apart from each other in the second direction on the first sidewall of the first division pattern, and second recesses are spaced apart from each other in the second direction on the second sidewall of the first division pattern, and the first recesses do not overlap the second recesses in the third direction.

16. The semiconductor device of claim 15, further comprising a dummy memory channel structure extending through the gate electrode structure on the CSP, the dummy memory channel structure including:

a dummy channel extending in the first direction; and a dummy charge storage structure on an outer sidewall of the dummy channel.

17. The semiconductor device of claim 15, further comprising a support layer and a channel connection pattern between the CSP and the gate electrode structure, wherein each of the first and second division patterns and the memory channel structure extends through the support layer and the channel connection pattern, and contacts an upper surface of the CSP.

18. The semiconductor device of claim 15, wherein neighboring ones of the first recesses in the second direction form a first recess pair, and the first recess pair is one of a plurality of first recess pairs spaced apart from each other in the second direction, and wherein neighboring ones of the second recesses in the second direction form a second recess pair, and the second recess pair is one of a plurality of second recess pairs spaced apart from each other in the second direction.

19. The semiconductor device of claim 18, wherein a distance in the second direction between the neighboring ones of the first recesses included in each of the plurality of first recess pairs is greater than a distance in the second direction between neighboring ones of the plurality of first recess pairs, and wherein a distance in the second direction between the neighboring ones of the second recesses included in each of the plurality of second recess pairs is greater than a distance in the second direction between neighboring ones of the plurality of second recess pairs.

20. The semiconductor device of claim 18, wherein the plurality of first recess pairs and the plurality of second recess pairs are on the first and second sidewalls of the first division pattern in a zigzag pattern in the second direction.

* * * * *